(12) United States Patent
Hikosaka et al.

(10) Patent No.: US 9,679,974 B2
(45) Date of Patent: Jun. 13, 2017

(54) NITRIDE SEMICONDUCTOR ELEMENT, NITRIDE SEMICONDUCTOR WAFER, AND METHOD FOR FORMING NITRIDE SEMICONDUCTOR LAYER

(71) Applicant: Kabushiki Kaisha Toshiba, Minato-ku (JP)

(72) Inventors: Toshiki Hikosaka, Kawasaki (JP); Hisashi Yoshida, Koto-ku (JP); Hajime Nago, Yokohama (JP); Naoharu Sugiyama, Komatsu (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/313,014

(22) Filed: Jun. 24, 2014

(65) Prior Publication Data

US 2015/0001547 A1    Jan. 1, 2015

(30) Foreign Application Priority Data

Jun. 27, 2013   (JP) ................................ 2013-135277
Feb. 26, 2014   (JP) ................................ 2014-035256

(51) Int. Cl.
*H01L 29/20*      (2006.01)
*H01L 21/02*      (2006.01)
(Continued)

(52) U.S. Cl.
CPC ...... *H01L 29/2003* (2013.01); *H01L 21/0254* (2013.01); *H01L 21/0262* (2013.01);
(Continued)

(58) Field of Classification Search
CPC ......... H01L 21/02494; H01L 21/02576; H01L 21/0262; H01L 21/02505; H01L 21/02458;
(Continued)

(56) References Cited

U.S. PATENT DOCUMENTS

2002/0167028 A1    11/2002   Kunisato et al.
2009/0315067 A1*   12/2009   Huang .............. H01L 21/02458
                                                                257/101
(Continued)

FOREIGN PATENT DOCUMENTS

CN      102637794         8/2012
JP      2001-185498 A    7/2001
(Continued)

OTHER PUBLICATIONS

European Office Action issued Jan. 27, 2016 in Patent Application 14 174 748.5.
(Continued)

*Primary Examiner* — Zandra Smith
*Assistant Examiner* — Lauren R Bell
(74) *Attorney, Agent, or Firm* — Oblon, McClelland, Maier & Neustadt, L.L.P.

(57) ABSTRACT

According to one embodiment, a nitride semiconductor element includes: a stacked body; and a functional layer. The stacked body includes a first GaN layer, a first layer, and a second GaN layer. The first GaN layer includes a first protrusion. The first layer is provided on the first GaN layer and contains at least one of Si and Mg. The second GaN layer is provided on the first layer and includes a second protrusion. Length of bottom of the second protrusion is shorter than length of bottom of the first protrusion. A functional layer is provided on the stacked body and includes a nitride semiconductor.

29 Claims, 23 Drawing Sheets

(51) Int. Cl.
*H01L 29/778* (2006.01)
*H01L 29/10* (2006.01)

(52) U.S. Cl.
CPC .. *H01L 21/02458* (2013.01); *H01L 21/02488* (2013.01); *H01L 21/02494* (2013.01); *H01L 21/02505* (2013.01); *H01L 21/02576* (2013.01); *H01L 29/1075* (2013.01); *H01L 29/7786* (2013.01)

(58) Field of Classification Search
CPC ... H01L 21/0254; H01L 33/075; H01L 33/12; H01L 29/2003; H01L 29/7786; H01L 29/1075; H01L 21/76248; H01L 21/76272; H01L 21/02488
See application file for complete search history.

(56) References Cited

U.S. PATENT DOCUMENTS

| | | | |
|---|---|---|---|
| 2010/0320506 A1* | 12/2010 | Varangis | C30B 23/02 257/201 |
| 2012/0080715 A1 | 4/2012 | Huang et al. | |
| 2012/0205783 A1* | 8/2012 | Lee | H01L 21/02378 257/618 |
| 2012/0241753 A1* | 9/2012 | Akiyama | H01L 21/0242 257/76 |
| 2012/0292593 A1 | 11/2012 | Shioda et al. | |
| 2014/0077239 A1 | 3/2014 | Hung et al. | |
| 2014/0084338 A1 | 3/2014 | Harada et al. | |
| 2014/0138699 A1 | 5/2014 | Hikosaka et al. | |

FOREIGN PATENT DOCUMENTS

| | | |
|---|---|---|
| JP | 2002-335051 | 11/2002 |
| JP | 2010-10675 | 1/2010 |
| JP | 2011-216580 | 10/2011 |
| JP | 2011-233936 A | 11/2011 |
| JP | 2012-94905 A | 5/2012 |
| JP | 2014-103307 A | 6/2014 |

OTHER PUBLICATIONS

The Extended European Search Report issued Dec. 11, 2014, in Application No. / Patent No. 14174748.5-1552.
Satoshi Kamiyama, et al., "Low-temperature-deposited AlGaN interlayer for improvement of AlGaN/GaN heterostructure", Journal of Crystal Growth, vol. 223, No. 1-2, XP055156545, Feb. 2001, pp. 83-91.
Office Action issued Sep. 18, 2015 in Korean Patent Application No. 10-2014-0077036 (with English translation).
Chinese Office Action with English translation issued on Jun. 14, 2016 in counterpart Chinese patent application No. 201410301753.6, citing document AO therein (13 pages).

* cited by examiner

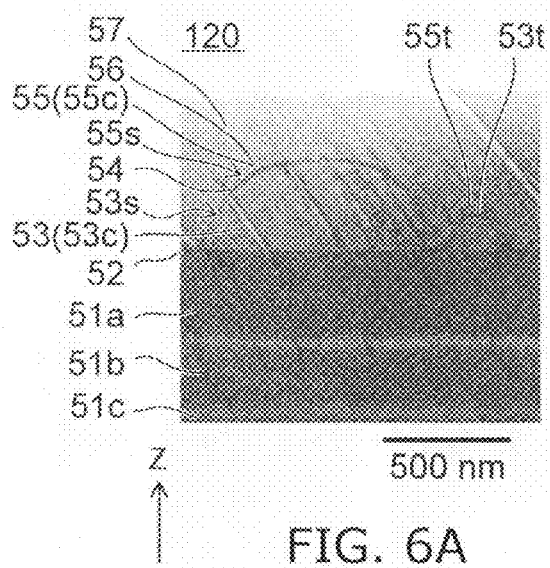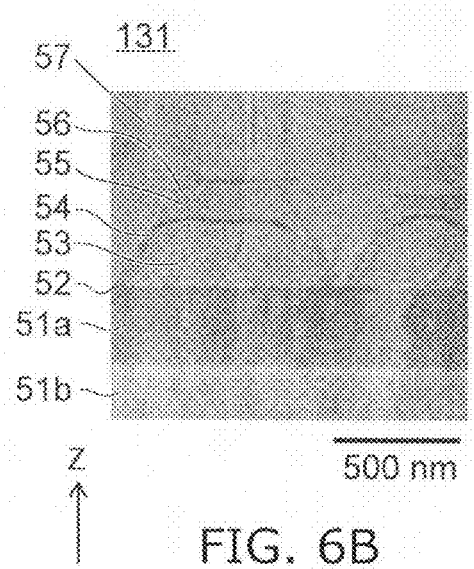
FIG. 6A    FIG. 6B
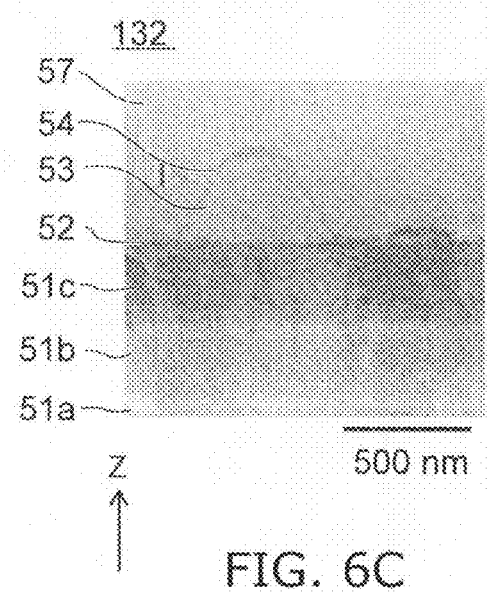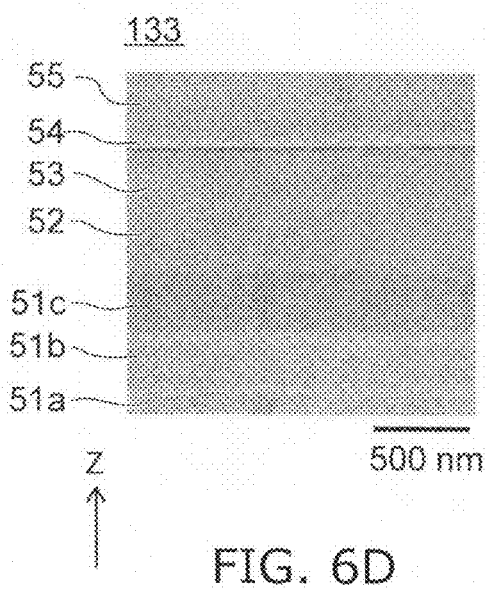
FIG. 6C    FIG. 6D

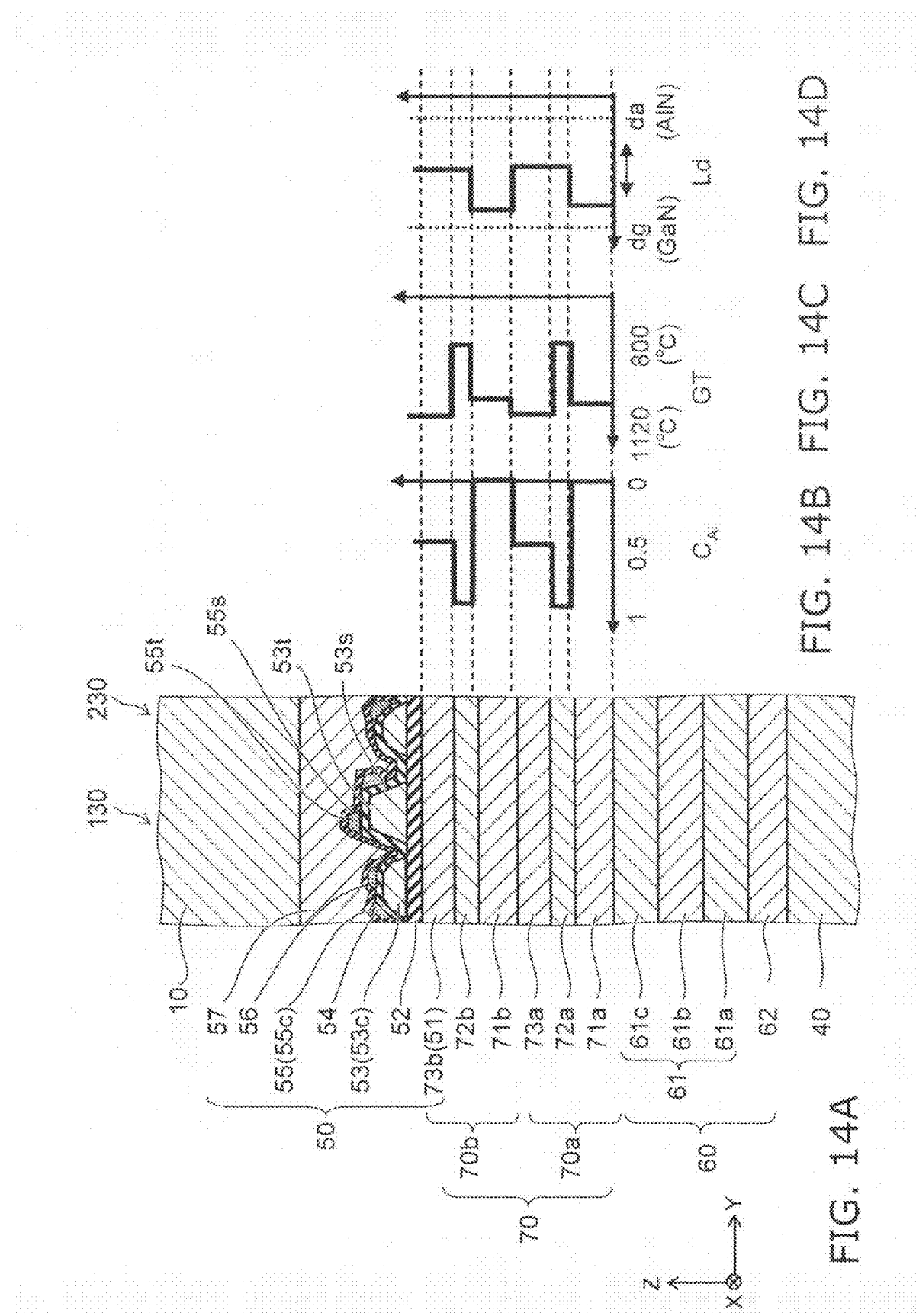

NITRIDE SEMICONDUCTOR ELEMENT, NITRIDE SEMICONDUCTOR WAFER, AND METHOD FOR FORMING NITRIDE SEMICONDUCTOR LAYER

CROSS-REFERENCE TO RELATED APPLICATIONS

This application is based upon and claims the benefit of priorities from Japanese Patent Application No. 2013-135277, filed on Jun. 27, 2013 and Japanese Patent Application No. 2014-035256, filed on Feb. 26, 2014; the entire contents of which are incorporated herein by reference.

FIELD

Embodiments described herein relate generally to a nitride semiconductor element, a nitride semiconductor wafer, and a method for forming nitride semiconductor layer.

BACKGROUND

As a nitride semiconductor element based on nitride semiconductor, for instance, a light emitting diode (LED) is used in display devices, illumination and the like. Nitride semiconductor elements also include electronic devices such as high speed electronic devices and power devices.

Such a nitride semiconductor element is formed primarily on a heterogeneous substrate of sapphire, silicon (Si) or the like. However, defects and substrate warpage (cracks) are likely to occur due to the difference in lattice constant and the difference in thermal expansion coefficient. For higher device performance, it is important to reduce defects in the nitride semiconductor. There is demand for a technique for fabricating a nitride semiconductor crystal with few dislocations.

BRIEF DESCRIPTION OF THE DRAWINGS

FIGS. 6A to 6D are cross-sectional SEM images showing examples of the buffer layer and the stacked body;

FIGS. 14A to 14D illustrate a nitride semiconductor element and a nitride semiconductor wafer according to the second embodiment;

DETAILED DESCRIPTION

Figure 1A:
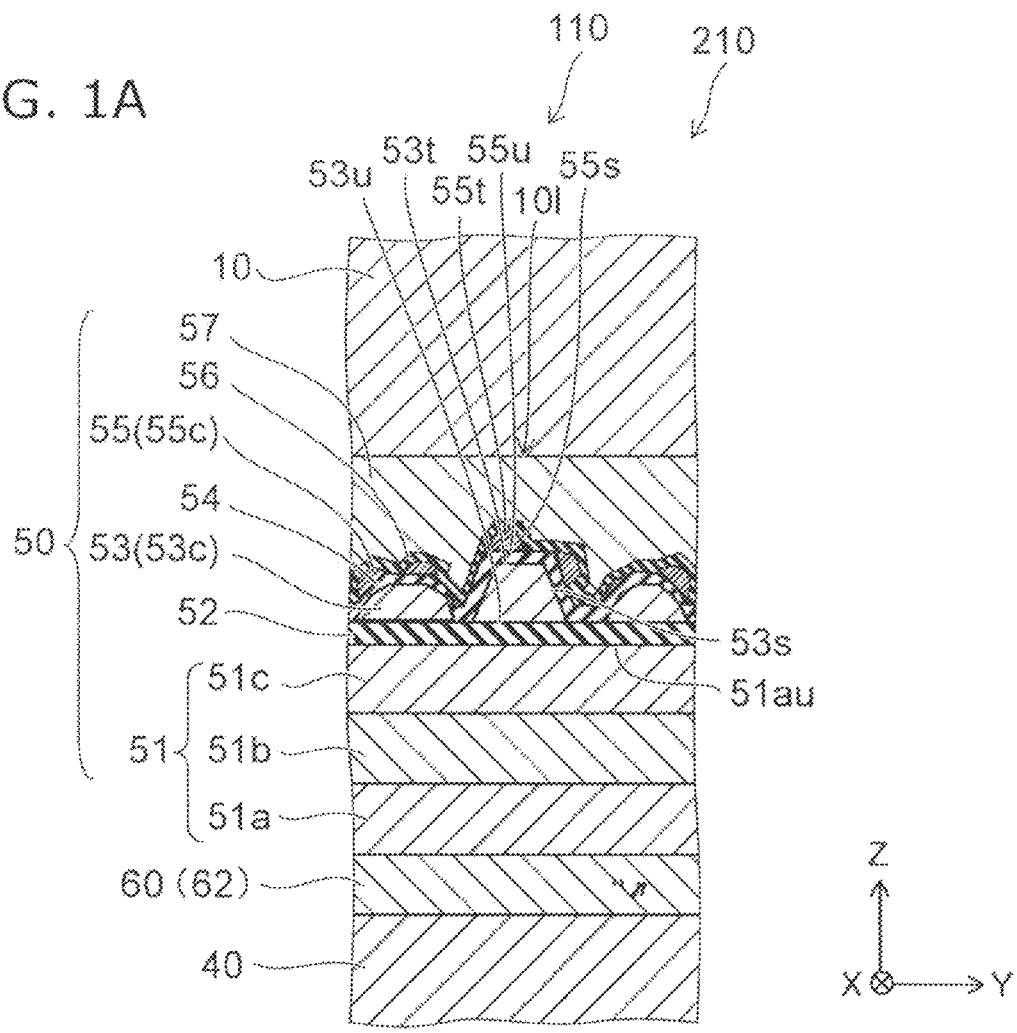
FIGS. 1A and 1B are schematic sectional views illustrating a nitride semiconductor element according to the first embodiment.

In general, according to one embodiment, a nitride semiconductor element includes: a stacked body; and a functional layer. The stacked body includes a first GaN layer, a first layer, and a second GaN layer. The first GaN layer includes a first protrusion. The first layer is provided on the first GaN layer and contains at least one of Si and Mg. The second GaN layer is provided on the first layer and includes a second protrusion. Length of bottom of the second protrusion is shorter than length of bottom of the first protrusion. A functional layer is provided on the stacked body and includes a nitride semiconductor.

Hereinbelow, embodiments of the invention are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

This embodiment relates to a nitride semiconductor element and a nitride semiconductor wafer. The nitride semiconductor element according to the embodiment includes a semiconductor device such as a semiconductor light emitting element, a semiconductor light receiving element, and an electronic device. The semiconductor light emitting element includes e.g. a light emitting diode (LED), a laser diode (LD) and the like. The semiconductor light receiving element includes a photodiode (PD) and the like. The electronic device includes e.g. a high electron mobility transistor (HEMT), a heterojunction bipolar transistor (HBT), a field effect transistor (FET), a Schottky barrier diode (SBD) and the like. The nitride semiconductor wafer according to the embodiment includes at least part of the nitride semiconductor element according to the embodiment.

Figure 1B:
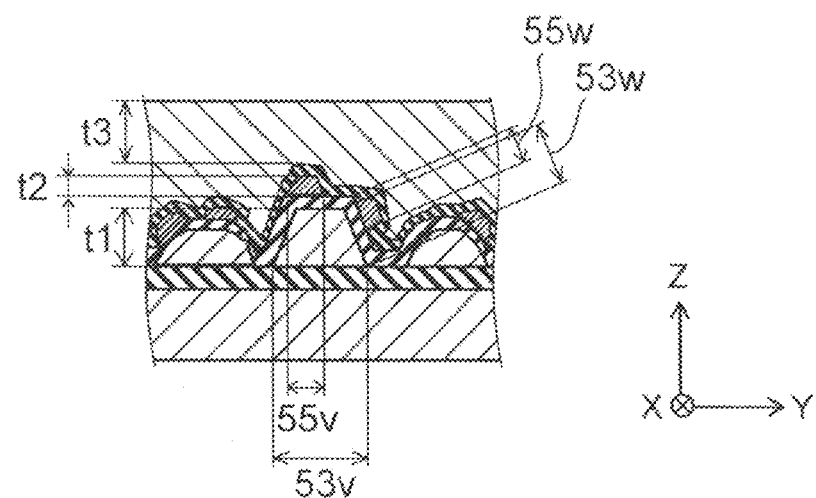

FIGS. 1A and 1B are schematic sectional views illustrating a nitride semiconductor element according to the first embodiment.

FIG. 1B is a figure partly extracted from FIG. 1A.

As shown in FIG. 1A, the nitride semiconductor element 110 according to the embodiment includes a buffer layer 60, a stacked body 50, and a functional layer 10. The stacked body 50 is provided on the buffer layer 60. The stacked body 50 is provided between the buffer layer 60 and the functional layer 10.

The direction from the stacked body 50 toward the functional layer 10 is referred to as Z-axis direction. The Z-axis direction is the stacking direction of the buffer layer 60, the stacked body 50, and the functional layer 10. One direction perpendicular to the Z-axis direction is referred to as X-axis direction. The direction perpendicular to the Z-axis direction and the X-axis direction is referred to as Y-axis direction. In the following, the Z-axis direction (stacking direction) may be referred to as "upward direction" or "above". However, in the case where the vertical direction of the nitride semiconductor element 110 is reversed, the aforementioned "upward direction" and "above" are reversed.

In this example, the nitride semiconductor element 110 further includes a substrate 40. The buffer layer 60 is placed between the substrate 40 and the stacked body 50.

The substrate 40 is e.g. a Si(111) substrate. In the embodiment, in the case where the substrate 40 is a silicon substrate, the surface orientation of the substrate 40 does not need to be the (111) plane, but may be e.g. the surface orientation denoted as (11n) (n: integer) or the (100) plane. For instance, the (110) plane is preferable because it reduces lattice mismatch between the silicon substrate and the nitride semiconductor layer.

The substrate 40 may be a substrate including an oxide layer. For instance, the substrate 40 may be a silicon-on-insulator (SOI) substrate or the like. The substrate 40 may be a substrate including a material different in lattice constant from the functional layer 10. The substrate 40 may be a substrate including a material different in thermal expansion coefficient from the functional layer 10. For instance, the substrate 40 may be a substrate of one of sapphire, spinel, GaAs, InP, ZnO, Ge, SiGe, GaN, AlN, and SiC.

For instance, the buffer layer 60 is formed on the substrate 40. The stacked body 50 is formed on the buffer layer 60. The functional layer 10 is formed on the stacked body 50. Epitaxial growth is performed in these formation steps.

The nitride semiconductor element 110 according to the embodiment may be used in the state in which the substrate 40, the buffer layer 60, the stacked body 50, and part of the functional layer 10 are removed. In the case where the nitride semiconductor element 110 is a light emitting element, the functional layer 10 includes e.g. an n-type semiconductor layer, a light emitting layer, and a p-type semiconductor layer.

In this description, the state of being "stacked" includes not only the state of being stacked in contact with each other, but also the state of being stacked with another layer interposed in between. The state of being "provided on" includes not only the state of being provided in direct contact, but also the state of being provided with another layer interposed in between.

The buffer layer 60 includes e.g. an AlN buffer layer 62.

The thickness of the AlN buffer layer 62 is preferably e.g. 10 nanometers (nm) or more and 400 nm or less, such as approximately 200 nm. The buffer layer is not limited to an AlN layer, but may be a GaN layer. In the case where a GaN layer is used as the buffer layer 60, the thickness of the GaN layer is e.g. 10 nm or more and 50 nm or less. The thickness of the GaN layer is e.g. approximately 30 nm. The buffer layer 60 can be made of a mixed crystal such as AlGaN and InGaN.

In the case where a silicon substrate is used as the substrate 40, the buffer layer 60 in contact with silicon may be made of AlN, which is less likely to cause chemical reaction with the substrate 40 (silicon substrate). This facilitates solving the problem such as melt-back etching by reaction between silicon and gallium. At least part of AlN used for the buffer layer 60 preferably includes a monocrystal. A monocrystalline AlN buffer layer 62 can be formed by epitaxial growth of AlN at a high temperature of 1000° C. or more. In the case where a silicon substrate is used as the substrate 40, the difference in thermal expansion coefficient between the nitride semiconductor and the silicon substrate is larger than the difference in thermal expansion coefficient between the nitride semiconductor and the substrate of a material different from silicon. Thus, the warpage of the substrate 40 occurring after epitaxial growth is likely to be large, and cracks are likely to occur. A stress (strain) is formed in the nitride semiconductor during epitaxial growth by using an AlN layer including a monocrystal as the buffer layer 60. This can reduce the warpage of the substrate after completion of the growth.

Preferably, a tensile stress (strain) is formed in the AlN buffer layer 62. Formation of a tensile stress (strain) in the AlN buffer layer 62 suppresses defect formation at the interface between the substrate 40 and the buffer layer 60.

If the buffer layer 60 contains In, lattice mismatch between the buffer layer 60 and the substrate 40 (silicon substrate) is relaxed. This suppresses generation of dislocations. In the case where the buffer layer 60 contains In, elimination reaction of In is likely to occur during crystal growth. Preferably, the In composition ratio is set to 50% or less in order to obtain a buffer layer 60 with good flatness.

The stacked body 50 includes a first GaN layer 53, a first layer 54, and a second GaN layer 55. For instance, the stacked body 50 may further include an AlGaN layer 51, a second layer 56, a third layer 52, and a third GaN layer 57.

The AlGaN layer 51 is made of $Al_xGa_{1-x}N$ ($0<x\leq1$). The thickness of the AlGaN layer 51 is preferably e.g. 100 nm or more and 1000 nm or less, such as approximately 250 nm. The Al composition ratio of the AlGaN layer 51 is preferably e.g. 0.1 or more and 0.9 or less, such as 0.25. The AlGaN layer 51 can increase the effect of suppressing melt-back etching. The AlGaN layer 51 can increase the compressive stress (strain) formed in the stacked body 50.

In the case of stacking a plurality of nitride semiconductor layers being mutually different in composition, the nitride semiconductor layer stacked above (e.g., AlGaN layer 51) is formed so as to be matched with the lattice spacing (lattice length) of the nitride semiconductor layer formed below (e.g., AlN buffer layer 62). Thus, the actual lattice spacing of the nitride semiconductor layer is different from the unstrained lattice spacing (lattice constant).

In this description, the unstrained lattice spacing of a nitride semiconductor is referred to as "lattice constant". In this description, the actual lattice length of the formed nitride semiconductor layer is referred to as "lattice spacing". The lattice constant is e.g. a material constant. The lattice spacing is e.g. the actual lattice length in the nitride semiconductor layer included in the formed nitride semiconductor element. The lattice spacing is determined from e.g. X-ray diffractometry.

The AlGaN layer 51 is at least partly crystalline. That is, at least part of the AlGaN layer 51 is not amorphous, but a polycrystal or monocrystal. The AlGaN layer 51 having a lattice constant larger than the lattice spacing of the AlN buffer layer 62 is formed on the monocrystalline AlN buffer layer 62. Thus, a compressive stress (strain) is formed in the crystalline AlGaN layer 51. The lattice spacing of the AlGaN layer 51 with the compressive stress (strain) formed therein is smaller than the unstrained lattice spacing (lattice constant). Formation of the compressive stress (strain) can reduce the tensile stress (strain) occurring by the difference in thermal expansion coefficient between the nitride semiconductor and the silicon substrate in the temperature lowering process after crystal growth. This can suppress occurrence of warpage and cracks in the substrate 40.

Crystallinity of the AlGaN layer 51 facilitates three-dimensional growth of the GaN layer constituting part of the stacked body 50 formed on the AlGaN layer 51. This facilitates reducing dislocations. The crystallinity of the AlGaN layer 51 can be evaluated by e.g. observation of a diffraction peak by X-ray diffractometry or the like. For instance, the crystallinity of the AlGaN layer 51 can be evaluated by observing the diffraction peak of a crystal surface (e.g., (0002) plane) in the direction parallel to the growth direction (stacking direction).

Preferably, the AlGaN layer 51 has a flat surface free from pits. The GaN layer constituting part of the stacked body 50 is formed on the flat surface. This facilitates forming a larger compressive stress (strain) in the GaN layer.

Formation of the AlGaN layer 51 on the AlN buffer layer 62 can reduce dislocations at the interface between the AlN buffer layer 62 and the AlGaN layer 51.

The AlGaN layer 51 may be a single layer, or may include a plurality of layers. In this example, the AlGaN layer 51 includes a first AlGaN layer 51a, a second AlGaN layer 51b, and a third AlGaN layer 51c. The number of layers included in the AlGaN layer 51 may be two, or four or more. The second AlGaN layer 51b is provided on the first AlGaN layer 51a. The third AlGaN layer 51c is provided on the second AlGaN layer 51b. Formation of a plurality of layers as AlGaN layers 51 can increase the compressive stress (strain) formed in the AlGaN layers 51. In this case, preferable stacking is such that the Al composition ratio decreases upward from the buffer layer 60 (e.g., in the direction from the buffer layer 60 toward the functional layer 10). That is, the Al composition ratio in the second AlGaN layer 51b is preferably lower than the Al composition ratio in the first AlGaN layer 51a, and the Al composition ratio in the third AlGaN layer 51c is preferably lower than the Al composition ratio in the second AlGaN layer 51b.

For instance, in the case where the buffer layer 60 is made of AlN, it is preferable to form AlGaN layers 51 having Al composition ratios with lattice mismatch factors obtained by equally dividing the lattice mismatch factor at room temperature between AlN and GaN by the number of stacked AlGaN layers 51. That is, for instance, it is preferable to form AlGaN layers 51 having Al composition ratios such that the lattice mismatch factor of each layer is approximately equal to a value obtained by dividing the lattice mismatch factor at room temperature between AlN and GaN by the sum of one and the number of stacked layers. This facilitates increasing the compressive stress (strain) formed in the AlGaN layers 51.

The lattice mismatch factor at room temperature between AlN and the GaN layer is approximately 2.1%. Thus, for instance, in the case of forming three AlGaN layers 51, it is possible to form AlGaN layers 51 having Al composition ratios such that the lattice mismatch factor of each layer is approximately 0.5% (e.g., 0.4% or more and 0.6% or less).

For instance, AlGaN layers 51 having an Al composition ratio of approximately 0.55, 0.3, and 0.15 can be stacked in this order. For instance, the Al composition ratio in the first AlGaN layer 51a is approximately 0.55. The Al composition ratio in the second AlGaN layer 51b is approximately 0.3. The Al composition ratio in the third AlGaN layer 51c is approximately 0.15. If the Al composition ratio falls within the range of ±0.05 around the aforementioned value (approximately 0.55, approximately 0.3, approximately 0.15), the lattice mismatch factor of each layer can be set to approximately 0.5% (e.g., 0.4% or more and 0.6% or less).

For instance, in the case of forming two AlGaN layers 51, it is possible to form AlGaN layers 51 having Al composition ratios such that the lattice mismatch factor of each layer is approximately 0.7% (e.g., 0.6% or more and 0.8% or less).

For instance, AlGaN layers 51 having an Al composition ratio of approximately 0.45 and 0.18 can be stacked in this order. For instance, the Al composition ratio in the first AlGaN layer 51a is approximately 0.45. The Al composition ratio in the second AlGaN layer 51b is approximately 0.18.

The difference in Al composition ratio between the AlGaN layers 51 (in this example, first AlGaN layer 51a, second AlGaN layer 51b, and third AlGaN layer 51c) is not constant because a strain (stress) is formed in the AlGaN layers 51. Here, the lattice mismatch factor of the AlGaN layer 51 can be calculated by X-ray diffractometry at room temperature.

In the case of forming a plurality of layers as AlGaN layers 51, preferable stacking is such that the film thickness increases upward from the buffer layer 60 (e.g., in the direction from the buffer layer 60 toward the functional layer 10). That is, the film thickness of the second AlGaN layer 51b is preferably larger than the film thickness of the first AlGaN layer 51a, and the film thickness of the third AlGaN layer 51c is preferably larger than the film thickness of the second AlGaN layer 51b. This facilitates increasing the compressive stress (strain) formed in the AlGaN layers 51.

The third layer 52 is provided on the AlGaN layer 51. The first GaN layer 53 is provided on the third layer 52. The first layer 54 is provided on the first GaN layer 53. The second GaN layer 55 is provided on the first layer 54. The second layer 56 is provided on the second GaN layer 55. For instance, in the case where the third GaN layer 57 is provided, the third GaN layer 57 is provided on the second layer 56. In the following description, the case where the third GaN layer 57 is provided is taken as an example.

Each of the first layer 54, the second layer 56, and the third layer 52 in this practical example contains at least one of silicon (Si) and magnesium (Mg). Each of the first layer 54, the second layer 56, and the third layer 52 in this practical example may contain both Si and Mg. Each of the first layer 54, the second layer 56, and the third layer 52 may include at least one of SiN and MgN. Each of the first layer 54, the second layer 56, and the third layer 52 may include both SiN and MgN. Each of the first layer 54, the second layer 56, and the third layer 52 may be a GaN layer doped with at least one of Si and Mg at high concentration (δ-doping layer). Each of the first layer 54, the second layer 56, and the third layer 52 may be a GaN layer doped with both Si and Mg at high concentration (δ-doping layer).

As the element contained in each of the first layer 54, the second layer 56, and the third layer 52, Si is more preferable because it does not compromise the conductivity of the n-type semiconductor layer 11 formed as part of the functional layer 10. In the following description, the case where each of the first layer 54, the second layer 56, and the third layer 52 contains Si is taken as an example.

The third layer 52 has the effect of three-dimensionally growing a first GaN layer 53 when forming a first GaN layer 53 on the third layer 52. This is because the third layer 52 has fluctuations in Si concentration and thickness in the plane perpendicular to the stacking direction (in the X-Y plane), and the first GaN layer 53 grows selectively on at least one of the portion having a low Si concentration and the portion having a thin thickness. Dislocations generated in the buffer layer 60 can be bent in the direction perpendicular to the stacking direction (Z-axis direction) by three-dimensional growth of the first GaN layer 53. This can reduce dislocations reaching the functional layer 10. In the region in which the growth of the first GaN layer 53 is hampered by the third layer 52, the dislocations generated in the buffer layer 60 are blocked by the third layer 52. This hampers upward propagation of dislocations. The effect of reducing dislocations increases with the increase in the coverage factor of the third layer 52 over the AlGaN layer 51.

In this example, the third layer 52 is in contact with the AlGaN layer 51. Because the third layer 52 is in contact with the AlGaN layer 51, the first GaN layer 53 grows under the influence of the lattice mismatch difference with respect to the AlGaN layer 51. The lattice mismatch difference thus provided facilitates three-dimensional growth of the first GaN layer 53. This increases the dislocation reduction effect. The lattice mismatch difference thus provided can reduce dislocations occurring at the interface between the AlGaN layer 51 and the first GaN layer 53.

Preferably, a compressive stress (strain) is formed in the first GaN layer 53. Formation of a compressive stress (strain) in the first GaN layer 53 can reduce the warpage of the substrate 40 after epitaxial growth. Formation of a compressive strain facilitates island-like growth of the first GaN layer 53.

In this description, an island-like film is also referred to as "layer".

At least part of the AlGaN layer 51 is made of monocrystalline AlGaN. This can form a compressive stress (strain) in the first GaN layer 53. In the case of an amorphous AlGaN layer, the AlGaN layer 51 is likely to have a large lattice spacing. This makes it difficult to form a compressive stress (strain) in the first GaN layer 53.

The thickness of the third layer 52 is e.g. 1 atomic layer, and preferably 0.4 atomic layers or more and 2.1 atomic layers or less. If the thickness of the third layer 52 is thinner than 0.4 atomic layers, three-dimensional growth of the first GaN layer 53 is difficult. Thus, it is difficult to achieve the effect of reducing dislocations. On the other hand, if the thickness of the third layer 52 is thicker than 2.1 atomic layers, the region with no growth of the first GaN layer 53 increases. Thus, the flatness of the third GaN layer 57 is likely to decrease.

The third layer 52 does not need to be a uniform layer, but may be a discontinuous island-like layer or the like. The third layer 52 may be a layer provided with an opening.

The thickness of the third layer 52 is determined by direct observation using e.g. a transmission electron microscope (TEM) or scanning electron microscope (SEM) image. In SEM observation, a cross section cut along a cleavage plane of the nitride semiconductor layer or the substrate is used. The thickness of the third layer 52 is determined by secondary ion-microprobe mass spectrometry (SIMS). In secondary ion-microprobe mass spectrometry, in the case where the Si concentration in the layer is approximately $2\times10^{20}/cm^3$, the thickness of the third layer 52 corresponds to 1 atomic layer. In terms of surface density, this Si concentration corresponds to a Si sheet density of approximately $1\times10^{15}/cm^2$.

The first GaN layer 53 includes an unevenness. This unevenness has a surface (first slope) 53s inclined with respect to the plane (X-Y plane) perpendicular to the stacking direction (Z-axis direction). The first GaN layer 53 may be an island-like crystal layer discontinuous in the X-Y plane. The first slope 53s inclined with respect to the plane (X-Y plane) perpendicular to the stacking direction (Z-axis direction) is e.g. a facet surface such as the (10-11) plane and (11-22) plane. The first slope 53s does not need to be a specific crystal surface. The first GaN layer 53 may be shaped like a dome. The first GaN layer 53 may have a plane perpendicular to the X-Y plane rather than the inclined surface.

Figure 2A:
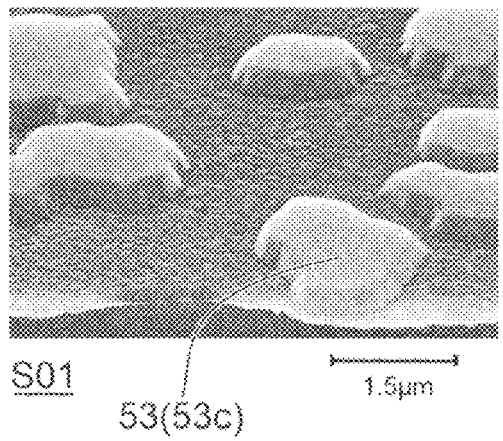
FIGS. 2A to 2C are examples of the SEM image showing the first GaN layer according to the embodiment.
Figure 2B:
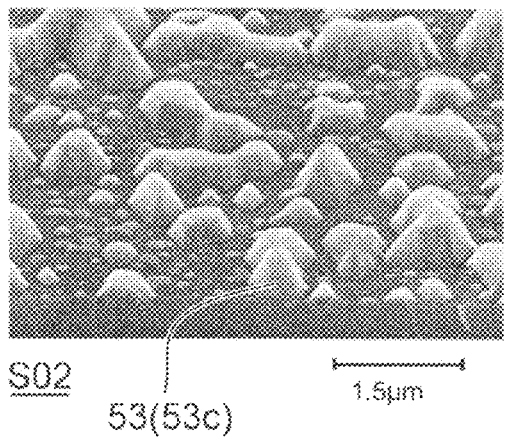
Figure 2C:
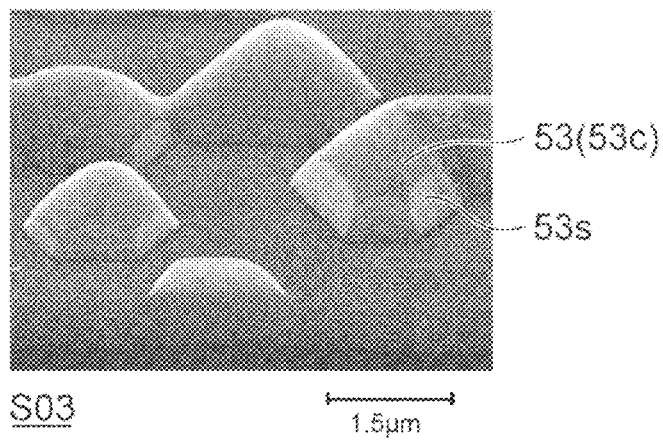

FIGS. 2A to 2C are examples of the SEM image showing the first GaN layer according to the embodiment. In the first example S01 shown in FIG. 2A, at a substrate temperature of 1040° C., silane (SiH₄) with a concentration of 10 ppm is supplied at a flow rate of 350 cc/min, and ammonia is supplied at a flow rate of 20 L/min, for 3 minutes onto the AlGaN layer 51. Thus, a third layer 52 is formed. Subsequently, at a substrate temperature of 1090° C., TMG is supplied at a flow rate of 56 cc/min, and ammonia is supplied at a flow rate of 40 L/min, for 5 minutes. Thus, a first GaN layer 53 is formed. The V/III ratio for forming the first GaN layer 53 is equivalent to 6500. The thickness of the third layer 52 is approximately 0.4 atomic layers.

In the second example S02 shown in FIG. 2B, the growth time for forming the third layer 52 is set to 8 minutes. The thickness of the third layer 52 is approximately 1 atomic layer.

In the third example S03 shown in FIG. 2C, the ammonia flow rate for forming the first GaN layer 53 is set to 2.5 L/min. That is, the V/III ratio for forming the first GaN layer 53 is decreased to 490.

As seen from FIG. 2A, the first GaN layer 53 is an island-like crystal layer. The thickness (height) of the protrusion 53c (first protrusion) of the first GaN layer 53 is 150-200 nm. The diameter (width) 53v of the bottom 53u (see FIG. 1A) of the protrusion 53c of the first GaN layer 53

(i.e., the length of the bottom of the protrusion in the direction parallel to the X-Y plane) is approximately 1.5 μm. Numerous microcrystals with a height of 50 nm or less are formed.

As shown in FIG. 2B, when the time for forming the third layer 52 is lengthened to 8 minutes, the thickness (height) of the protrusion 53c of the first GaN layer 53 increases to 200-500 nm. On the other hand, the diameter (width) 53v of the bottom 53u of the protrusion 53c of the first GaN layer 53 decreases to approximately 0.8 μm. The microcrystals with a height of 50 nm or less observed in FIG. 2A are not substantially formed. Thus, the height (thickness) of the protrusion 53c of the first GaN layer 53 and the diameter (width) 53v of the bottom 53u of the protrusion 53c of the first GaN layer 53 can be changed by the thickness of the third layer 52. A thicker thickness of the third layer 52 tends to result in a higher height (thickness) of the protrusion 53c of the first GaN layer 53.

On the other hand, as shown in FIG. 2C, if the V/III ratio of the first GaN layer 53 is decreased to 490, the height (thickness) of the protrusion 53c of the first GaN layer 53 increases to 400-700 nm. The area of the first slope 53s increases, and the protrusion 53c is shaped like a cone or dome. On the other hand, the diameter (width) 53v of the bottom 53u of the protrusion 53c of the first GaN layer 53 remains approximately 1.5 μm. Thus, the height (thickness) of the protrusion 53c of the first GaN layer 53 and the shape of the first slope 53s can be changed by the V/III ratio of the first GaN layer 53. A lower V/III ratio of the first GaN layer 53 tends to result in a higher (thicker) height (thickness) of the protrusion 53c of the first GaN layer 53, and a larger proportion occupied by the first slope 53s.

The height (thickness) t1 (see FIG. 1B) of the protrusion 53c of the first GaN layer 53 is e.g. 100 nm or more and 1200 nm or less. In the examples shown in FIGS. 2A to 2C, the first GaN layer 53 is provided on part of the third layer 52. In such cases, the height (thickness) t1 of the protrusion 53c of the first GaN layer 53 is the distance between the upper surface of the third layer 52 and the upper end of the protrusion 53c of the first GaN layer 53. In the case where the first GaN layer 53 has a top surface (first top surface 53t), the height t1 is the distance between the upper surface of the third layer 52 and the top surface (first top surface 53t). The height t1 of the first GaN layer 53 is the distance between the upper surface of the third layer 52 and the upper end of the protrusion 53c of the first GaN layer 53 in the highest one of the protrusions (first protrusions) 53c of the first GaN layer 53.

In the case where another layer is provided between the first GaN layer 53 and the third layer 52, or the case where the third layer 52 is not provided, the height (thickness) t1 of the protrusion 53c of the first GaN layer 53 is the distance between the bottom 53u of the protrusion 53c of the first GaN layer 53 and the upper end of the protrusion 53c of the first GaN layer 53 (the first top surface 53t, in the case where the first GaN layer 53 has a first top surface 53t).

The first GaN layer 53 may cover the third layer 52. In this case, the height (thickness) of the protrusion 53c in the first GaN layer 53 corresponds to the height (depth) of the unevenness of the first GaN layer 53, i.e., the distance along the Z-axis direction between the protrusion and the depression of the unevenness. In the case where the first GaN layer 53 covers the third layer 52, the diameter (width) 53v of the bottom 53u of the protrusion 53c of the first GaN layer 53 corresponds to the distance between the first depression of the unevenness and the second depression adjacent to the first depression.

The first GaN layer 53 is provided with a protrusion 53c. The thickness of the first GaN layer 53 is not uniform. The thickness of the first GaN layer 53 is different from the height of the protrusion 53c of the first GaN layer 53. The thickness of the first GaN layer 53 is the average thickness of the first GaN layer 53.

FIGS. 3A to 3D are graphs illustrating the characteristics of the nitride semiconductor element.

FIGS. 3A to 3D show an example of the height (thickness) t1 of the first GaN layer 53 changed with the growth time (thickness) TM of the third layer 52, and the V/III ratio (V/III), the growth temperature (substrate temperature) GT, and the growth rate GR for forming the first GaN layer 53.

In this example, conditions not described below with regard to the third layer 52 and the first GaN layer 53 are the same as those described above with reference to FIGS. 2A to 2C.

Figure 3A:
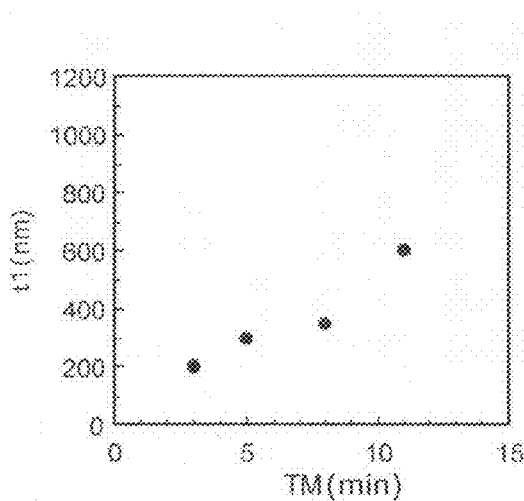
FIGS. 3A to 3D are graphs illustrating the characteristics of the nitride semiconductor element.

FIG. 3A shows the height (thickness) t1 of the first GaN layer 53 changed with the growth time (thickness) TM of the third layer 52. As shown in FIG. 3A, for instance, in the case where the growth time TM of the third layer 52 is 5 minutes, the height (thickness) t1 of the first GaN layer 53 is 300 nm. In the case where the growth time TM is 11 minutes, the height (thickness) t1 of the first GaN layer 53 is 600 nm. Thus, when the growth time TM of the third layer 52 is long, the height (thickness) t1 of the first GaN layer 53 is high (thick). A longer growth time TM of the third layer 52 decrease the island density of the first GaN layer 53, and increases the spacing between the first GaN layers 53.

Figure 3B:
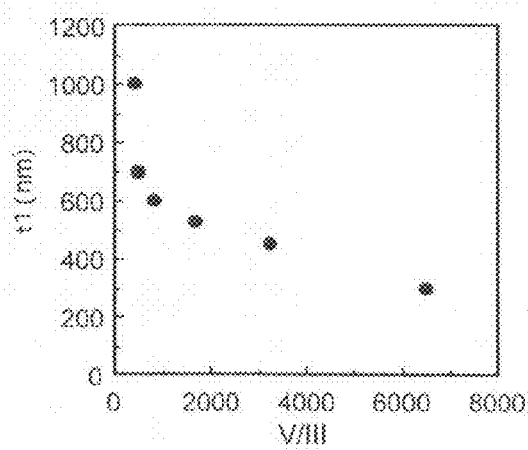

FIG. 3B shows the height (thickness) t1 of the first GaN layer 53 changed with the V/III ratio (V/III) for forming the first GaN layer 53. In this example, the supply amount of TMGa as a group III raw material gas is set constant at 56 cc/min, and the supply amount of ammonia is changed.

As shown in FIG. 3B, for instance, in the case where the V/III ratio of the first GaN layer 53 is 3250, the height (thickness) t1 of the first GaN layer 53 is 450 nm. In the case where the V/III ratio of the first GaN layer 53 is 410, the height (thickness) t1 of the first GaN layer 53 is 1000 nm. Thus, when the V/III ratio of the first GaN layer 53 is small, the height (thickness) t1 of the first GaN layer 53 is high (thick). A smaller V/III ratio of the first GaN layer 53 decreases the island density of the first GaN layer 53, and increases the spacing between the first GaN layers 53.

Figure 3C:
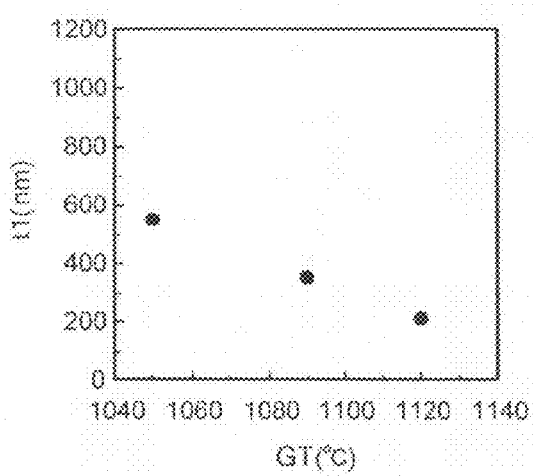

FIG. 3C shows the height (thickness) t1 of the first GaN layer 53 changed with the growth temperature (substrate temperature) GT for forming the first GaN layer 53. As shown in FIG. 3C, for instance, in the case where the growth temperature GT of the first GaN layer 53 is 1050° C., the height (thickness) t1 of the first GaN layer 53 is 550 nm. In the case where the growth temperature GT of the first GaN layer 53 is 1120° C., the height (thickness) t1 of the first GaN layer 53 is 210 nm. Thus, when the growth temperature GT of the first GaN layer 53 is low, the height (thickness) t1 of the first GaN layer 53 is high (thick). If the growth temperature GT of the first GaN layer 53 is higher than 1120° C., melt-back etching is likely to occur, and the crystal is prone to degradation. If the growth temperature GT of the first GaN layer 53 is lower than 1000° C., pits are likely to occur, and the crystal is prone to degradation. Thus, the growth temperature GT of the first GaN layer 53 is preferably 1000° C. or more and 1120° C. or less. A higher growth temperature GT of the first GaN layer 53 increases elimination reaction of the Ga raw material at the crystal surface, and decreases the island density of the first GaN layer 53. This reduces the size of the protrusion 53c of the first GaN layer 53.

Figure 3D:
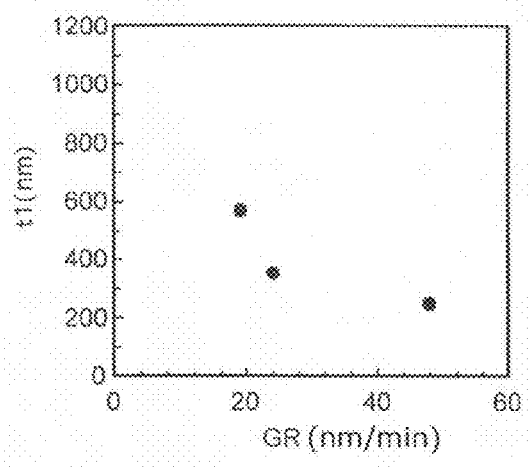

FIG. 3D shows the height (thickness) t1 of the first GaN layer 53 changed with the growth rate GR for forming the first GaN layer 53. In this experiment, the supply amount of TMGa is changed. In this case, the growth time is changed so that the total supply amount of the raw material gas for forming the first GaN layer 53 is constant. For instance, in the case where the flow rate of TMGa is doubled to 112 cc/min, the growth time is halved to 2.5 minutes.

As shown in FIG. 3D, for instance, in the case where the growth rate GR of the first GaN layer 53 is 19 nm/min, the height (thickness) t1 of the first GaN layer 53 is 550 nm. In the case where the growth rate GR of the first GaN layer 53 is 48 nm/min, the height (thickness) t1 of the first GaN layer 53 is 250 nm. Thus, when the growth rate GR of the first GaN layer 53 is slow, the height (thickness) t1 of the first GaN layer 53 is high (thick). A slower growth rate GR of the first GaN layer 53 increases elimination reaction of the Ga raw material at the crystal surface, and decreases the island density of the first GaN layer 53. That is, for a faster growth rate GR of the first GaN layer 53, island-like first GaN layers 53 can be formed at higher density.

In FIGS. 2A to 2C and FIGS. 3A to 3D, the first GaN layer 53 is made of undoped GaN. The first GaN layer 53 may be made of n-GaN doped with n-type impurity. In the case of using n-GaN, the size of the protrusion 53c of the first GaN layer 53 is smaller, the density of unevenness is higher, and the area of the slope is likely to be larger than in the case without being doped with n-type impurity (Si). This is because facet formation is promoted by doping with n-type impurity. The increase of the area of the first layer 54 formed on the first slope 53s of the protrusion 53c of the first GaN layer 53 increases the effect of blocking or bending dislocations. This facilitates reducing dislocations.

Preferably, the concentration of n-type impurity in the first GaN layer 53 is $1.0 \times 10^{17}/cm^3$ or more and $1.0 \times 10^{20}/cm^3$ or less. More preferably, the concentration of n-type impurity in the first GaN layer 53 is $1.0 \times 10^{18}/cm^3$ or more and $5.0 \times 10^{19}/cm^3$ or less. The concentration of n-type impurity in the first GaN layer 53 equal to $1.0 \times 10^{17}/cm^3$ substantially corresponds to the concentration of n-type impurity for an undoped GaN layer. If the concentration of n-type impurity in the first GaN layer 53 is higher than $1.0 \times 10^{20}/cm^3$, the growth of the first GaN layer 53 is hampered by the n-type impurity. This decreases the area of the slope (first slope 53s) of the protrusion 53c of the first GaN layer 53, and decreases the effect of reducing the dislocation density.

The concentration of n-type impurity in the first GaN layer 53 can be evaluated by e.g. secondary ion-microprobe mass spectrometry (SIMS).

As shown in FIG. 1A, a first layer 54 is formed on the first GaN layer 53. In this example, the first GaN layer 53 is shaped like an island discontinuous in the X-Y plane. Part of the first layer 54 is in contact with the first GaN layer 53. Another part of the first layer 54 is in contact with the third layer 52. The first layer 54 is formed on the inclined surface (first slope 53s) of the first GaN layer 53. Thus, blocking or bending of dislocations is caused at the interface between the first GaN layer 53 and the first layer 54. This can reduce dislocations propagating to the functional layer 10. Because the first layer 54 is in contact with the third layer 52, the effect of blocking or bending dislocations in the first layer 54 increases. This increases the effect of suppressing propagation of dislocations generated in the buffer layer 60 to the functional layer 10.

The thickness of the first layer 54 is e.g. 0.5 atomic layers, and preferably 0.2 atomic layers or more and 2 atomic layers or less. If the thickness of the first layer 54 is thinner than 0.2 atomic layers, the dislocation bending effect at the first slope 53s is not achieved, and dislocations are likely to increase. On the other hand, if the thickness of the first layer 54 is thicker than 2 atomic layers, the first GaN layer 53 does not substantially grow. This decreases the flatness of the third GaN layer 57.

The first layer 54 does not need to be a uniform layer, but may be a discontinuous island-like layer or the like. The first layer 54 may be a layer provided with an opening.

The thickness of the first layer 54 is preferably thinner than the thickness of the third layer 52. If the thickness of the first layer 54 is thicker than the thickness of the third layer 52, growth of GaN on the inclined surface (first slope 53s) of the first GaN layer 53 is hampered. This decreases surface flatness and lowers the characteristics of the functional layer 10.

A second GaN layer 55 is formed on the first layer 54. The second GaN layer 55 includes an island-like crystal including an unevenness having a surface (second slope 55s) inclined with respect to the plane (X-Y plane) perpendicular to the stacking direction (Z-axis direction). The surface (second slope 55s) inclined with respect to the plane (X-Y plane) perpendicular to the stacking direction (Z-axis direction) is e.g. a facet surface such as the (10-11) plane and (11-22) plane. The second slope 55s does not need to be a specific crystal surface. The second GaN layer 55 may be shaped like a dome. The second GaN layer 55 may have a plane perpendicular to the X-Y plane rather than the inclined surface.

For instance, the second GaN layer 55 is formed on the top surface (first top surface 53t) of the first GaN layer 53. For instance, the second GaN layer 55 is formed on the slope (first slope 53s) of the first GaN layer 53. In this description, the state in which "the second GaN layer 55 is provided on the first GaN layer 53" includes the state in which the second GaN layer 55 is provided on at least one of the top surface (first top surface 53t) of the first GaN layer 53 and the slope (first slope 53s) of the first GaN layer 53.

The height (thickness) t2 (see FIG. 1A) of the protrusion (second protrusion) 55c of the second GaN layer 55 is e.g. 10 nm or more and 1000 nm or less. The height (thickness) t2 of the protrusion 55c of the second GaN layer 55 is the distance between the upper surface of the first layer 54 and the upper end of the protrusion 55c of the second GaN layer 55. In the case where the second GaN layer 55 has a top surface (second top surface) 55t, the height t2 is the distance between the upper surface of the first layer 54 and the second top surface 55t. In the second GaN layer 55 provided on the slope (first slope 53s) of the first GaN layer 53, the height t2 is the distance in the direction perpendicular to the slope (first slope 53s) of the first GaN layer 53 between the upper surface of the first layer 54 and the upper end of the protrusion 55c of the second GaN layer 55. The height t2 of the second GaN layer 55 is defined as the distance between the upper surface of the first layer 54 and the upper end of the protrusion 55c of the second GaN layer 55 in the highest one of the protrusions 55c of the second GaN layer 55.

If the height (thickness) t2 of the protrusion 55c of the second GaN layer 55 is lower (thinner) than 10 nm, formation of the second slope 55s is insufficient. Thus, the effect of bending or blocking dislocations in the first layer 54 is not sufficiently achieved. In this case, the volume (surface area) of the crystal of the first GaN layer 53 is small. Thus, bending of dislocations in the crystal is less likely to occur. This decreases the dislocation reduction effect in the first GaN layer 53.

On the other hand, in the case where the height (thickness) t2 is larger than 1000 nm, adjacent crystals of the second GaN layer 55 are likely to unite. Thus, the second GaN layer 55 is likely to be a continuous layer. As a result, the blocking effect at the second slope 55s is lowered, and dislocations are likely to increase.

The second GaN layer 55 may be made of undoped GaN. The second GaN layer 55 may be made of n-GaN doped with n-type impurity. In the case of using n-GaN, the size of the protrusion is smaller, the density of unevenness is higher, and the area of the slope is likely to be larger than in the case without being doped with n-type impurity (Si). This is because facet formation is promoted by doping with n-type impurity. That is, the second GaN layer 55 with a small size is likely to be formed on the first GaN layer 53. The area of the second layer 56 formed on the second slope 55s of the protrusion 55c of the second GaN layer 55 increases. This increases e.g. the effect of blocking or bending dislocations, and facilitates reducing dislocations.

Preferably, the concentration of n-type impurity in the second GaN layer 55 is e.g. $1.0 \times 10^{17}/cm^3$ or more and $1.0 \times 10^{20}/cm^3$ or less. More preferably, the concentration of n-type impurity in the second GaN layer 55 is $1.0 \times 10^{18}/cm^3$ or more and $5.0 \times 10^{19}/cm^3$ or less. The concentration of n-type impurity in the second GaN layer 55 equal to $1.0 \times 10^{17}/cm^3$ substantially corresponds to the concentration of n-type impurity for an undoped GaN layer. If the concentration of n-type impurity in the second GaN layer 55 is higher than $1.0 \times 10^{20}/cm^3$, the growth of the second GaN layer 55 is hampered by the n-type impurity. This decreases the area of the slope (second slope 55s) of the protrusion 55c of the second GaN layer 55, and decreases the effect of reducing the dislocation density.

The concentration of n-type impurity in the second GaN layer 55 can be evaluated by e.g. secondary ion-microprobe mass spectrometry (SIMS).

A second layer 56 is formed on the second GaN layer 55. In this example, the second GaN layer 55 is shaped like an island discontinuous in the X-Y plane. Part of the second layer 56 is in contact with the second GaN layer 55. Another part of the second layer 56 is in contact with the first layer 54.

The AlGaN layer 51 has an upper surface 51au. The direction perpendicular to the upper surface 51au corresponds to the Z-axis direction. The upper surface 51au of the AlGaN layer 51 is parallel to the X-Y plane. As shown in FIGS. 1A and 1B, the length (width) 55v of the bottom 55u of the protrusion 55c of the second GaN layer 55 in the direction (first direction) parallel to the upper surface 51au of the AlGaN layer 51 is shorter than the length (width 53v) of the bottom 53u of the protrusion 53c of the first GaN layer 53 in the first direction. The length 55w of the protrusion 55c of the second GaN layer 55 in one tangential direction (second direction) on the slope (first slope 53s) of the first GaN layer 53 is shorter than the length 53w of the protrusion 53c of the first GaN layer 53 in the second direction.

In other words, the size of the protrusion 55c of the second GaN layer 55 is smaller than the size of the protrusion 53c of the first GaN layer 53.

On the plane (X-Y plane) perpendicular to the Z-axis direction (stacking direction), the number of second slopes 55s of the second GaN layer 55 per unit area is larger than the number of first slopes 53s of the first GaN layer 53 per unit area.

Here, in this description, the "size of a layer" refers to the width of the layer (including "island-like layer"). The "width of a layer" is the length of the layer in the direction (first direction) parallel to the upper surface 51au of the AlGaN layer 51. Alternatively, the "width of a layer" may be the length of the layer in one tangential direction (second direction) on the slope (first slope 53s) of the first GaN layer 53.

The ratio of the length 55v of the bottom 55u of the protrusion 55c of the second GaN layer 55 to the length 53v of the bottom 53u of the protrusion 53c of the first GaN layer 53 (length 55v/length 53v) is e.g. approximately 0.005 or more and less than 1. More preferably, the ratio is approximately 0.005 or more and 0.95 or less. Still more preferably, the ratio is 0.01 or more and 0.7 or less.

The second GaN layer 55 having a smaller size than the first GaN layer 53 is formed on the first GaN layer 53. Thus, the dislocation penetrating through the first GaN layer 53 and the first layer 54 can be bent in the second GaN layer 55. The first GaN layer 53 may have a top surface (first top surface 53t). At the top surface (first top surface 53t) of the first GaN layer 53, the effect of blocking or bending dislocations is low, and most of the dislocations extend toward the functional layer 10. The island-like second GaN layer 55 having a second slope 55s is formed on the top surface (first top surface 53t) of the first GaN layer 53. Thus, dislocations can be bent in the second GaN layer 55. This can reduce dislocations reaching the functional layer 10.

The bottom 55u of the protrusion 55c of the second GaN layer 55 may have a structure such that the length 55v of the bottom 55u of the protrusion 55c of the second GaN layer 55 is longer than the length 53v of the bottom 53u of the protrusion 53c of the first GaN layer 53. It is preferable for the reduction of dislocation density that the length 55v of the bottom 55u of the protrusion 55c of the second GaN layer 55 be shorter than the length 53v of the bottom 53u of the protrusion 53c of the first GaN layer 53 preferably in 10% or more of the structures, and more preferably in 50% or more of the structures, in which the protrusion 53c of the first GaN layer 53 and the protrusion 55c of the second GaN layer 55 are stacked.

For instance, if the growth temperature (substrate temperature) of the second GaN layer 55 is made higher than the growth temperature of the first GaN layer 53, a second GaN layer 55 having a smaller size than the first GaN layer 53 is likely to be formed on the first GaN layer 53. For instance, the growth temperature (substrate temperature) of the second GaN layer 55 is made higher than the growth temperature of the first GaN layer 53 by approximately 20-60° C.

For instance, if the growth rate of the second GaN layer 55 is made slower than the growth rate of the first GaN layer 53, a second GaN layer 55 having a smaller size than the first GaN layer 53 is likely to be formed on the first GaN layer 53. For instance, the growth rate of the second GaN layer 55 is decreased to approximately ¼ to ½ times the growth rate of the first GaN layer 53.

For instance, if the growth time of the second GaN layer 55 is made shorter than the growth time of the first GaN layer 53, a second GaN layer 55 having a smaller size than the first GaN layer 53 is likely to be formed on the first GaN layer 53.

For instance, if the growth pressure of the second GaN layer 55 is made higher than the growth pressure of the first GaN layer 53, a second GaN layer 55 having a smaller size than the first GaN layer 53 is likely to be formed on the first GaN layer 53. For instance, the growth pressure of the first GaN layer 53 is set to 400 hectopascals (hPa), and the growth pressure of the second GaN layer 55 is set to 1013 hPa.

The thickness of the second layer 56 is e.g. 0.5 atomic layers, and preferably 0.2 atomic layers or more and 2 atomic layers or less. If the thickness of the second layer 56 is thinner than 0.2 atomic layers, the dislocation bending effect at the second slope 55s is not easily achieved, and dislocations are likely to increase. On the other hand, if the thickness of the second layer 56 is thicker than 2 atomic layers, the second GaN layer 55 does not substantially grow. This hampers flattening in the third GaN layer 57.

The second layer 56 does not need to be a uniform layer, but may be a discontinuous island-like layer or the like. The second layer 56 may be a layer provided with an opening.

The thickness of the second layer 56 is preferably thinner than the thickness of the third layer 52. If the thickness of the second layer 56 is thicker than the thickness of the third layer 52, growth of GaN on the inclined surface (second slope 55s) of the second GaN layer 55 is hampered. This decreases surface flatness and lowers the characteristics of the functional layer 10.

A third GaN layer 57 is formed on the second layer 56. The upper surface of the third GaN layer 57 is e.g. flat. A functional layer 10 is formed on the third GaN layer 57. The thickness t3 of the third GaN layer 57 is e.g. 100 nm or more and 5000 nm or less. The thickness t3 of the third GaN layer 57 is the distance along the Z-axis direction between the upper end of the second layer 56 and the upper surface of the third GaN layer 57 (in this example, the interface 101 between the stacked body 50 and the functional layer 10).

Figure 4:
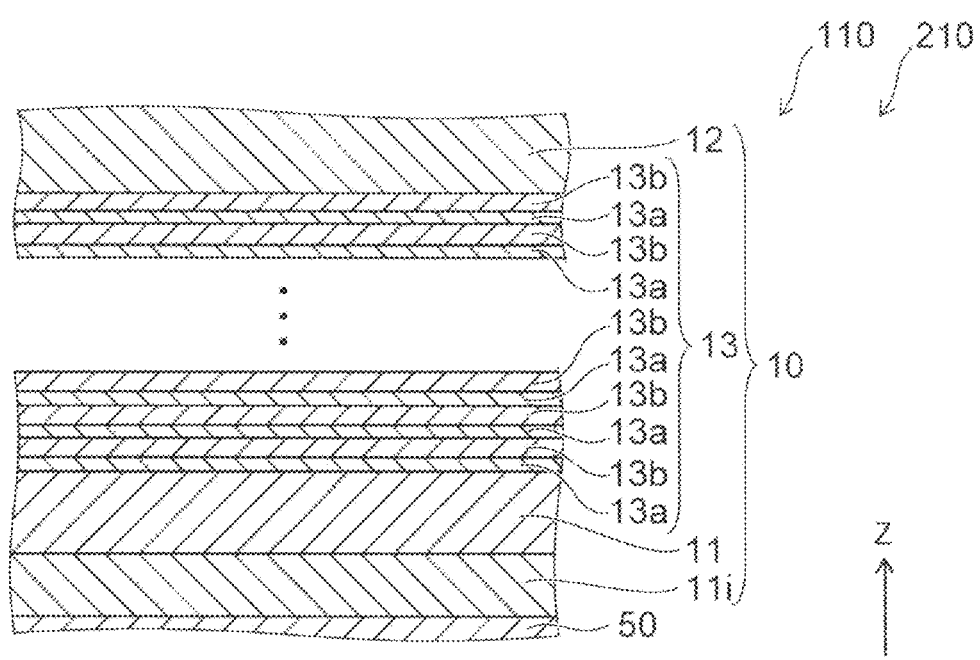
FIG. 4 is a schematic sectional view illustrating part of the nitride semiconductor element according to the first embodiment.

FIG. 4 is a schematic sectional view illustrating part of the nitride semiconductor element according to the first embodiment.

FIG. 4 shows an example of the functional layer 10. In the case where the nitride semiconductor element 110 is a light emitting element, the functional layer 10 includes e.g. an n-type semiconductor layer 11 formed on the stacked body 50, a light emitting layer 13 formed on the n-type semiconductor layer 11, and a p-type semiconductor layer 12 formed on the light emitting layer 13. The light emitting layer 13 includes a plurality of barrier layers 13a of GaN, and a well layer 13b provided between the barrier layers 13a. The number of well layers 13b may be either one or a plurality. That is, the light emitting layer 13 has e.g. a SQW (single-quantum well) structure or MQW (multi-quantum well) structure.

The bandgap energy of the barrier layer 13a is larger than the bandgap energy of the well layer 13b. The barrier layer 13a is made of e.g. GaN. The well layer 13b is made of e.g. InGaN (e.g., $In_{0.15}Ga_{0.85}N$). In the case where the barrier layer 13a is made of InGaN, the In composition ratio in the barrier layer 13a is lower than the In composition ratio in the well layer 13b. The peak wavelength of light emitted from the light emitting layer 13 is e.g. 200 nm or more and 1900 nm or less. The thickness of the functional layer 10 is preferably e.g. 5 nm or more and 5 µm or less, such as approximately 3.5 µm.

The functional layer 10 may further include a low impurity concentration layer 11i. The impurity concentration in the low impurity concentration layer 11i is lower than the impurity concentration in the n-type semiconductor layer 11. The low impurity concentration layer 11i is provided as necessary, and may be omitted. The low impurity concentration layer 11i is provided e.g. between the stacked body 50 and the n-type semiconductor layer 11.

The nitride semiconductor element 110 is used as e.g. a nitride semiconductor element of gallium nitride-based (GaN-based) HEMT (high electron mobility transistor). In this case, the functional layer 10 has e.g. a stacked structure of an undoped $Al_{z1}Ga_{1-z1}N$ ($0 \leq z1 \leq 1$) layer containing no impurity and an undoped or n-type $Al_{z2}Ga_{1-z2}N$ ($0 \leq z2 \leq 1$, $z1<z2$) layer.

Thus, the nitride semiconductor element 110 according to this embodiment includes a buffer layer 60, a functional layer 10 including a nitride semiconductor, and a stacked body 50 provided between the buffer layer 60 and the functional layer 10. The stacked body 50 includes a structure in which an $Al_xGa_{1-x}N$ ($0<x \leq 1$) layer 51 provided on the buffer layer 60, a third layer 52, a first GaN layer 53, a first layer 54, a second GaN layer 55, a second layer 56, and a third GaN layer 57 are stacked in this order. The third layer 52 is in contact with the $Al_xGa_{1-x}N$ ($0<x \leq 1$) layer 51. The first GaN layer 53 includes an unevenness (first protrusion 53c) having a first slope 53s inclined with respect to the major surface perpendicular to the stacking direction. The second GaN layer 55 includes an unevenness (second protrusion 55c) having a second slope 55s inclined with respect to the major surface perpendicular to the stacking direction. At least part of the first layer 54 is in contact with the first GaN layer 53 and the third layer 52. At least part of the second layer 56 is in contact with the second GaN layer 55 and the first layer 54. The length of the second protrusion 55c in a first direction parallel to the upper surface of the second GaN layer 55 is shorter than the length of the first protrusion 53c in the first direction. Thus, the effect of reducing dislocations is achieved, and dislocations reaching the functional layer 10 are reduced.

FIGS. 1A and 1B also illustrate the configuration of a nitride semiconductor wafer 210 according to this embodiment. The nitride semiconductor wafer 210 includes a substrate 40, a buffer layer 60, and a stacked body 50. The nitride semiconductor wafer 210 may further include a functional layer 10. The substrate 40, the buffer layer 60, the stacked body 50, and the functional layer 10 can be based on the respective configurations described with reference to the nitride semiconductor element 110.

Next, the characteristics of the nitride semiconductor element of this embodiment are described with reference to the drawings.

FIGS. 5A to 5D are schematic sectional views illustrating samples.

FIGS. 6A to 6D are cross-sectional SEM images showing examples of the buffer layer and the stacked body.

Figure 7A:
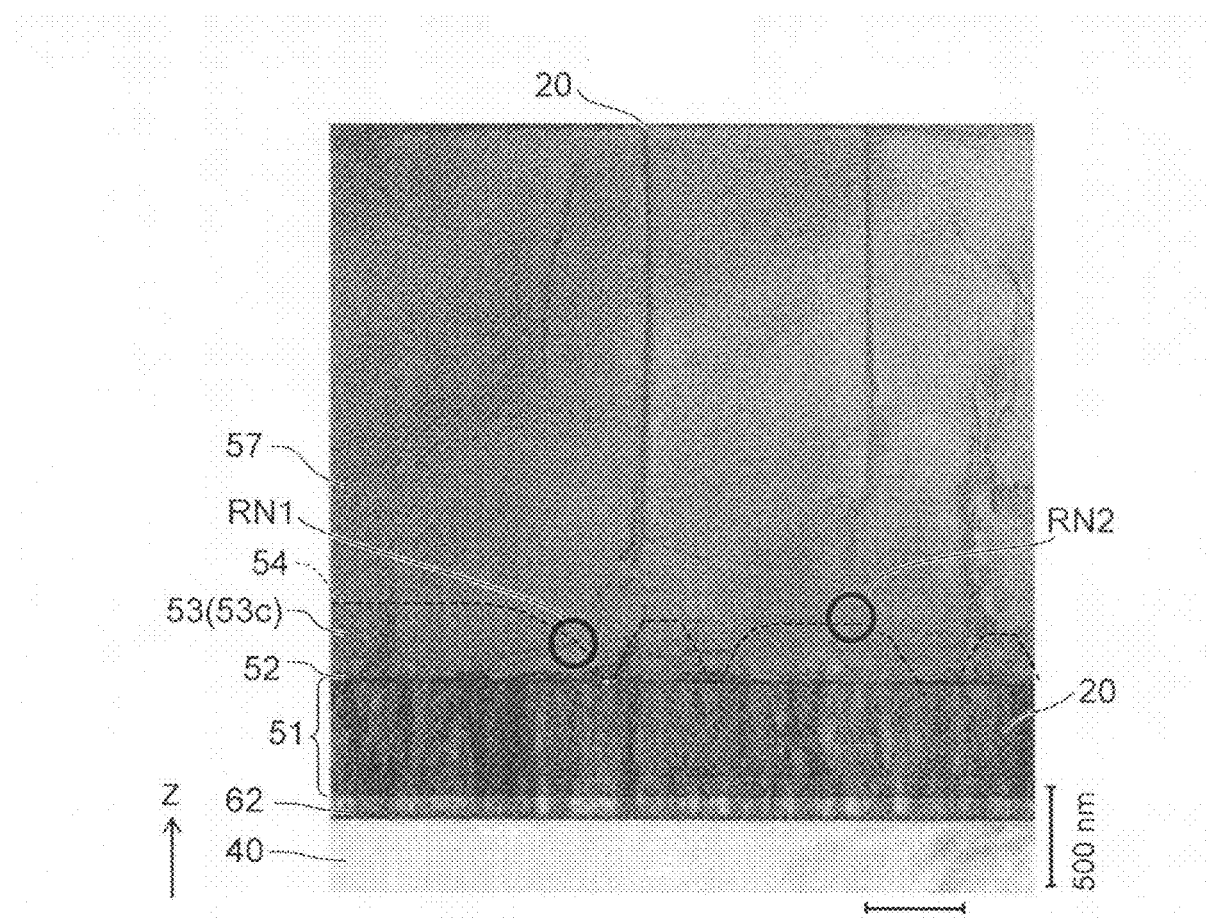
FIGS. 7A to 7C are transmission electron microscope images showing an example of a nitride semiconductor element according to a reference example.
Figure 7B:
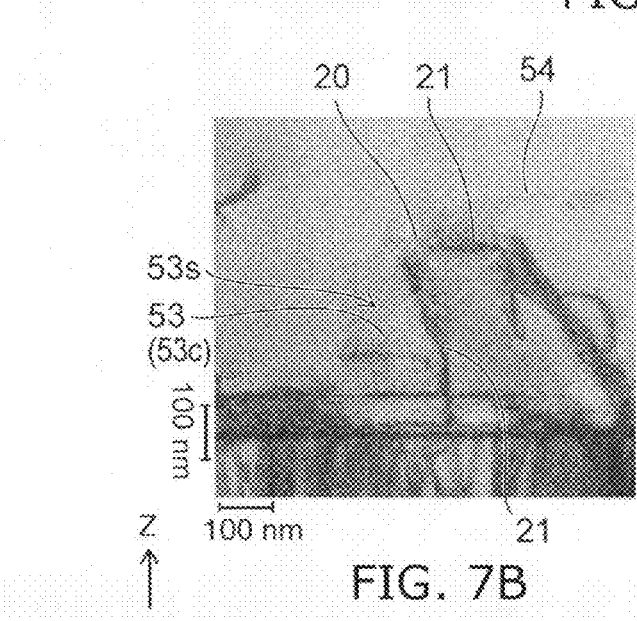
Figure 7C:
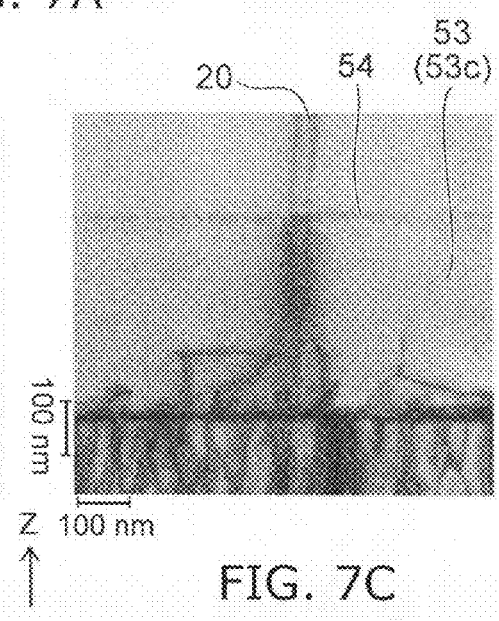

FIGS. 7A to 7C are transmission electron microscope images showing an example of a nitride semiconductor element according to a reference example.

Figure 8A:
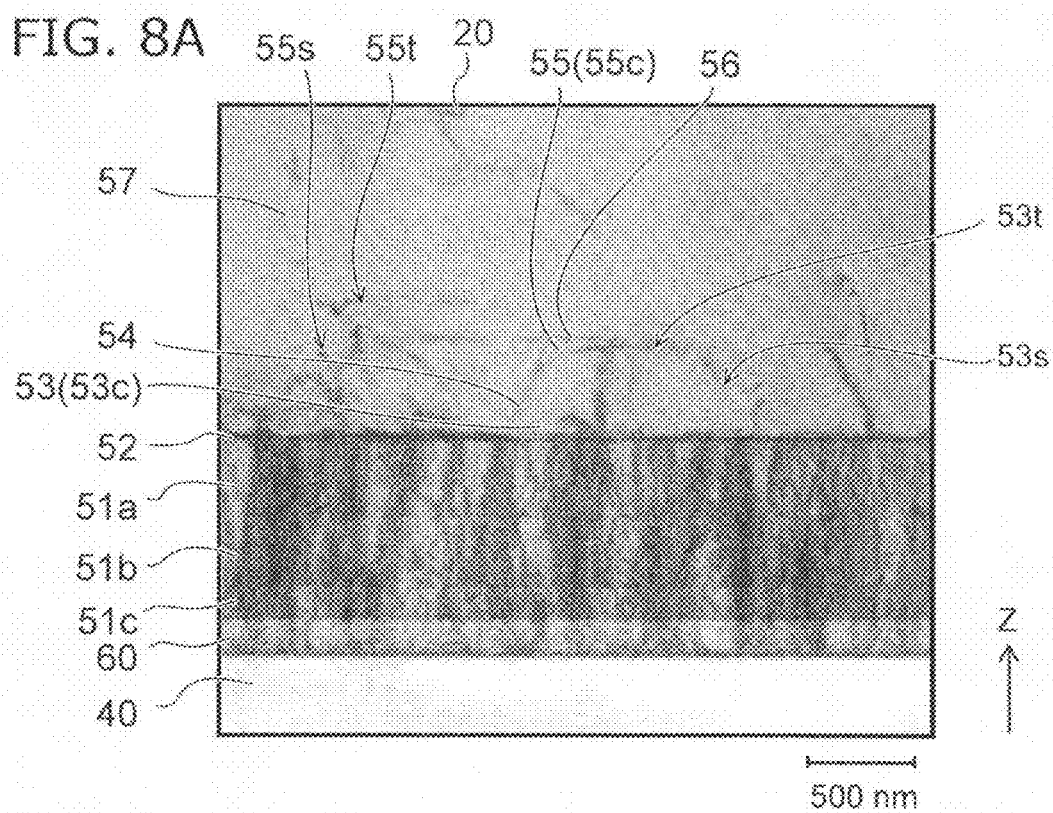
FIGS. 8A and 8B illustrate a nitride semiconductor element according to the first embodiment.
Figure 8B:
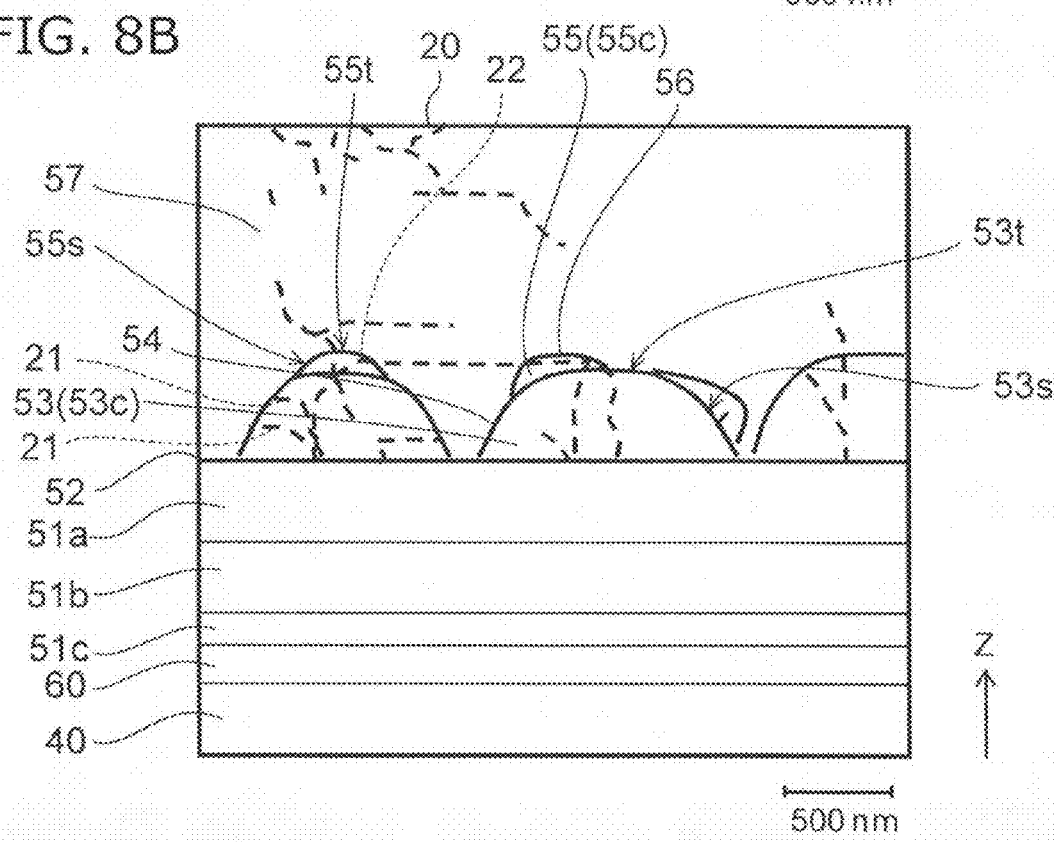

FIGS. 8A and 8B illustrate a nitride semiconductor element according to the first embodiment.

A nitride semiconductor element of a first practical example according to this embodiment is now described.

Figure 5A:
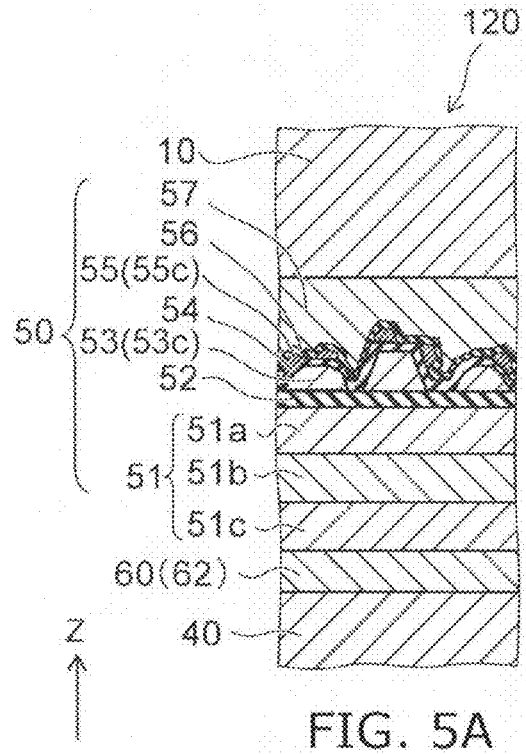
FIGS. 5A to 5D are schematic sectional views illustrating samples.

The nitride semiconductor element 120 of the first practical example shown in FIG. 5A has a configuration similar to the configuration of the nitride semiconductor element 110 illustrated in FIGS. 1A and 1B. The nitride semiconductor element 120 is fabricated as follows.

First, a substrate 40 made of silicon with the major surface being a (111) plane is subjected to cleaning with a mixed chemical of sulfuric acid and hydrogen peroxide, and dilute hydrofluoric acid. Then, the substrate 40 is introduced into a reaction chamber of an MOCVD apparatus.

The substrate 40 is heated to 1070° C. Trimethylaluminum (TMAl) is supplied at a flow rate of 50 cc/min, and ammonia ($NH_3$) is supplied at a flow rate of 0.8 L/min, for 20 minutes in a reduced pressure atmosphere at 400 hPa with the ratio of hydrogen and nitrogen being 2:1. Thus, a buffer layer 60 of AlN (AlN buffer layer 62) is formed. The thickness of the AlN buffer layer 62 is approximately 200 nm.

Next, the substrate temperature (the temperature of the substrate 40) is set to 1020° C. (fourth temperature). The fourth temperature is lower than or equal to the second temperature described later. Trimethylgallium (TMGa) is supplied at a flow rate of 10 cc/min, TMAl is supplied at a flow rate of 50 cc/min, and ammonia is supplied at a flow rate of 2.5 L/min, for 5 minutes. Thus, a first AlGaN layer 51a having an Al composition ratio of 0.55 is formed. The thickness of the first AlGaN layer 51a is approximately 100 nm.

Subsequently, the flow rate of TMG is changed to 17 cc/min, the flow rate of TMA is changed to 30 cc/min, and the supply is performed for 10 minutes. Thus, a second AlGaN layer 51b having an Al composition ratio of 0.3 is formed. The thickness of the second AlGaN layer 51b is approximately 200 nm.

Furthermore, the flow rate of TMG is changed to 20 cc/min, the flow rate of TMA is changed to 15 cc/min, and the supply is performed for 11 minutes. Thus, a third AlGaN layer 51c having an Al composition ratio of 0.15 is formed. The thickness of the third AlGaN layer 51c is approximately 250 nm.

Next, the substrate temperature is set to 1040° C. The growth pressure is changed to the atmospheric pressure being 1013 hPa. Silane ($SiH_4$) with a concentration of 10 ppm is supplied at a flow rate of 350 cc/min, and ammonia is supplied at a flow rate of 20 L/min, for 8 minutes. Thus, a third layer 52 is formed. The thickness of the third layer 52 is approximately 1 atomic layer. In the case of adding Mg to the third layer 52, for instance, bis(cyclopentadienyl)magnesium ($Cp_2Mg$) is added to the second gas. A third layer 52 including Si and Mg can be formed by supplying the second gas including e.g. silane, bis(cyclopentadienyl)magnesium, and ammonia.

Next, the substrate temperature is set to 1090° C. (first temperature). A first gas including e.g. TMG, silane, and ammonia is supplied for 2.5 minutes with the flow rate of TMG set to 112 cc/min, the flow rate of silane ($SiH_4$) at a concentration of 10 ppm set to 11 cc/min, and the flow rate of ammonia set to 40 L/min. Silane may be supplied by a path separate from TMG and ammonia. Silane does not need to be included in the first gas. Thus, a first GaN layer 53 is formed. The first GaN layer 53 includes an island-like crystal having a surface (first slope 53s) inclined with respect to the major surface perpendicular to the stacking direction. The thickness (height) of the first GaN layer 53 is approximately 300 nm.

Next, the substrate temperature is set again to 1040° C. (second temperature) lower than or equal to the first temperature. The second gas including silane and ammonia is supplied for 3 minutes with the flow rate of silane ($SiH_4$) at a concentration of 10 ppm set to 350 cc/min, and the flow rate of ammonia set to 20 L/min. Thus, a first layer 54 is formed. The thickness of the first layer 54 is approximately 0.5 atomic layers. In the case of adding Mg to the first layer 54, for instance, bis(cyclopentadienyl)magnesium ($Cp_2Mg$) is added to the second gas. A first layer 54 including Si and Mg can be formed by supplying the second gas including e.g. silane, bis(cyclopentadienyl)magnesium, and ammonia.

Next, the substrate temperature is set to 1120° C. (third temperature) higher than or equal to the first temperature. The first gas including TMG, silane, and ammonia is supplied for 2.5 minutes with the flow rate of TMG set to 56 cc/min, the flow rate of silane ($SiH_4$) set to 5.6 cc/min, and the flow rate of ammonia set to 40 L/min. Silane may be supplied by a path separate from TMG and ammonia. Silane does not need to be included in the first gas. Thus, a second GaN layer 55 is formed on the first GaN layer 53. The second GaN layer 55 includes an island-like crystal having a surface (second slope 55s) inclined with respect to the major surface perpendicular to the stacking direction. The thickness (height) of the second GaN layer 55 is approximately 100 nm.

Compared with the growth of the first GaN layer 53, the growth temperature is increased by 30° C., and the TMG flow rate is halved. This suppresses attachment of Ga, and a second GaN layer 55 including an island-like crystal with a size smaller than the first GaN layer 53 is selectively formed. The growth rate of the second GaN layer 55 is as slow as approximately half the growth rate of the first GaN layer 53.

Next, the substrate temperature is set again to 1040° C. The second gas including silane and ammonia is supplied for 3 minutes with the flow rate of silane ($SiH_4$) at a concentration of 10 ppm set to 350 cc/min, and the flow rate of ammonia set to 20 L/min. Thus, a second layer 56 is formed. The thickness of the second layer 56 is approximately 0.5 atomic layers. In the case of adding Mg to the second layer 56, for instance, bis(cyclopentadienyl)magnesium ($Cp_2Mg$) is added to the second gas. A second layer 56 including Si and Mg can be formed by supplying the second gas including e.g. silane, bis(cyclopentadienyl)magnesium, and ammonia.

Next, the substrate temperature is set to 1090° C. Then, first, TMG is supplied at a flow rate of 28 cc/min, and ammonia is supplied at a flow rate of 40 L/min, for 10 minutes. Thus, part of the second GaN layer 55 is united. The thickness of the third GaN layer 57 formed in 10 minutes is approximately 80 nm. Subsequently, the flow rate of TMG is increased to 56 cc/min, and the supply is performed for 60 minutes. Thus, the first GaN layer 53 and the second GaN layer 55 are united to form a flat third GaN layer 57. The thickness of the third GaN layer 57 is approximately 2 µm. In forming the third GaN layer 57, the TMG flow rate is made lower than that during the growth of the first GaN layer 53 and during the growth of the second GaN layer 55 in at least part of the third GaN layer 57. This facilitates decreasing the film thickness with which the third GaN layer 57 is made flat. The growth rate of the third GaN layer 57 is made slower than the growth rate of the first GaN layer 53 and the growth rate of the second GaN layer 55. This can decrease the film thickness with which the third GaN layer 57 is made flat. Thus, the warpage of the substrate 40 can be reduced.

Subsequently, a functional layer 10 is formed by supplying TMG at a flow rate of 56 cc/min, ammonia at a flow rate of 20 L/min, and silane ($SiH_4$) at a flow rate of 56 cc/min, for 30 minutes. Thus, an n-GaN layer (n-type GaN layer) having a Si concentration of $5.0 \times 10^{18}/cm^3$ is formed. The thickness of the functional layer 10 is approximately 1 µm. The n-type GaN layer constitutes an n-type semiconductor layer 11 (at least part of the functional layer 10). Thus, a nitride semiconductor element or nitride semiconductor wafer according to this embodiment can be formed.

In the above formation, growth conditions other than those changed are similar to the conditions in the preceding step. In condition change for forming a particular layer, while supplying ammonia gas, the supply of the group III gas and silane is stopped to interrupt the growth of the nitride semiconductor.

FIGS. 6A to 6D illustrate SEM images in which a cross section cleaved at the (1-100) plane of the nitride semiconductor layer is observed.

FIG. 6A illustrates a cross-sectional SEM image of the nitride semiconductor element 120 of the first practical example.

As shown in FIG. 6A, the first GaN layer 53 includes an unevenness having a surface (first slope 53s) inclined with respect to the plane (X-Y plane) perpendicular to the stacking direction (Z-axis direction). The first GaN layer 53 includes island-like crystals discontinuous in the plane (X-Y plane) perpendicular to the stacking direction (Z-axis direction).

The first layer 54 is in contact with the first GaN layer 53. Part of the first layer 54 is in contact with the third layer 52. The second GaN layer 55 is formed on the first GaN layer 53. The second GaN layer 55 includes an unevenness having a surface (second slope 55s) inclined with respect to the plane (X-Y plane) perpendicular to the stacking direction (Z-axis direction). The size of the second GaN layer 55 is smaller than the size of the first GaN layer 53. In this example, the second GaN layer 55 is formed on the first top surface 53t and the first slope 53s of the first GaN layer 53.

The second layer 56 is in contact with the second GaN layer 55. Part of the second layer is in contact with the first layer 54. The spacing between the first GaN layers 53 is as small as approximately 100 nm. It is found that the first GaN layer 53 is formed at high density. Formation of the first GaN layer 53 at high density can increase the effect of reducing dislocations by increasing the area of the first slope 53s even in a crystal with low height. Because the height can be made low, the tensile stress (strain) occurring in the unification of island-like first GaN layers 53 can be reduced. Thus, a flat GaN layer can be formed in the state in which the compressive stress (strain) formed in the first GaN layer 53 is maintained. The warpage of the substrate 40 can be reduced.

Reference examples are described below.

First Reference Example

Figure 5B:
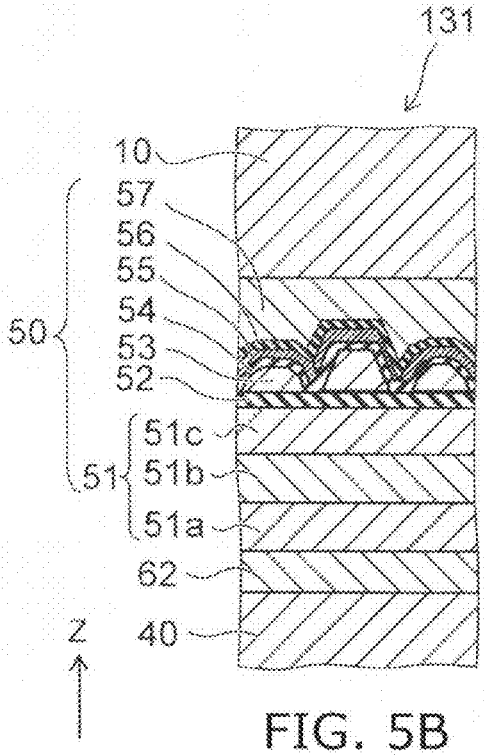

FIG. 5B is a schematic sectional view showing a nitride semiconductor element 131 of a first reference example.

In the nitride semiconductor element 131 of the first reference example, the second GaN layer 55 is formed as a continuous film on the first layer 54. That is, in the nitride semiconductor element 131 of the first reference example, the second GaN layer 55 includes no island-like crystal.

In the first reference example, the supply of silane is stopped when forming the first GaN layer 53. In addition, when forming the second GaN layer 55, the substrate temperature is set to 1090° C., and the supply of silane is stopped. TMG is supplied at a flow rate of 112 cc/min, and ammonia is supplied at a flow rate of 40 L/min, for 2.5 minutes. That is, a step similar to the step of forming the first GaN layer 53 is performed again in forming the second GaN layer 55. The other conditions are the same as those for the nitride semiconductor element 120.

FIG. 6B illustrates a cross-sectional SEM image of the nitride semiconductor element 131 of the first reference example.

As seen from FIG. 6B, the second GaN layer 55 is formed as a continuous film on the first layer 54, and includes no island-like crystal. Thus, in the case of repeating a step similar to the formation of the first GaN layer 53, no island-like crystal is formed. In this case, the first GaN layer 53 is likely to expand in a geometrically similar manner.

Second Reference Example

Figure 5C:
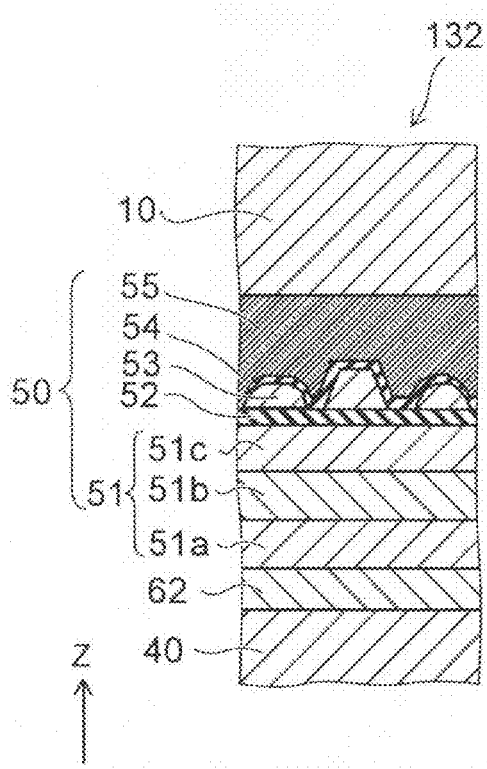

FIG. 5C is a schematic sectional view showing a nitride semiconductor element 132 of a second reference example.

In the nitride semiconductor element 132 of the second reference example, the second GaN layer 55 and the second layer 56 are not provided.

FIG. 6C illustrates a cross-sectional SEM image of the nitride semiconductor element 132 of the second reference example.

Third Reference Example

Figure 5D:
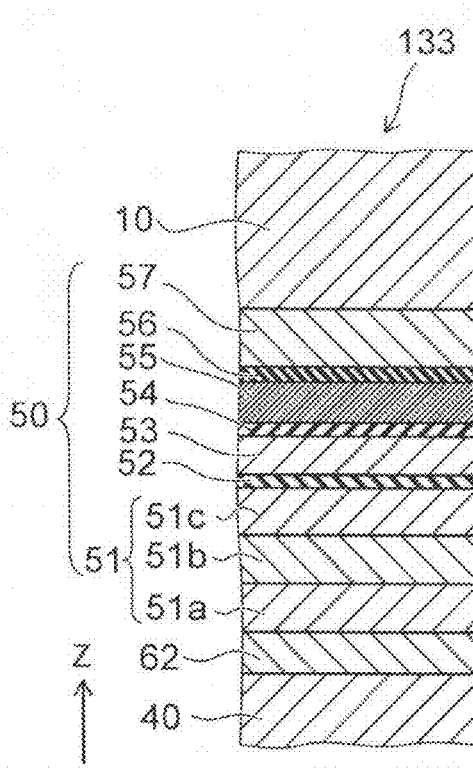

FIG. 5D is a schematic sectional view showing a nitride semiconductor element 133 of a third reference example.

In the nitride semiconductor element 133 of the third reference example, the first GaN layer 53 and the second GaN layer 55 have no surface inclined with respect to the plane (X-Y plane) perpendicular to the stacking direction (Z-axis direction). The first GaN layer 53 and the second GaN layer 55 are flat layers.

In the third reference example, the supply of silane is stopped when forming the first GaN layer 53. TMG is supplied at a flow rate of 56 cc/min, and ammonia is supplied at a flow rate of 40 L/min, for 15 minutes. Subsequently, the step of forming the first GaN layer 53 and the first layer 54 is repeated twice. The other conditions are the same as those for the nitride semiconductor element 120.

FIG. 6D illustrates a cross-sectional SEM image of the nitride semiconductor element 133 of the third reference example.

As seen from FIG. 6D, the first GaN layer 53 and the second GaN layer 55 are flat. The thickness of the first GaN layer 53 is approximately 600 nm. The thickness of the second GaN layer 55 is approximately 600 nm.

FIGS. 7A to 7C illustrate cross-sectional TEM images of the nitride semiconductor element 132 illustrated in the second reference example.

FIG. 7A is a cross-sectional TEM image of the region from the substrate 40 to the functional layer 10. FIG. 7B is a cross-sectional TEM image enlarging a region similar to the region including a first slope 53s in the first GaN layer 53 (the region RN1 shown in FIG. 7A). FIG. 7C is a cross-sectional TEM image enlarging a region similar to the region including a plane (first top surface 53t) perpendicular to the stacking direction in the first GaN layer 53 (the region RN2 shown in FIG. 7A). Black lines shown in FIGS. 7A to 7C represent dislocations. In FIG. 7A, the first layer 54 is drawn by a dotted line.

As seen from FIG. 7A, dislocations 20 generated at the interface between the substrate 40 and the AlN buffer layer 62 are significantly reduced in the third layer 52. Part of the dislocations 20 penetrating through the third layer 52 and propagating toward the functional layer 10 are bent inside the first GaN layer 53. This suppresses propagation in the stacking direction. The reason for this is as follows. The first GaN layer 53 formed on the monocrystalline AlGaN layer 51 grows three-dimensionally under a compressive stress (strain). Furthermore, the third layer 52 emphasizes selective growth.

The first layer 54 is formed on the first GaN layer 53 shaped like islands grown three-dimensionally. Part of the first layer 54 is in contact with the third layer 52. Propagation of most of the dislocations 20 generated from the AlN buffer layer 62 is blocked in the region in which the first layer 54 is in contact with the third layer 52. This significantly reduces the dislocation density of the third GaN layer 57.

As seen from FIG. 7B, the first layer 54 is formed in contact with the first slope 53s of the first GaN layer 53. Accordingly, the dislocation 20 propagating toward the functional layer 10 is blocked by the first layer 54. Thus, dislocations 20 are likely to decrease in the first layer 54 formed in contact with the first slope 53s. For instance, the first GaN layer 53 includes a plurality of first dislocations 21 connected to the first slope 53s in the protrusion 53c. The number of dislocations 20 continuing with the first dislocations 21 through the first layer 54 and located in the second GaN layer 55 is smaller than the number of the plurality of first dislocations 21.

On the other hand, as shown in FIG. 7C, in the case of the first layer 54 formed on the major surface (first top surface 53t) perpendicular to the stacking direction, no change is observed in the propagation of the dislocation 20. The dislocation 20 is directly propagated toward the functional layer 10.

FIGS. 8A and 8B illustrate a nitride semiconductor element according to the first embodiment.

FIG. 8A is a cross-sectional TEM image of the nitride semiconductor element 110 and the nitride semiconductor wafer 210. FIG. 8B is a schematic view depicted based on FIG. 8A. FIG. 8B schematically depicts the configuration of the third layer 52, the first GaN layer 53, the first layer 54, the second GaN layer 55, the second layer 56, and the third GaN layer 57 included in the stacked body 50. The shape of the third layer 52, the shape of the first layer 54, and the shape of the second layer 56 are drawn by solid lines. Dislocations 20 in the region above the third layer 52 are schematically drawn by dotted lines.

As seen from FIGS. 8A and 8B, the first layer 54 is formed in contact with the first slope 53s of the first GaN layer 53. Accordingly, dislocations 20 propagating toward the functional layer 10 are bent or blocked in the first layer 54. The change in the propagation of dislocations 20 is small in the region of the first layer 54 formed on the major surface (first top surface 53t) perpendicular to the stacking direction. The dislocations 20 are propagated into the second GaN layer 55. Part of the dislocations 20 propagated into the second GaN layer 55 are blocked by bending of dislocations in the second GaN layer 55 and bending of dislocations in the second layer 56. This blocks the propagation of dislocations 20 toward the functional layer 10.

The bending of dislocations in the second GaN layer 55 occurs due to e.g. the three-dimensional growth of the second GaN layer 55 caused by the first layer 54. The decrease of dislocations in the second layer 56 is likely to occur at the second slope 55s of the second GaN layer 55 as in the first layer 54 described above. For instance, the second GaN layer 55 includes a plurality of second dislocations 22 connected to the second slope 55s in the protrusion 55c. The number of dislocations 20 continuing with the second dislocations 22 through the second layer 56 and located in the third GaN layer 57 is smaller than the number of the plurality of second dislocations 22.

Thus, island-like crystals having a smaller size than the first GaN layer 53 constituting the second GaN layer 55 (and the second layer 56) are formed on the island-like crystals constituting the first GaN layer 53 and the first layer 54. This can significantly reduce dislocations 20.

Figure 9:
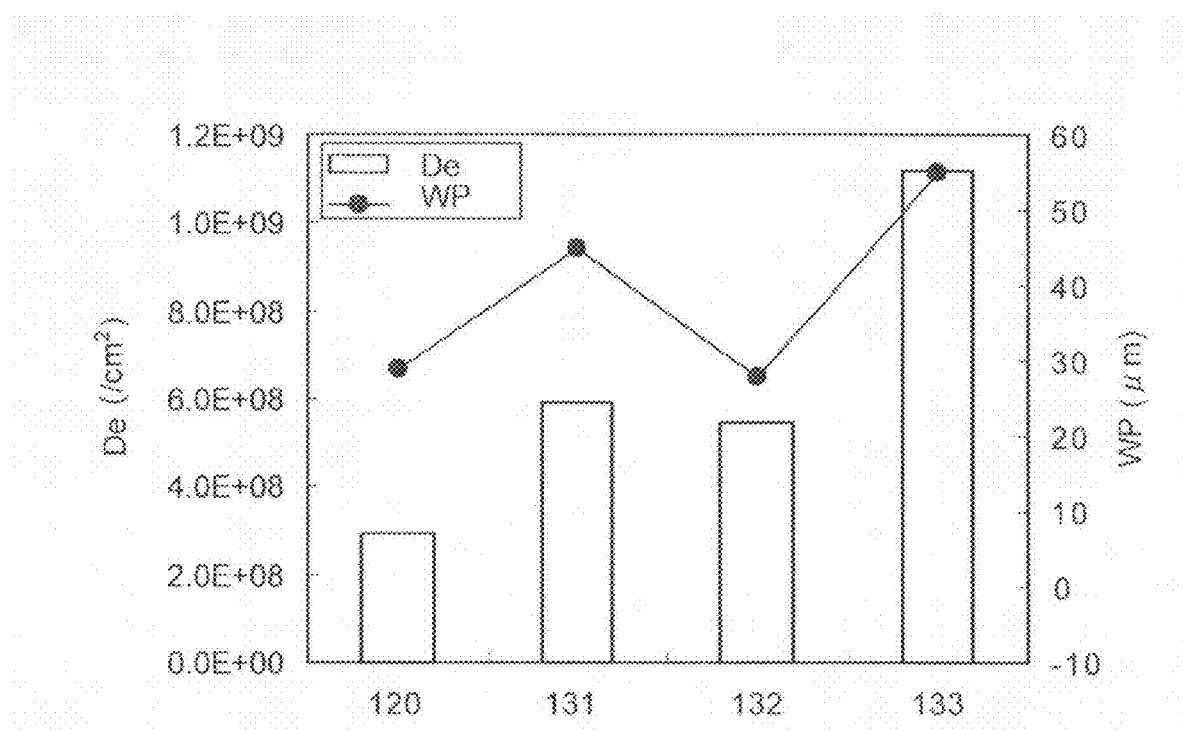
FIG. 9 is a graph illustrating the characteristics of the nitride semiconductor element according to the first embodiment.

FIG. 9 is a graph illustrating the characteristics of the nitride semiconductor element according to the first embodiment. FIG. 9 is a graph showing edge dislocation density De and substrate warpage WP in the nitride semiconductor element according to the first embodiment. The edge dislocation density De is derived from the rocking curve half width of the (0002) plane, (0004) plane, (10-11) plane, and (20-22) plane in X-ray diffractometry. The substrate warpage WP is derived by measuring the warpage of the substrate 40 (silicon substrate) with a warp gauge.

The edge dislocation density De of the nitride semiconductor element 120 of the first practical example is $2.9 \times 10^8/\text{cm}^2$. This is lower than the edge dislocation density De of the nitride semiconductor elements 131, 132, 133 of the first to third reference examples. The warpage WP of the substrate 40 of the nitride semiconductor element 120 of the first practical example is 29 μm in a concave shape. This is a relatively small amount of warpage. No crack occurs in the nitride semiconductor element 120 of the first practical example.

The edge dislocation density De of the nitride semiconductor element 131 of the first reference example is $5.9 \times 10^8/\text{cm}^2$. This is higher than the edge dislocation density De of the nitride semiconductor element 120 of the first practical example. The warpage WP of the substrate 40 of the nitride semiconductor element 131 of the first reference example is 45 μm in a concave shape. This is a larger amount of warpage than the warpage WP of the nitride semiconductor element 120 of the first practical example. Cracks are formed in the nitride semiconductor element 131 of the first reference example.

The edge dislocation density De is high in the first reference example. The reason for this is considered as follows. In the first reference example, the second GaN layer 55 is formed like a layer. Thus, there is no bending or blocking of dislocations at the slope of the island-like crystal. The edge dislocation density De of the nitride semiconductor element 131 of the first reference example is comparable to the edge dislocation density De of the nitride semiconductor element 132 of the second reference example described below. It can be said that the effect of reducing dislocations is scarcely achieved simply by expanding the first GaN layer 53 in a similar shape.

The edge dislocation density De of the nitride semiconductor element 132 of the second reference example is $5.5 \times 10^8/\text{cm}^2$. This is higher than the edge dislocation density De of the nitride semiconductor element 120 of the first practical example. The warpage WP of the substrate 40 of the nitride semiconductor element 132 of the second reference example is 28 μm in a concave shape. This is a relatively small amount of warpage. No crack occurs in the nitride semiconductor element 132 of the second reference example. The edge dislocation density De is approximately twice the value of the first practical example. Thus, it is found that dislocations can be reduced to approximately 50% by forming a second GaN layer 55 like islands and forming a second layer 56 in contact with the first slope 53s.

The edge dislocation density De of the nitride semiconductor element 133 of the third reference example is $1.1 \times 10^9/\text{cm}^2$. This is higher than the edge dislocation density De of the nitride semiconductor element 120 of the first practical example. The warpage of the substrate 40 of the nitride semiconductor element 133 of the third reference example is 55 μm in a concave shape. This is a larger amount of warpage than the warpage WP of the nitride semiconductor element 131 of the first reference example. Cracks are formed in the nitride semiconductor element 133 of the third reference example.

The edge dislocation density De is high in the third reference example. The reason for this is considered as follows. In the third reference example, the first GaN layer 53 and the second GaN layer 55 are not formed like islands. Thus, the effect of bending dislocations is weak.

Thus, for instance, the third layer 52 is provided in contact with the AlGaN layer 51 at least partly including monocrystals. Accordingly, the first GaN layer 53 grows three-dimensionally. Thus, dislocations generated in the buffer layer 60 are bent in the direction parallel to the stacking direction (Z-axis direction). This can reduce dislocations reaching the functional layer 10. In the region in which the growth of the first GaN layer 53 is hampered by the third layer 52, dislocations generated in the AlN buffer layer 62 are blocked by the third layer 52. This hampers upward propagation of dislocations. Thus, the dislocations can be reduced.

The first layer 54 is formed in contact with the first slope 53s of the first GaN layer 53. Thus, for instance, the dislocation 20 propagating toward the functional layer 10 is bent or blocked by the first layer 54. As a result, dislocations reaching the functional layer 10 can be significantly reduced.

The second GaN layer 55 is formed like islands on the first GaN layer 53. Furthermore, the second layer 56 is formed in contact with the second GaN layer 55. This can bend e.g. dislocations penetrating through the first GaN layer 53 and the first layer 54. Thus, dislocations can be significantly reduced.

Next, examples of the effect of the shape of the first GaN layer 53 are described.

Figure 10:
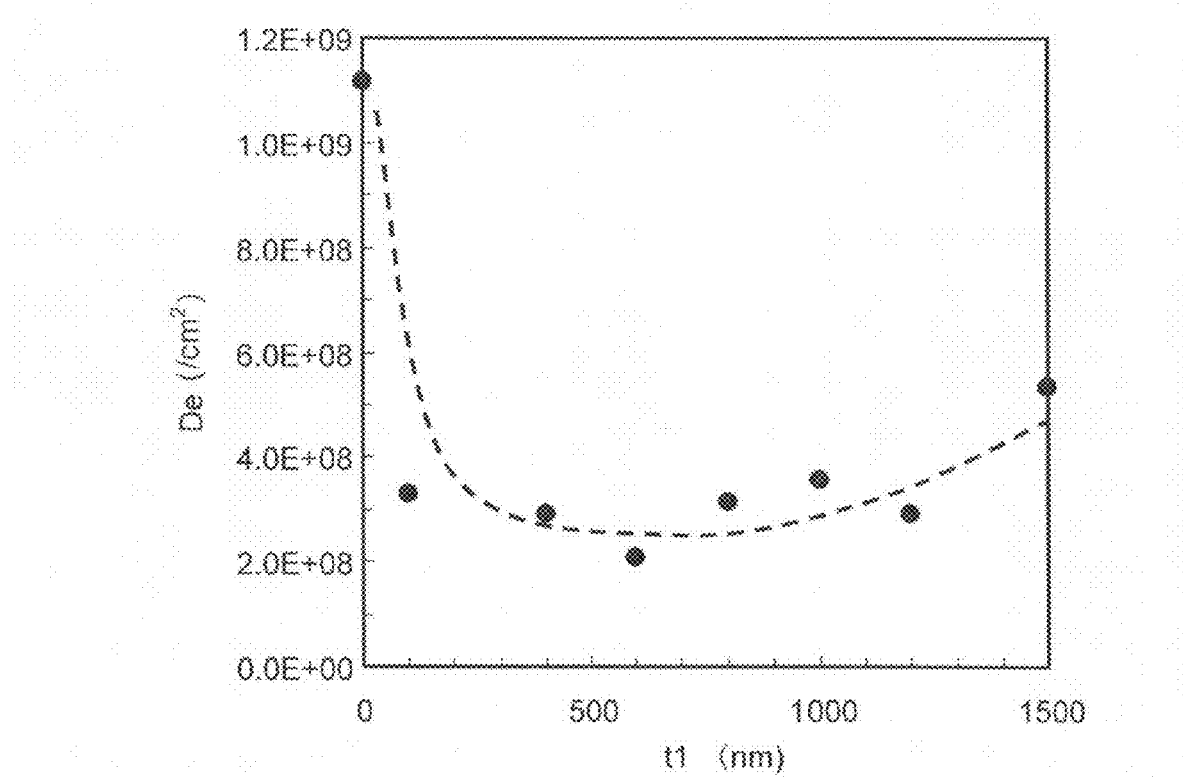
FIG. 10 is a graph illustrating the characteristics of the nitride semiconductor element according to the first embodiment.

FIG. 10 is a graph illustrating the characteristics of the nitride semiconductor element according to the first embodiment. FIG. 10 shows the edge dislocation density De of the nitride semiconductor element 120 changed with the height (thickness) t1 of the first GaN layer 53. The horizontal axis of FIG. 10 represents the height (thickness) t1 of the first GaN layer 53. The height is plotted as the height (thickness) of the largest protrusion (island) in the uneven shape observed in the cross-sectional SEM image. The height (thickness) t1 of the first GaN layer 53 is changed by the thickness (growth time TM) of the third layer 52, the growth temperature GT of the first GaN layer 53, the growth rate GR of the first GaN layer 53, or the ammonia supply amount (V/III ratio) of the first GaN layer 53. Specifically, the height (thickness) of the first GaN layer 53 is increased by thickening the thickness (lengthening the growth time TM) of the third layer 52, lowering the growth temperature GT of the first GaN layer 53, accelerating the growth rate GR of the first GaN layer 53, or decreasing the ammonia supply amount (V/III ratio) of the first GaN layer 53.

As shown in FIG. 10, it is found that in the case where the first GaN layer 53 is flat (corresponding to the height t1 equal to 0 nm), the edge dislocation density De decreases if a first GaN layer 53 having a height (thickness) of 100-1200 nm is formed. The edge dislocation density De tends to increase if the height (thickness) t1 is lower (thinner) than 100 nm or higher (thicker) than 1200 nm.

In the case where the height (thickness) t1 is lower than 100 nm, formation of the first slope 53s is insufficient as illustrated in FIG. 2A. Thus, the flat surface (first top surface 53t) perpendicular to the stacking direction occupies a large proportion in the crystal surface. Accordingly, it is considered that the effect of blocking dislocations in the first layer 54 is not sufficiently achieved. The volume (surface area) of the crystal of the first GaN layer 53 is small. Thus, the propagation direction of dislocations is not changed in the crystal. It is considered that this decreases the effect of reducing dislocations in the first GaN layer 53.

On the other hand, in the case where the height (thickness) t1 is higher than 1200 nm, adjacent crystals of the first GaN layer 53 are likely to unite, decreasing the region in which the third layer 52 is in contact with the first layer 54. It is considered that this decreases the effect of blocking dislocations generated in the AlN buffer layer 62 and increases the edge dislocation density De.

In the case of forming an unevenness with a height (thickness) t1 higher (thicker) than 1200 nm, pits were formed at the surface of the third GaN layer 57. In this practical example, the thickness of the third GaN layer 57 is 2 µm. Thus, it is considered difficult to flatten the islands of the first GaN layer 53 having a thickness of half or more of the thickness of the third GaN layer 57. That is, the thickness of the third GaN layer 57 for obtaining a flat third GaN layer 57 is approximately twice the height (thickness) t1 of the first GaN layer 53. The optimal height t1 is not limited to 1200 nm, but is preferably half or less of the film thickness of the third GaN layer 57. Here, "flat" means that 90% or more of the area is formed by the crystal surface parallel to the major surface.

Thus, it is found that the edge dislocation density De decreases in the case where the height (thickness) t1 of the first GaN layer 53 is 100 nm or more and 1200 nm or less. More preferably, the height (thickness) t1 of the first GaN layer 53 is 300 nm or more and half or less of the thickness of the third GaN layer 57. Half the thickness of the third GaN layer 57 is 1000 nm in this practical example.

Next, examples of the effect of the thickness of the third layer 52 are described.

Figure 11A:
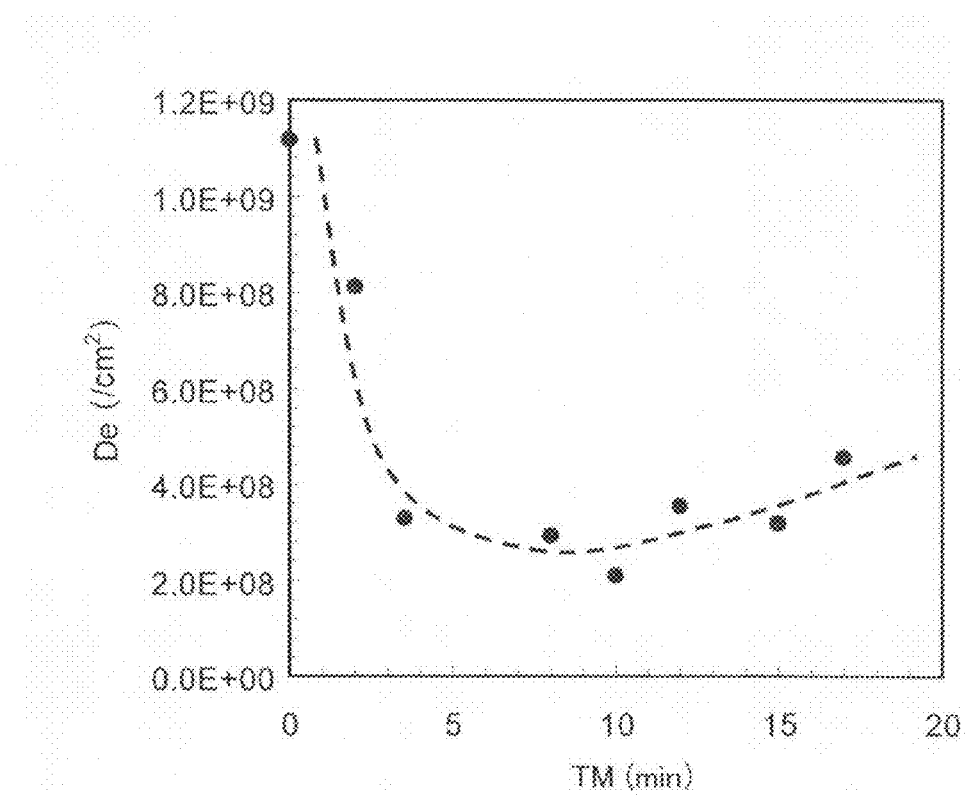
FIGS. 11A and 11B are graphs illustrating the characteristics of the nitride semiconductor element according to the first embodiment.
Figure 11B:
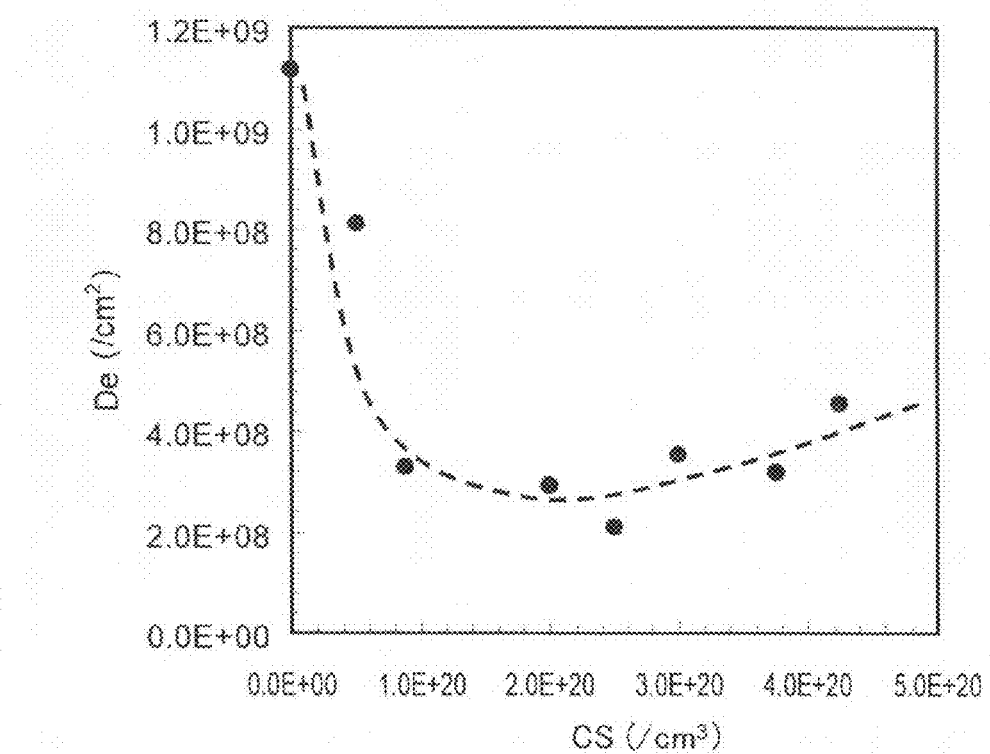

FIGS. 11A and 11B are graphs illustrating the characteristics of the nitride semiconductor element according to the first embodiment.

FIG. 11A shows the edge dislocation density De of the nitride semiconductor element 120 changed with the growth time (thickness) TM of the third layer 52. The horizontal axis of FIG. 11A represents the growth time TM of the third layer 52, corresponding to the thickness of the third layer 52.

As shown in FIG. 11A, it is found that the edge dislocation density De tends to decrease in the case where the growth time TM of the third layer 52 is 3 minutes or more and 17 minutes or less. In the case where the growth time TM is shorter than 3 minutes, island-like crystals are less likely to grow. Thus, the first GaN layer 53 becomes a crystal like a layer. An unevenness partly provided with pits was formed in the first GaN layer 53. In this case, formation of the first slope 53s is insufficient as illustrated in FIG. 2A. Thus, the flat surface (first top surface 53t) perpendicular to the stacking direction occupies a large proportion in the crystal surface. Accordingly, it is considered that the effect of blocking dislocations in the first layer 54 is not sufficiently achieved, and the dislocation density is increased. On the other hand, in the case where the growth time TM is longer than 17 minutes, the height of the first GaN layer 53 is approximately 1300 nm. Thus, a flat third GaN layer 57 cannot be obtained. Pits were formed at the surface of the third GaN layer 57. That is, the first GaN layer 53 having a height of half or more of the thickness of the third GaN layer 57 is formed. It is thus considered that the edge dislocation density De is likely to increase.

In this example, the growth time TM of the third layer 52 being 8 minutes corresponds to 1 atomic layer. That is, the edge dislocation density De decreases in the case where the thickness of the third layer 52 is 0.4 atomic layers or more and 2.1 atomic layers or less. The edge dislocation density De increases in the case where the thickness of the third layer 52 is thinner than 0.4 atomic layers. It is considered that this is because three-dimensional growth of the first GaN layer 53 does not occur, and the effect of reducing dislocations is not achieved. On the other hand, the edge dislocation density De increases in the case where the thickness of the third layer 52 is thicker than 2.1 atomic layers. It is considered that this is because the density of island-like crystals of the first GaN layer 53 is low, and the flatness of the third GaN layer 57 formed thereon is decreased.

FIG. 11B shows the edge dislocation density De of the nitride semiconductor element 120 changed with the Si concentration CS in the third layer 52.

As described above with reference to FIG. 1A, the thickness of the third layer 52 can be estimated by direct observation using a transmission electron microscope (TEM) image or secondary ion-microprobe mass spectrometry (SIMS). In SIMS analysis, in the case where the Si concentration in the layer is approximately $2 \times 10^{20}/cm^3$, the thickness of the third layer 52 corresponds to 1 atomic layer. In terms of surface density, this Si concentration corresponds to a Si sheet density of approximately $1 \times 10^{15}/cm^2$.

In the case of SIMS analysis, the Si concentration may be observed as being spread in the thickness (depth) direction depending on the measurement condition such as sputter rate. In this case, for instance, for the maximal (maximum) value of the Si concentration in the region corresponding to the first layer 54, the second layer 56, and the third layer 52, the sum of the Si concentration in the region in which the Si concentration decreases to the value of 10% (the integral value of Si atoms in the thickness direction) can be regarded as the number of Si atoms per unit area (Si sheet density) included in the first layer 54, the second layer 56, and the third layer 52, respectively.

The thickness of each of the first layer 54, the second layer 56, and the third layer 52 can be estimated using this sum of the Si concentration (Si sheet density). That is, the thickness can be estimated as the thickness of a GaN layer replacing Si in the case where Si atoms in each of the first layer 54, the second layer 56, and the third layer 52 are uniformly replaced by Ga atoms (group III atoms) in the GaN layer.

In this description, the thickness of the first layer 54, the second layer 56, and the third layer 52 is called 1 atomic layer in the case where the number of Si atoms in the first layer 54, the second layer 56, and the third layer 52, respectively, is the number of replacing Ga atoms corresponding to one GaN layer.

For instance, the surface density of Ga atoms (group III atoms) at the (0001) plane in the GaN layer is approximately $1 \times 10^{15}/cm^2$. Thus, the thickness of the first layer 54 and the second layer 56 corresponds to 1 atomic layer in the case where the surface density of Si in the film is approximately $1 \times 10^{15}/cm^2$.

In SIMS analysis, for instance, the peak value of the Si concentration is $2 \times 10^{20}/cm^3$ with a spread having a width of 200 nm. In terms of surface density, this corresponds to a Si sheet density of approximately $1 \times 10^{15}/cm^2$.

That is, the Si concentration in the layer being approximately $2 \times 10^{20}/cm^3$ corresponds to the thickness of each of the first layer 54, the second layer 56, and the third layer 52 being 1 atomic layer. Thus, "the dislocation density decreases in the case where the thickness of the third layer 52 is 0.4 atomic layers or more and 2.1 atomic layers or less" corresponds to "the dislocation density decreases in the case where the Si concentration in the third layer 52 is $7.0 \times 10^{19}/cm^3$ or more and $4.5 \times 10^{20}/cm^3$ or less". In this case, the dislocation density decreases. Thus, the dislocation density decreases in the case where the Si sheet density in the layer is $3.5 \times 10^{14}/cm^2$ or more and $2.3 \times 10^{15}/cm^2$ or less.

Thus, it can be said that the edge dislocation density De tends to decrease in the case where the Si concentration in the third layer 52 is $7.0 \times 10^{19}/cm^3$ or more and $4.5 \times 10^{20}/cm^3$ or less. It can be said that the edge dislocation density De tends to decrease in the case where the Si sheet density in the layer is $3.5 \times 10^{14}/cm^2$ or more and $2.3 \times 10^{15}/cm^2$ or less.

Figure 12B:
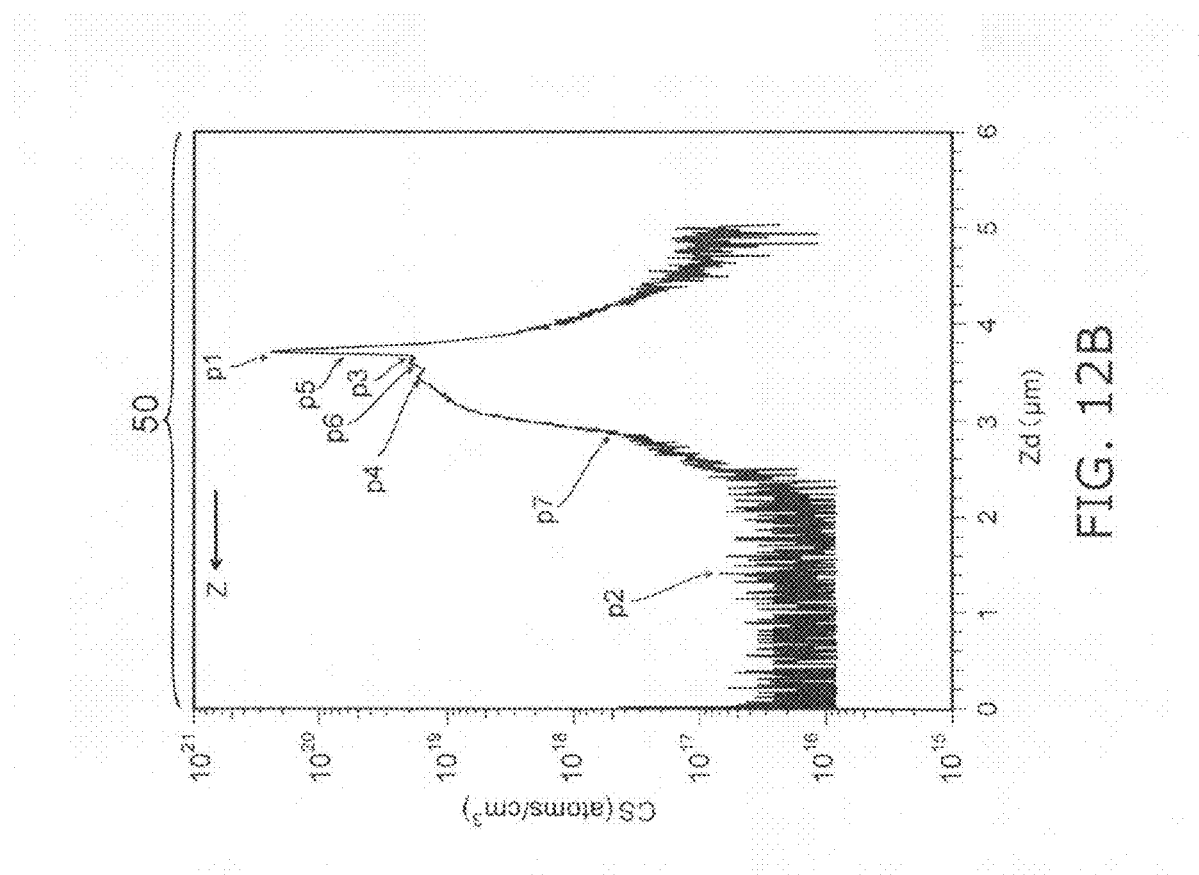
FIGS. 12A and 12B are graphs illustrating the nitride semiconductor element according to the first embodiment.
Figure 12A:
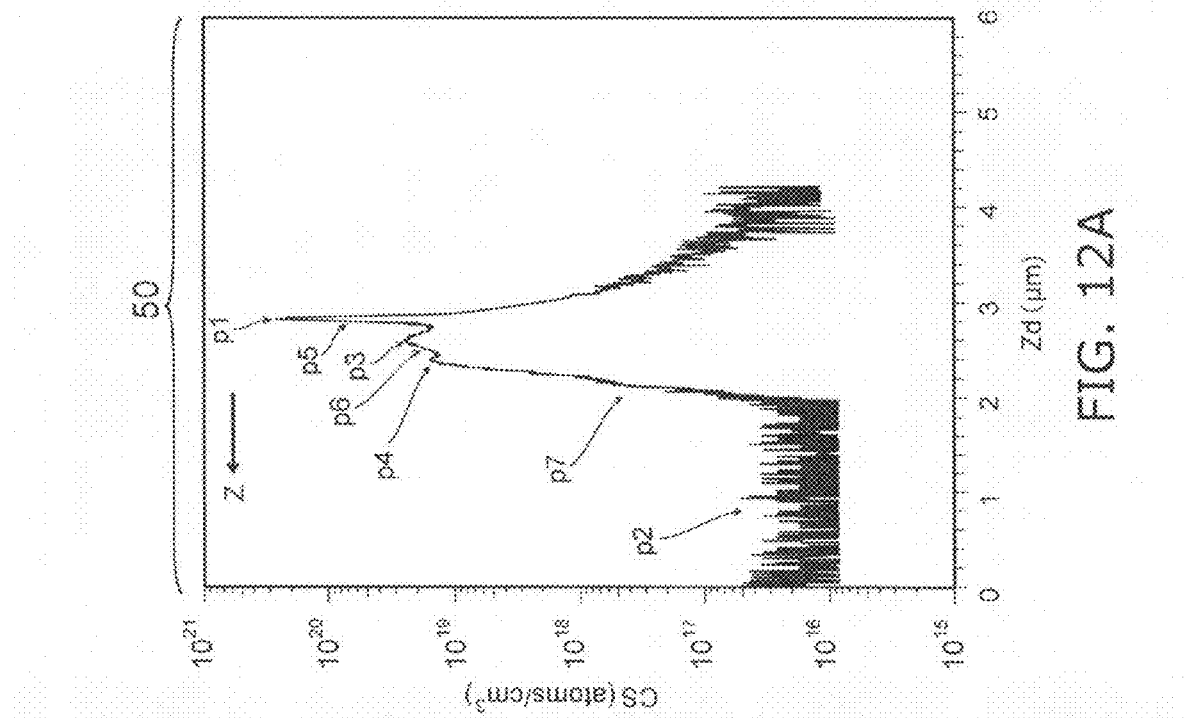

FIGS. 12A and 12B are graphs illustrating the nitride semiconductor element according to the first embodiment.

FIGS. 12A and 12B show an example of the SIMS analysis result of the nitride semiconductor element 110 (i.e., nitride semiconductor wafer 210) according to this embodiment. In this example, measurement is performed with a spacing of 5 nm along the depth direction (stacking direction). The horizontal axis of FIGS. 12A and 12B represents depth Zd (corresponding to the position in the Z-axis direction). The vertical axis of FIGS. 12A and 12B represents Si concentration CS (atoms/cm$^3$).

In the example of FIG. 12A, the growth time TM of the third layer 52 is 8 minutes. This condition corresponds to the condition of the Si sheet density in the third layer 52 being $1.0 \times 10^{15}/cm^2$. The growth time of the first layer 54 is 3 minutes. This condition corresponds to the condition of the Si sheet density in the first layer 54 being $3.8 \times 10^{14}/cm^2$. The growth time of the second layer 56 is 3 minutes. This condition corresponds to the condition of the Si sheet density in the second layer 56 being $3.8 \times 10^{14}/cm^2$.

In the example of FIG. 12B, the growth time TM of the third layer 52 is 10 minutes. This condition corresponds to the condition of the Si sheet density in the third layer 52 being $1.2 \times 10^{15}/cm^2$. The other conditions are the same as those of the example of FIG. 12A.

As seen from FIG. 12A, three stages of Si peaks are observed in the range of the stacked body 50. For instance, the Si concentration profile in the stacked body 50 includes first to seventh portions p1-p7. The first to seventh portions p1-p7 are stacked along the Z-axis direction.

The first portion p1 has a first Si concentration. The first Si concentration is $7.0 \times 10^{19}/cm^3$ or more and $4.5 \times 10^{20}/cm^3$ or less.

The second portion p2 is provided above the first portion p1. That is, the second portion p2 is provided between the first portion p1 and the functional layer 10. The second portion p2 has a second Si concentration. The second Si concentration is lower than the first Si concentration. The second Si concentration is e.g. not more than $1 \times 10^{17}/cm^3$. The Si concentration is relatively constant in the second portion p2.

The third portion p3 is provided between the first portion p1 and the second portion p2. The third portion p3 has a third Si concentration. The third Si concentration lies between the first Si concentration and the second Si concentration. The third Si concentration is e.g. $3 \times 10^{18}/cm^3$ or more and $5 \times 10^{19}/cm^3$ or less. The Si concentration is relatively constant in the third portion p3.

The fourth portion p4 is provided between the third portion p3 and the second portion p2. The fourth portion p4 has a fourth Si concentration. The fourth Si concentration lies between the third Si concentration and the second Si concentration. The fourth Si concentration is e.g. $1 \times 10^{18}/cm^3$ or more and $3 \times 10^{19}/cm^3$ or less. The Si concentration is relatively constant in the fourth portion p4.

The fifth portion p5 is provided between the first portion p1 and the third portion p3. The rate of change of the Si concentration with respect to the thickness in the fifth portion p5 is higher than the rate of change of the Si concentration with respect to the thickness in the third portion p3. The Si concentration sharply changes in the fifth portion p5.

The sixth portion p6 is provided between the third portion p3 and the fourth portion p4. The rate of change of the Si concentration with respect to the thickness in the sixth portion p6 is higher than the rate of change of the Si concentration with respect to the thickness in the third portion p3. The rate of change of the Si concentration with respect to the thickness in the sixth portion p6 is higher than the rate of change of the Si concentration with respect to the thickness in the fourth portion p4. The Si concentration sharply changes in the sixth portion p6.

The seventh portion p7 is provided between the fourth portion p4 and the second portion p2. The rate of change of the Si concentration with respect to the thickness in the seventh portion p7 is higher than the rate of change of the Si concentration with respect to the thickness in the fourth portion p4. The rate of change of the Si concentration with respect to the thickness in the seventh portion p7 is higher than the rate of change of the Si concentration with respect to the thickness in the second portion p2.

The width (the width in the thickness direction) of the peak of the Si concentration is narrow in the first portion p1. The first portion p1 corresponds to the third layer 52.

In this example, the peak (maximum value) of the Si concentration in the first portion p1 is $2.6\times10^{20}/cm^3$. The width of the peak at which the Si concentration decreases to the value of 10% of the peak value is approximately 120 nm. The total Si concentration of this region (the integral value of the Si concentration in the thickness direction) is $1.1\times10^{15}/cm^2$. This corresponds to the Si sheet density of the third layer 52.

The thickness (width) of the first portion p1 is e.g. 1 nm or more and 200 nm or less. If the thickness of the first portion p1 is thinner than 1 nm, three-dimensional growth of the first GaN layer 53 does not sufficiently occur. In the case where the thickness of the first portion p1 is thicker than 200 nm, the growth of the first GaN layer 53 is hampered. This decreases the area of the slope. Thus, the effect of reducing the dislocation density is not sufficiently achieved.

The fifth portion p5 corresponds to the first GaN layer 53. The third portion p3 corresponds to the first layer 54. The Si concentration in the first layer 54 is $2.5\times10^{19}/cm^3$. The Si concentration in at least part of the first GaN layer 53 is $1\times10^{17}/cm^3$ or more and $1\times10^{20}/cm^3$ or less. The first GaN layer 53 includes a protrusion 53c. The first layer 54 is provided on the protrusion 53c. The diameter (width) 53v (or 53w) of the protrusion 53c of the first GaN layer 53 is e.g. 50 nm or more and 1500 nm or less. In SIMS analysis, the analyzed area is larger than the size (area) of the protrusion. Thus, the Si concentration in SIMS analysis is detected as the average value in the range including a plurality of protrusions (the range of the second layer 56, the second GaN layer 55, the first layer 54, and the first GaN layer 53). For instance, in the case where the third GaN layer 57 is provided, the range of the third GaN layer 57 is included in the range including a plurality of protrusions. Thus, the Si concentration profile includes a spread in the thickness (depth) direction. Furthermore, the peak value is smaller than the actual Si concentration. This produces the profile of the fifth portion p5 and the third portion p3.

In this example, the peak of the Si concentration in the third portion p3 is approximately $2.5\times10^{19}/cm^3$. The width of the third portion p3 and the fifth portion p5 (corresponding to the width of the peak at which the Si concentration decreases to the value of 10% of the peak value) is approximately 200 nm. The total Si concentration of this region (the integral value of the Si concentration in the thickness direction) is $5.2\times10^{14}/cm^2$. This corresponds to the Si sheet density of the first layer 54.

The thickness (width) of the fifth portion p5 is e.g. 100 nm or more and 1200 nm or less. The thickness of the fifth portion p5 being thinner than 100 nm corresponds to the height of the first GaN layer 53 being 100 nm or less. In this case, formation of the first slope 53s is insufficient. This decreases the effect of reducing the dislocation density. The thickness of the fifth portion p5 being thicker than 1200 nm corresponds to the height of the first GaN layer 53 being 1200 nm or more. For instance, in the case where the third GaN layer 57 is provided, the flatness of the third GaN layer 57 is likely to decrease.

The sixth portion p6 corresponds to the second GaN layer 55. The fourth portion p4 corresponds to the second layer 56. In this example, the Si concentration in the second layer 56 is $1.5\times10^{19}/cm^3$. The Si concentration in at least part of the second GaN layer 55 is $1\times10^{17}/cm^3$ or more and $1\times10^{20}/cm^3$ or less. The second GaN layer 55 includes a protrusion 55c. The second layer 56 is provided on the protrusion 55c. The diameter (width) 55v (or 55w) of the protrusion of the second GaN layer 55 is e.g. 10 nm or more and 1000 nm or less. The size of the second GaN layer 55 is smaller than the size of the first GaN layer 53.

In this example, the peak of the Si concentration in the fourth portion p4 is approximately $1.5\times10^{19}/cm^3$. The width of each of the fourth portion p4 and the sixth portion p6 (corresponding to the width of the peak at which the Si concentration decreases to the value of 10% of the peak value) is approximately 220 nm. The total Si concentration of this region (the integral value of the Si concentration in the thickness direction) is $2.5\times10^{14}/cm^2$. This corresponds to the Si sheet density of the second layer 56.

For instance, the seventh portion p7 and the second portion p2 correspond to the third GaN layer 57. For instance, it is considered that Si diffuses from at least one of the third layer 52, the first layer 54, and the second layer 56 into part (lower part) of the third GaN layer 57. It is considered that this Si diffusion region corresponds to the seventh portion p7.

The thickness of the seventh portion p7 is e.g. 10 nm or more and 2500 nm or less. In the case where the thickness of the seventh portion p7 is thinner than 10 nm, the effect of bending or blocking dislocations in the first layer 54 and the second layer 56 is not sufficiently achieved. In the case where the thickness of the seventh portion p7 is thicker than 2500 nm, the flatness of the third GaN layer 57 is likely to decrease.

For instance, in SIMS analysis, the existence of the third layer 52 can be determined by the existence of the first portion p1. The existence of the first layer 54 can be determined by the existence of the third portion p3. The existence of the second layer 56 can be determined by the existence of the fourth portion p4.

As seen from FIG. 12B, three stages of Si peaks are observed also in the range of the stacked body 50 of this example. For instance, the Si concentration profile in the stacked body 50 of the example shown in FIG. 12B is similar to that of the example of FIG. 12A.

The first portion p1 has a first concentration. The first concentration is a Si concentration being $7.0\times10^{19}/cm^3$ or more and $4.5\times10^{20}/cm^3$ or less. The second portion p2 has a second concentration. The second concentration is a Si concentration being e.g. less than $1\times10^{17}/cm^3$. The third portion p3 has a third concentration. The third concentration is a Si concentration being e.g. $3\times10^{18}/cm^3$ or more and $5\times10^{19}/cm^3$ or less. The fourth portion p4 has a fourth concentration being e.g. $1\times10^{18}/cm^3$ or more and $3\times10^{19}/cm^3$ or less.

As in the example of FIG. 12A, for instance, in SIMS analysis, the existence of the third layer 52 can be determined by the existence of the first portion p1. The existence of the first layer 54 can be determined by the existence of the third portion p3. The existence of the second layer 56 can be determined by the existence of the fourth portion p4.

FIGS. 13A to 13D show the nitride semiconductor element according to the embodiment.

Figure 13A:
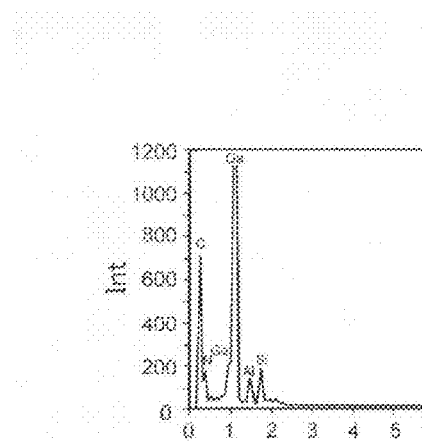
FIGS. 13A to 13D show the nitride semiconductor element according to the embodiment.
Figure 13B:
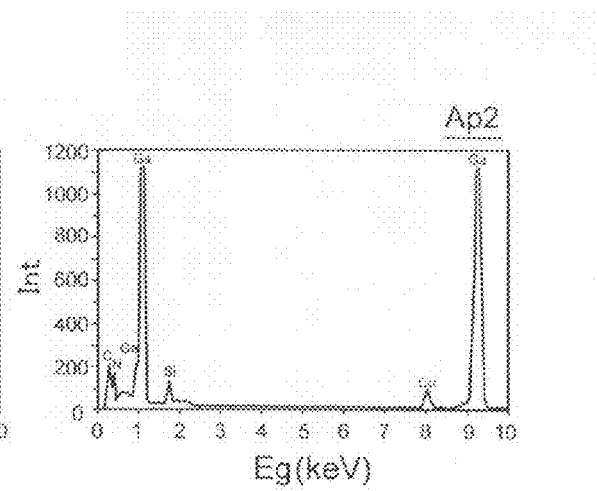
Figure 13C:
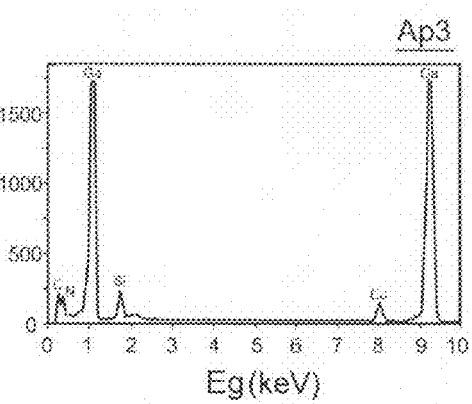
Figure 13D:
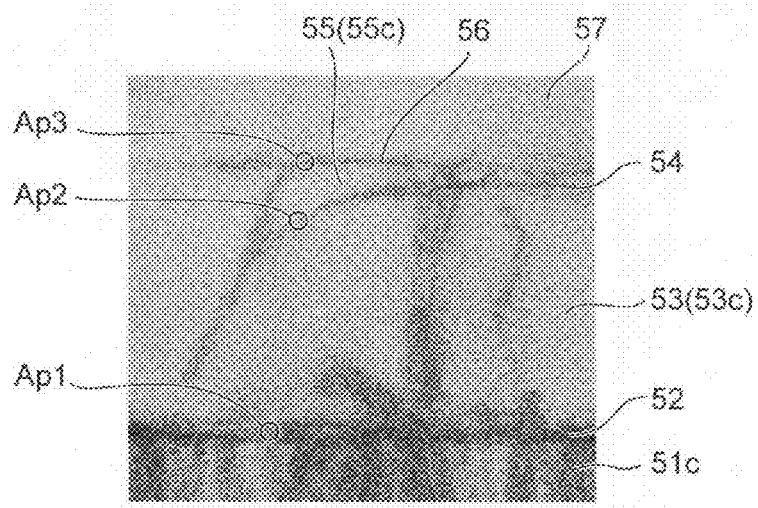

FIGS. 13A to 13C are graphs showing examples of the result of energy dispersive X-ray spectrometry (EDS analysis) of the nitride semiconductor element 110 (i.e., nitride semiconductor wafer 210) according to the embodiment. FIG. 13D shows locations analyzed in the EDS analysis. In FIG. 13D, a first analysis position Ap1, a second analysis position Ap2, and a third analysis position Ap3 are shown as the locations of the EDS analysis on the cross-sectional TEM image. The first analysis position Ap1 corresponds to the position of the third layer 52. The second analysis position Ap2 corresponds to the position of the first layer 54. The third analysis position Ap3 corresponds to the position of the second layer 56.

FIG. 13A shows the analysis result of the first analysis position Ap1. FIG. 13B shows the analysis result of the second analysis position Ap2. FIG. 13C shows the analysis result of the third analysis position Ap3. The horizontal axis of FIGS. 13A to 13C represents energy Eg (keV: kiloelectron volts). The vertical axis of FIGS. 13A to 13C represents intensity Int (counts). The detection limit of Si in this EDS analysis is 1000 ppm.

In this example, the growth time TM of the third layer 52 is 8 minutes. This condition corresponds to the condition of the Si sheet density in the third layer 52 being $1.0\times10^{15}/cm^2$. The growth time of the first layer 54 is 3 minutes. This condition corresponds to the condition of the Si sheet density in the first layer 54 being $3.8\times10^{14}/cm^2$. The growth time TM of the second layer 56 is 3 minutes. This condition corresponds to the condition of the Si sheet density in the second layer 56 being $3.8\times10^{14}/cm^2$.

As seen from FIGS. 13A to 13C, in this embodiment, Si is detected from the third layer 52, the first layer 54, and the second layer 56. The Si concentration in the third layer 52 is estimated at approximately 4.6 atomic %. The Si concentration in the first layer 54 is estimated at approximately 3.9 atomic %. The Si concentration in the second layer 56 is estimated at approximately 4.2 atomic %. Thus, in this embodiment, the Si concentration in each of the first layer 54, the second layer 56, and the third layer 52 is higher than or equal to the detection limit (1000 ppm). A significant effect of reducing dislocations is achieved by setting the Si concentration in each of the first layer 54, the second layer 56, and the third layer 52 to 1000 ppm or more.

In the nitride semiconductor element and the nitride semiconductor wafer according to this embodiment, dislocations 20 in the protrusion of the first GaN layer 53 decrease in the first layer 54 provided on the slope (first slope 53s) of the protrusion. The dislocations 20 in the protrusion of the first GaN layer 53 further decreases in the second GaN layer 55 provided on the protrusion of the first GaN layer 53 and having a smaller size than the first GaN layer 53. Furthermore, as described above, in this embodiment, the Si concentration in each of the first layer 54, the second layer 56, and the third layer 52 is sufficiently higher than the detection limit. The Si concentration in the third layer 52 is e.g. $7.0\times10^{19}/cm^3$ or more and $4.5\times10^{20}/cm^3$ or less. The Si concentration in the first layer 54 is e.g. $1.0\times10^{17}/cm^3$ or more and $1.0\times10^{20}/cm^3$ or less. The Si concentration in the second layer 56 is e.g. $1.0\times10^{17}/cm^3$ or more and $1.0\times10^{20}/cm^3$ or less.

Second Embodiment

This embodiment relates to a nitride semiconductor element.

FIGS. 14A to 14D illustrate a nitride semiconductor element and a nitride semiconductor wafer according to the second embodiment.

FIG. 14A is a schematic sectional view. FIG. 14B is a graph illustrating the Al composition ratio ($C_{Al}$) in the stacked intermediate layer. FIG. 14C is a graph illustrating the growth temperature GT (formation temperature) in the stacked intermediate layer. FIG. 14D is a graph illustrating the a-axis lattice spacing Ld in the stacked intermediate layer.

In FIGS. 14B, 14C, and 14D, the vertical axis represents position in the Z-axis direction. The horizontal axis of FIG. 14B represents the Al composition ratio $C_{Al}$. As shown in FIG. 14B, in the stacked intermediate layer 70, the Al composition ratio $C_{Al}$ is substantially 0 in the first GaN intermediate layer 71a and the second GaN intermediate layer 71b. The Al composition ratio $C_{Al}$ is substantially 1 in the first AlN intermediate layer 72a and the second AlN intermediate layer 72b. The Al composition ratio $C_{Al}$ is higher than 0 and lower than 1 in the first AlGaN intermediate layer 73a and the second AlGaN intermediate layer 73b.

As shown in FIG. 14A, the nitride semiconductor element 130 and the nitride semiconductor wafer 230 according to this embodiment include a buffer layer 60, a stacked intermediate layer 70, a stacked body 50, and a functional layer 10. Each of the buffer layer 60, the stacked body 50, and the functional layer 10 can be based on the configuration described with reference to the first embodiment. In the following, the stacked intermediate layer 70 is described.

The buffer layer 60 includes an AlGaN buffer layer 61. The AlGaN buffer layer 61 has characteristics similar to those of the AlGaN layer 51 in the aforementioned stacked body 50. The formation condition and the like of the AlGaN buffer layer 61 are similar to those described with reference to the AlGaN layer 51.

The stacked intermediate layer 70 includes a first intermediate layer 70a and a second intermediate layer 70b. The first intermediate layer 70a includes a first GaN intermediate layer 71a, a first AlN intermediate layer 72a, and a first AlGaN intermediate layer 73a. The second intermediate layer 70b includes a second GaN intermediate layer 71b, a second AlN intermediate layer 72b, and a second AlGaN intermediate layer 73b. In this practical example, the configuration including a GaN intermediate layer 71, an AlN intermediate layer 72, and an AlGaN intermediate layer 73 is stacked twice repetitively. The number of repetitions is not limited to two, but may be three or more. The stacked intermediate layer 70 may include only the first intermediate layer 70a.

As shown in FIG. 14D, in the stacked intermediate layer 70 of the embodiment, the a-axis lattice spacing Ld (the lattice spacing in the direction perpendicular to the stacking direction (Z-axis direction)) is maximized in the GaN intermediate layer 71 and sharply decreased in the AlN intermediate layer 72.

That is, the first GaN intermediate layer 71a having a larger lattice constant than the AlGaN buffer layer 61 is formed on the AlGaN buffer layer 61. The formation temperature (substrate temperature) of the first GaN intermediate layer 71a is e.g. approximately 1090° C., being higher than the formation temperature of the AlGaN buffer layer 61. The formation temperature of the first GaN intermediate layer 71a higher than the formation temperature of the AlGaN buffer layer 61 facilitates accumulating a compressive strain (stress) in the first GaN intermediate layer 71a. The thickness of the first GaN intermediate layer 71a is preferably e.g. 100 nm or more and 2000 nm or less, such as approximately 300 nm. In the initial phase of growth, the first GaN intermediate layer 71a is formed so as to be lattice matched with the lattice constant of the AlGaN buffer layer 61, and grows under a compressive strain (stress). Then, the strain (stress) is gradually relaxed with the growth of GaN. Thus, the lattice spacing of GaN approaches the lattice constant of unstrained GaN.

The first AlN intermediate layer 72a is formed on the first GaN intermediate layer 71a. The thickness of the first AlN intermediate layer 72a is preferably e.g. 5 nm or more and 100 nm or less, such as approximately 12 nm. As shown in FIG. 14C, the crystal growth temperature (substrate temperature) of the first AlN intermediate layer 72a is preferably e.g. 500° C. or more and 1050° C. or less, being lower than the temperature of the first GaN intermediate layer 71a. The formation temperature (substrate temperature) of the first AlN intermediate layer 72a is e.g. 800° C. At least part of the first AlN intermediate layer 72a is monocrystalline. This facilitates lattice relaxation of the first AlN intermediate layer 72a. Thus, from the initial phase of the formation of the first AlN intermediate layer 72a, the first AlN intermediate layer 72a is less likely to be subjected to the tensile strain (stress) from the underlying first GaN intermediate layer 71a. As a result, the first AlN intermediate layer 72a can be formed so as to reduce the influence of the strain (stress) from the underlying first GaN intermediate layer 71a. Thus, the first AlN intermediate layer 72a subjected to lattice relaxation is formed on the first GaN intermediate layer 71a.

Next, the first AlGaN intermediate layer 73a is formed on the first AlN intermediate layer 72a. The Al composition ratio Cm of the first AlGaN intermediate layer 73a is lower than the Al composition ratio $C_{Al}$ of the first AlN intermediate layer 72a. In the state of thin thickness, i.e., in the initial phase of growth, AlGaN is formed so as to be lattice matched with the lattice spacing of AlN, and grows under a compressive strain. Then, the strain is gradually relaxed with the growth of AlGaN. Thus, the lattice spacing of AlGaN approaches the lattice spacing of unstrained $Al_xGa_{1-x}N$ (0<x<1).

The formation temperature (substrate temperature) of the first AlGaN intermediate layer 73a is e.g. higher than the formation temperature (substrate temperature) of the first AlN intermediate layer 72a and the formation temperature (substrate temperature) of the first GaN intermediate layer 71a. By the formation temperature of the first AlGaN intermediate layer 73a being higher than the formation temperature of the first AlN intermediate layer 72a and the formation temperature of the first GaN intermediate layer 71a, relaxation of the first AlGaN intermediate layer 73a is made difficult. The formation temperature (substrate temperature) of the first AlGaN intermediate layer 73a is e.g. approximately 1120° C. The Al composition ratio of the first AlGaN intermediate layer 73a is made lower than or equal to the relaxation factor α of the first AlN intermediate layer 72a.

If the Al composition ratio of the first AlGaN intermediate layer 73a is larger than the relaxation factor α of the first AlN intermediate layer 72a, a tensile strain (stress) occurs in the first AlGaN intermediate layer 73a. Thus, cracks are likely to occur. Accordingly, lattice relaxation occurs, and dislocations are likely to increase.

The relaxation factor α is a value defined as the ratio of the difference between the lattice spacing dg along the first axis (e.g., a-axis) of unstrained GaN and the actual lattice spacing Da along the first axis (e.g., a-axis) of the first AlN intermediate layer 72a versus the absolute value of the difference between the lattice spacing dg along the first axis (e.g., a-axis) of unstrained GaN and the lattice spacing da along the first axis (e.g., a-axis) of unstrained AlN. The first axis is one axis perpendicular to the stacking direction (Z-axis direction).

The thickness of the first AlGaN intermediate layer 73a is preferably e.g. 5 nm or more and 100 nm or less. If the thickness of the first AlGaN intermediate layer 73a is thinner than 5 nm, the effect of reducing dislocations is difficult to achieve. If the thickness of the first AlGaN intermediate layer 73a is thicker than 100 nm, the effect of reducing dislocations is saturated. Furthermore, cracks are likely to occur. More preferably, the thickness of the first AlGaN intermediate layer 73a is less than 50 nm. By the thickness of the first AlGaN intermediate layer 73a being less than 50 nm, dislocations can be effectively reduced. The thickness of the second AlGaN intermediate layer 73b is e.g. approximately 25 nm.

If the formation temperature (substrate temperature) of the first AlGaN intermediate layer 73a is higher than the formation temperature (substrate temperature) of the first AlN intermediate layer 72a by 80° C. or more, a greater effect of growing so as to be lattice matched with the lattice constant of AlN is achieved. A greater effect of reducing dislocations is achieved. The formation temperature of the first AlGaN intermediate layer 73a is e.g. approximately 1120° C.

Next, the second GaN intermediate layer 71b is formed on the first AlGaN intermediate layer 73a. Furthermore, the second AlN intermediate layer 72b is formed on the second GaN intermediate layer 71b. Furthermore, the second AlGaN intermediate layer 73b is formed on the second AlN intermediate layer 72b. The second GaN intermediate layer 71b, the second AlN intermediate layer 72b, and the second AlGaN intermediate layer 73b can be configured similarly to the first GaN intermediate layer 71a, the first AlN intermediate layer 72a, and the first AlGaN intermediate layer 73a described above, and thus the description thereof is omitted.

In this practical example, the second AlGaN intermediate layer 73b is used as the AlGaN layer 51 in the stacked body 50. Thus, in the case where the stacked intermediate layer 70 is provided, the AlGaN intermediate layer 73 nearest to the functional layer 10 can be used as the AlGaN layer 51 in the stacked body 50.

Next, the characteristics of a nitride semiconductor element of a second practical example according to this embodiment are described.

In the nitride semiconductor element 130, the components other than the stacked intermediate layer 70 are similar to those of the nitride semiconductor element of the first practical example described above, and thus the description thereof is omitted. The stacked intermediate layer 70 of the nitride semiconductor element 130 is fabricated as follows.

An AlN buffer layer 62 is formed. The substrate temperature is set to 1020° C. Trimethylgallium (TMGa) is supplied at a flow rate of 10 cc/min, TMAl is supplied at a flow rate of 50 cc/min, and ammonia is supplied at a flow rate of 2.5 L/min, for 8 minutes. Thus, a first AlGaN buffer layer 61a having an Al composition ratio of 0.55 is formed. The thickness of the first AlGaN buffer layer 61a is approximately 100 nm. Subsequently, the flow rate of TMG is changed to 17 cc/min, the flow rate of TMA is changed to 30 cc/min, and the supply is performed for 10 minutes. Thus, a second AlGaN buffer layer 61b having an Al composition ratio of 0.3 is formed. The thickness of the second AlGaN buffer layer 61b is approximately 200 nm. Furthermore, the flow rate of TMG is changed to 20 cc/min, the flow rate of TMA is changed to 15 cc/min, and the supply is performed for 11 minutes. Thus, a third AlGaN buffer layer 61c having an Al composition ratio of 0.15 is formed. The thickness of the third AlGaN buffer layer 61c is approximately 250 nm.

Next, the substrate temperature is set to 1090° C. TMG is supplied at a flow rate of 56 cc/min, and ammonia is supplied at a flow rate of 40 L/min, for 15 minutes. Thus, a first GaN intermediate layer 71a is formed. The thickness of the first GaN intermediate layer 71a is approximately 300 nm.

Next, the substrate temperature is set to 800° C. TMA is supplied at a flow rate of 17 cc/min, and ammonia is supplied at a flow rate of 10 L/min, for 3 minutes. Thus, a first AlN intermediate layer 72a is formed. The thickness of the first AlN intermediate layer 72a is approximately 12 nm.

Next, the substrate temperature is set to 1120° C. TMGa is supplied at a flow rate of 18 cc/min, TMAl is supplied at a flow rate of 6 cc/min, and ammonia is supplied at a flow rate of 2.5 L/min, for 2.5 minutes. Thus, a first AlGaN intermediate layer 73a having an Al composition ratio of 0.5 is formed. The thickness of the first AlGaN intermediate layer 73a is approximately 25 nm.

Next, the substrate temperature is set to 1090° C. TMG is supplied at a flow rate of 56 cc/min, and ammonia is supplied at a flow rate of 40 L/min, for 15 minutes. Thus, a second GaN intermediate layer 71b is formed. The thickness of the second GaN intermediate layer 71b is approximately 300 nm.

Next, the substrate temperature is set to 800° C. TMA is supplied at a flow rate of 17 cc/min, and ammonia is supplied at a flow rate of 10 L/min, for 3 minutes. Thus, a second AlN intermediate layer 72b is formed. The thickness of the second AlN intermediate layer 72b is approximately 12 nm.

Next, the substrate temperature is set to 1120° C. TMGa is supplied at a flow rate of 18 cc/min, TMAl is supplied at a flow rate of 6 cc/min, and ammonia is supplied at a flow rate of 2.5 L/min, for 2.5 minutes. Thus, a second AlGaN intermediate layer 73b having an Al composition ratio of 0.5 is formed. The thickness of the second AlGaN intermediate layer 73b is approximately 25 nm.

Thus, a stacked intermediate layer 70 is formed. A stacked body 50 and a functional layer 10 are formed on the stacked intermediate layer 70. The stacked body 50 and the functional layer 10 are formed under a condition similar to the condition described above with reference to the nitride semiconductor element 120.

The edge dislocation density De of the fabricated nitride semiconductor element 130 is evaluated to be as low as $2.1 \times 10^8/cm^2$. The edge dislocation density De of the nitride semiconductor element 120 is $2.9 \times 10^8/cm^2$. Thus, the dislocation density is reduced to approximately 70% by providing the stacked intermediate layer 70.

The warpage of the nitride semiconductor element 130 including the substrate 40 at room temperature is evaluated to be 10 μm in a convex shape. The warpage of the nitride semiconductor element 110 is 29 μm in a concave shape. Thus, the compressive stress formed inside the nitride semiconductor element is increased by providing the stacked intermediate layer 70. This further reduces warpage.

Thus, a nitride semiconductor element with low dislocation density is similarly obtained also by providing a stacked intermediate layer 70 between the buffer layer 60 and the stacked body 50.

Providing the stacked intermediate layer 70 can reduce the warpage of the nitride semiconductor element 130, and can suppress cracks.

Figure 15:
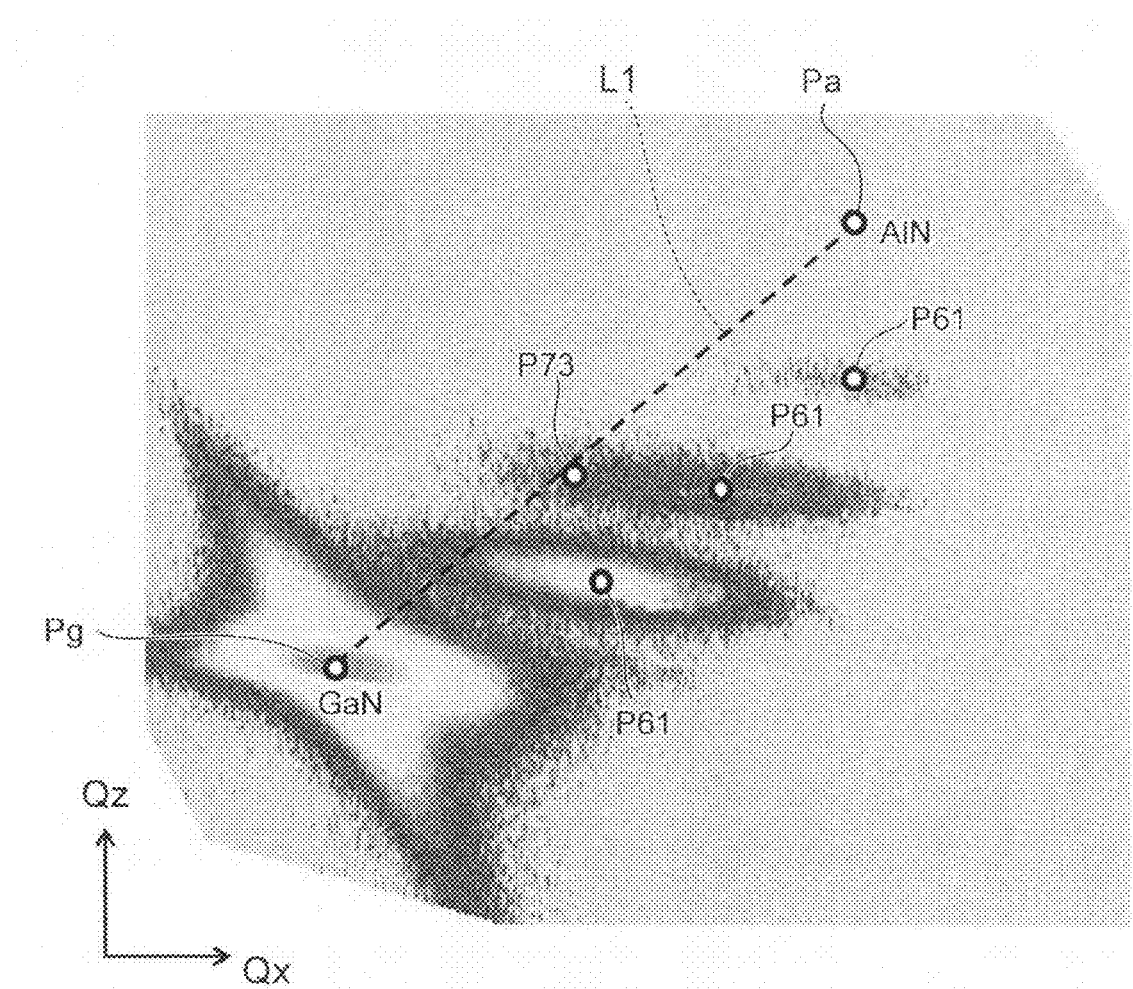
FIG. 15 is a graph illustrating the characteristics of the nitride semiconductor element according to the second embodiment.

FIG. 15 is a graph illustrating the characteristics of the nitride semiconductor element according to the second embodiment. FIG. 15 is an example of the image of the reciprocal lattice mapping of the (11-24) plane. The reciprocal lattice mapping is measured by X-ray diffractometry. The horizontal axis of FIG. 15 represents the inverse Qx of the lattice plane spacing of (11-20) planes in the direction perpendicular to the growth direction (stacking direction). The inverse Qx is a value proportional to the inverse of the a-axis lattice spacing. The vertical axis of FIG. 15 represents the inverse Qz of the lattice plane spacing of (0004) planes in the direction parallel to the growth direction (stacking direction). The inverse Qz is a value proportional to the inverse of the c-axis lattice spacing. FIG. 15 shows the point of the diffraction peak Pg of the (11-24) plane of GaN (corresponding to the inverse of the lattice spacing of GaN), and the point of the diffraction peak Pa of the (11-24) plane of AlN (corresponding to the inverse of the lattice spacing of the AlN buffer layer 62). The dotted line L1 connecting between the point of the diffraction peak Pg and the point of the diffraction peak Pa represents the characteristic of the inverse of the lattice spacing corresponding to the Al composition ratio of the AlGaN layer according to Vegard's law.

FIG. 15 shows the point P61 of the diffraction peak of the (11-24) plane corresponding to the AlGaN buffer layer 61 and the point P73 of the diffraction peak of the (11-24) plane corresponding to the AlGaN intermediate layer 73 (or the AlGaN layer 51 in the stacked body). The confirmation of peaks of the AlGaN buffer layer 61 and the AlGaN intermediate layer 73 indicates that the AlGaN buffer layer 61 and the AlGaN intermediate layer 73 are at least partly monocrystalline.

In FIG. 15, the occurrence of peaks (point P61 and point P73) of the measurement result of the lattice spacing of the AlGaN layers below the dotted line L1 corresponds to the crystal having a compressive strain (subjected to a compressive stress). The occurrence of peaks (point P61 and point P73) of the measurement result above the dotted line L1 corresponds to the crystal having a tensile strain (subjected to a tensile stress).

As seen from FIG. 15, the point P61 of the peak due to the AlGaN buffer layer 61 occurs below the dotted line L1. This indicates that the AlGaN buffer layer 61 has a compressive strain (is subjected to a compressive stress).

The stacked intermediate layer 70 and the stacked body 50 are formed on this AlGaN buffer layer 61. The compressive stress (strain) formed in the stacked intermediate layer 70 and the stacked body 50 is increased by forming the stacked intermediate layer 70 and the stacked body 50 on the AlGaN buffer layer 61. This reduces the tensile strain occurring in the temperature lowering process after crystal growth. Thus, the effect of suppressing cracks increases.

As shown in FIG. 15, in the case where the Al composition ratio z of the AlGaN intermediate layer 73 (or the AlGaN layer 51 in the stacked body) is 0.5, the peak occurs below the dotted line L1. This indicates that the AlGaN intermediate layer 73 (or the AlGaN layer 51 in the stacked body) has a compressive strain (is subjected to a compressive stress). Dislocations can be reduced by forming this AlGaN intermediate layer 73 (or the AlGaN layer 51 in the stacked body).

Thus, the stress (strain) of the AlGaN buffer layer 61, the AlGaN intermediate layer 73, and the AlGaN layer 51 in the stacked body can be evaluated by X-ray diffractometry.

Next, the lattice spacing perpendicular to the stacking direction of the first AlN intermediate layer 72a (corresponding to the a-axis lattice spacing in this example) is evaluated by X-ray diffractometry. As a result, the lattice spacing Da of the first AlN intermediate layer 72a is 0.3145 nm. This is a larger value than the lattice spacing da of unstrained AlN, 0.3112 nm. It is found that a compressive stress (strain) is formed in the first AlGaN intermediate layer 73a formed on the first AlN intermediate layer 72a. The a-axis lattice spacing dg of unstrained GaN is 0.3189 nm. Thus, the relaxation factor α of the first AlN intermediate layer 72a is equivalent to 0.57.

The relaxation factor α of the first AlN intermediate layer 72a is the ratio of the absolute value of the difference between the lattice spacing dg of unstrained GaN and the actual lattice spacing Da of the first AlN intermediate layer 72a versus the absolute value of the difference between the lattice spacing dg of unstrained GaN and the lattice spacing da of unstrained AlN. That is, the relaxation factor α of the first AlN intermediate layer 72a is |dg−Da|/|dg−da|. The lattice spacing dg of unstrained GaN corresponds to the lattice constant of GaN. The lattice spacing da of unstrained AlN corresponds to the lattice constant of AlN.

In this example, the Al composition ratio of the first AlGaN intermediate layer 73a is 0.5. This is smaller than the relaxation factor α of the first AlN intermediate layer 72a. Thus, a compressive stress (strain) is formed in the first AlGaN intermediate layer 73a.

On the other hand, for instance, if a first AlGaN intermediate layer 73a having an Al composition ratio of 0.7 is formed, cracks occur. Evaluation of this sample as in the foregoing indicates that a tensile stress (strain) is formed in the first AlGaN intermediate layer 73a. That is, although an AlGaN layer having a larger unstrained lattice spacing than AlN and having an Al composition ratio of 0.7 was formed on the AlN layer, a tensile stress (strain) was formed in the AlGaN layer. This is because the first AlGaN intermediate layer 73a is strained, and the actual lattice spacing is larger than the unstrained lattice spacing. Thus, a compressive stress (strain) can be formed in the AlGaN intermediate layer by forming an AlGaN intermediate layer having an Al composition ratio less than or equal to the relaxation factor α. Accordingly, a high-quality nitride semiconductor element with few cracks is obtained.

This nitride semiconductor element 130 can provide a high-grade nitride semiconductor element in which few dislocations are formed on the silicon substrate.

Figure 16:
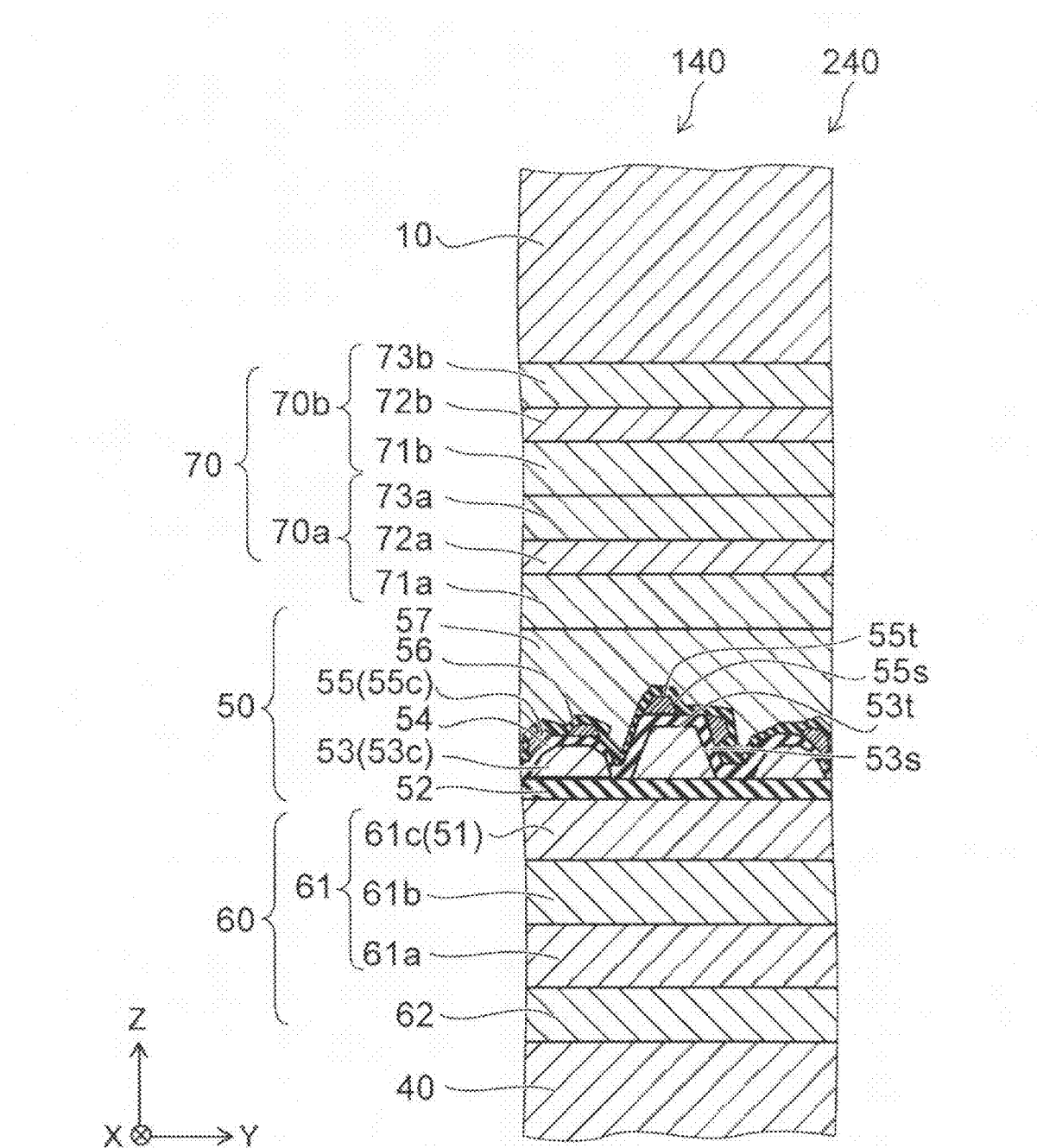
FIG. 16 is a schematic sectional view illustrating an alternative nitride semiconductor element and a nitride semiconductor wafer according to the embodiment.

FIG. 16 is a schematic sectional view illustrating an alternative nitride semiconductor element and a nitride semiconductor wafer according to the embodiment.

As shown in FIG. 16, the alternative nitride semiconductor element 140 according to the embodiment includes a buffer layer 60, a stacked body 50, a stacked intermediate layer 70, and a functional layer 10. The stacked body 50 is provided on the buffer layer 60. The stacked intermediate layer 70 is provided on the stacked body 50. The functional layer 10 is provided on the stacked intermediate layer 70. The nitride semiconductor wafer 240 according to this embodiment includes a substrate 40, a buffer layer 60, a stacked intermediate layer 70, and a stacked body 50. The nitride semiconductor wafer 240 may further include a functional layer 10. Each of the substrate 40, the buffer layer 60, the stacked body 50, the stacked intermediate layer 70, and the functional layer 10 can be based on the configuration described with reference to the nitride semiconductor element 130.

In this embodiment, the third AlGaN buffer layer 61c is used as the AlGaN layer 51 in the stacked body 50. Thus, in the case where the AlGaN buffer layer 61 is provided, the AlGaN buffer layer 61 nearest to the functional layer 10 can be used as the AlGaN layer 51 in the stacked body 50.

In the nitride semiconductor element 140 (and the nitride semiconductor wafer 240), the stacked intermediate layer 70 includes a first intermediate layer 70a and a second intermediate layer 70b. The second intermediate layer 70b is provided on the first intermediate layer 70a.

The first intermediate layer 70a includes a first GaN intermediate layer 71a, a first AlN intermediate layer 72a, and a first AlGaN intermediate layer 73a. The first AlN intermediate layer 72a is provided on the first GaN intermediate layer 71a. The first AlGaN intermediate layer 73a is provided on the first AlN intermediate layer 72a.

The second intermediate layer 70b includes a second GaN intermediate layer 71b, a second AlN intermediate layer 72b, and a second AlGaN intermediate layer 73b. The second GaN intermediate layer 71b is provided on the first AlGaN intermediate layer 73a. The second AlN intermediate layer 72b is provided on the second GaN intermediate layer 71b. The second AlGaN intermediate layer 73b is provided on the second AlN intermediate layer 72b.

The method for manufacturing the nitride semiconductor element 140 (and the nitride semiconductor wafer 240) can be based on the manufacturing method described with reference to the nitride semiconductor element 130 with appropriate modifications.

In the nitride semiconductor element 140 and the nitride semiconductor wafer 240, the edge dislocation density De exhibits a value as low as $2.5 \times 10^8/cm^2$.

The warpage at room temperature of the nitride semiconductor element 140 including the substrate 40 and the nitride semiconductor wafer 240 is convex. The magnitude of the warpage is 35 μm.

On the other hand, the warpage of the nitride semiconductor element 110 including the substrate 40 and the nitride semiconductor wafer 210 is concave. The magnitude of the warpage is 39 μm. The warpage of the nitride semiconductor element 130 including the substrate 40 and the nitride semiconductor wafer 230 is convex. The magnitude of the warpage is 10 μm.

In the nitride semiconductor element 140 and the nitride semiconductor wafer 240, the stacked intermediate layer 70 is provided on the stacked body 50. This increases the compressive stress (strain) formed inside the nitride semiconductor element. Thus, the effect of reducing cracks increases.

Figure 17A:
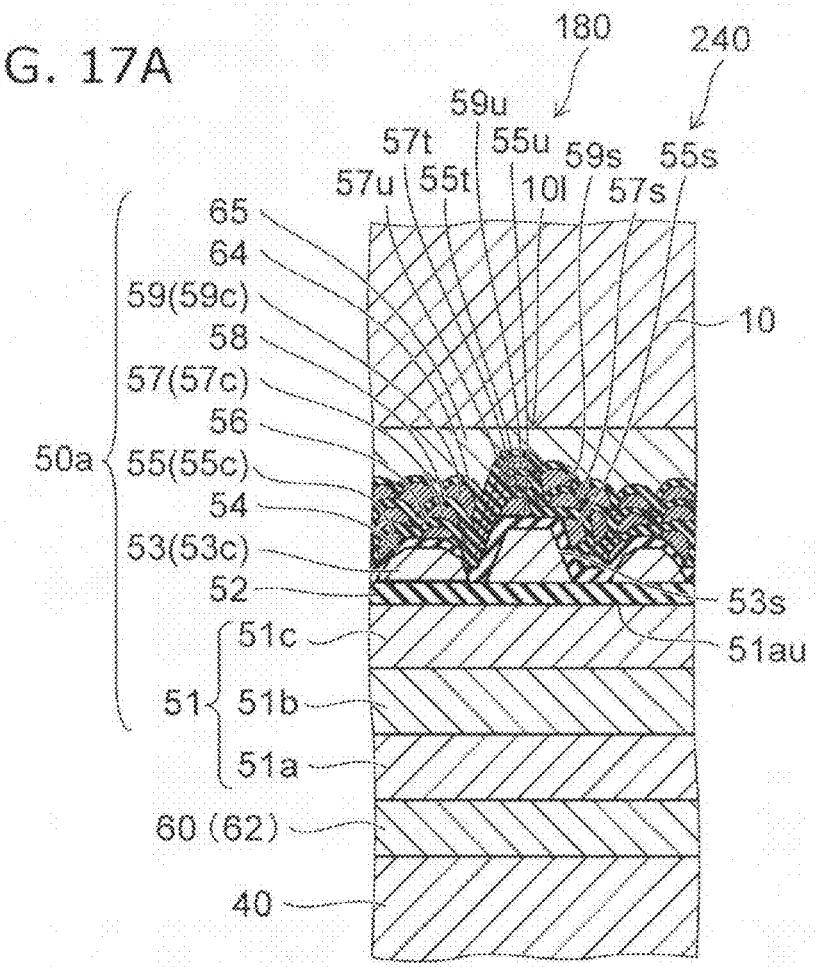
FIGS. 17A and 17B are schematic sectional views illustrating an alternative nitride semiconductor element and a nitride semiconductor wafer according to the embodiment.
Figure 17B:
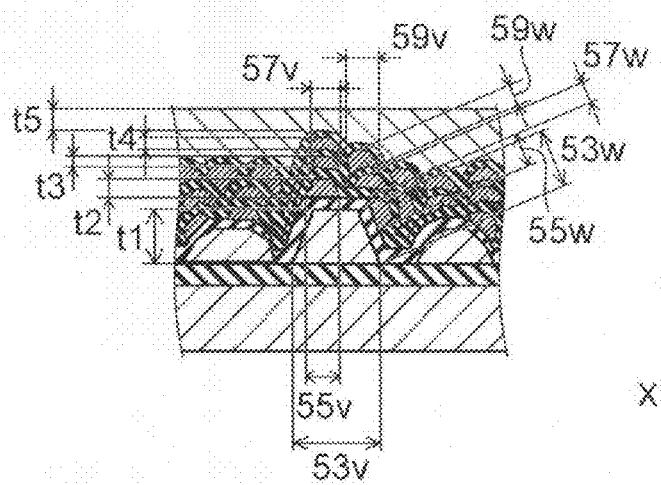

FIGS. 17A and 17B are schematic sectional views illustrating an alternative nitride semiconductor element and a nitride semiconductor wafer according to the embodiment.

FIG. 17B is a figure partly extracted from FIG. 17A.

As shown in FIG. 17A, the nitride semiconductor element 180 according to the embodiment includes a buffer layer 60, a stacked body 50a, and a functional layer 10. In addition to the stacked body 50 shown in FIG. 1A, the stacked body 50a further includes a fourth layer 58, a fourth GaN layer 59, a fifth layer 64, and a fifth GaN layer 65.

In the embodiment, the third GaN layer 57 is provided on the second layer 56. The fourth layer 58 is provided on the third GaN layer 57. The fourth GaN layer 59 is provided on the fourth layer 58. The fifth layer 64 is provided on the fourth GaN layer 59. The fifth layer 65 is provided on the fifth layer 64.

Each of the fourth layer 58 and the fifth layer 64 contains at least one of silicon (Si) and magnesium (Mg). Each of the fourth layer 58 and the fifth layer 64 may contain both Si and Mg. Each of the fourth layer 58 and the fifth layer 64 may include at least one of SiN and MgN. Each of the fourth layer 58 and the fifth layer 64 may include both SiN and MgN. Each of the fourth layer 58 and the fifth layer 64 may be a GaN layer doped with at least one of Si and Mg at high concentration (δ-doping layer). Each of the fourth layer 58 and the fifth layer 64 may be a GaN layer doped with both Si and Mg at high concentration (δ-doping layer).

As the element contained in each of the fourth layer 58 and the fifth layer 64, Si is more preferable because it does not compromise the conductivity of the n-type semiconductor layer 11 formed as part of the functional layer 10. In the following description, the case where each of the fourth layer 58 and the fifth layer 64 contains Si is taken as an example.

In the nitride semiconductor element 180 according to the embodiment, the third GaN layer 57 includes an island-like crystal including an unevenness having a surface (third slope 57s) inclined with respect to the plane (X-Y plane) perpendicular to the stacking direction (Z-axis direction). The surface (third slope 57s) inclined with respect to the plane (X-Y plane) perpendicular to the stacking direction (Z-axis direction) is e.g. a facet surface such as the (10-11) plane and (11-22) plane. The third slope 57s does not need to be a specific crystal surface. The third GaN layer 57 may be shaped like a dome. The third GaN layer 57 may have a plane perpendicular to the X-Y plane rather than the inclined surface.

For instance, the third GaN layer 57 is formed on the top surface (second top surface 55t) of the second GaN layer 55. For instance, the third GaN layer 57 is formed on the slope (second slope 55s) of the second GaN layer 55. In this description, the state in which "the third GaN layer 57 is provided on the second GaN layer 55" includes the state in which the third GaN layer 57 is provided on at least one of the top surface (second top surface 55t) of the second GaN layer 55 and the slope (second slope 55s) of the second GaN layer 55.

The height (thickness) t3 of the protrusion (third protrusion) 57c of the third GaN layer 57 is generally equal to the height t2 of the protrusion 55c of the second GaN layer 55. Alternatively, the height t3 of the protrusion 57c of the third GaN layer 57 is lower than the height t2 of the protrusion 55c of the second GaN layer 55. The definition of the height t3 of the protrusion 57c of the third GaN layer 57 can be based on the definition of the height t2 of the protrusion 55c of the second GaN layer 55.

As shown in FIGS. 17A and 17B, the length (width) 57v of the bottom 57u of the protrusion 57c of the third GaN layer 57 in the direction (first direction) parallel to the upper surface 51au of the AlGaN layer 51 is generally equal to the length (width) 55v of the bottom 55u of the protrusion 55c of the second GaN layer 55 in the first direction. Alternatively, the length (width) 57v of the bottom 57u of the protrusion 57c of the third GaN layer 57 in the first direction is shorter than the length (width) 55v of the bottom 55u of the protrusion 55c of the second GaN layer 55 in the first direction. The length 57w of the protrusion 57c of the third GaN layer 57 in one tangential direction (second direction) on the slope (second slope 55s) of the second GaN layer 55 is generally equal to the length 55w of the protrusion 55c of the second GaN layer 55 in the second direction. Alternatively, the length 57w of the protrusion 57c of the third GaN layer 57 in the second direction is shorter than the length 55w of the protrusion 55c of the second GaN layer 55 in the second direction.

In other words, the size of the protrusion 57c of the third GaN layer 57 is generally equal to the size of the protrusion 55c of the second GaN layer 55. Alternatively, the size of the protrusion 57c of the third GaN layer 57 is smaller than the size of the protrusion 55c of the second GaN layer 55.

On the plane (X-Y plane) perpendicular to the Z-axis direction (stacking direction), the number of third slopes 57s of the third GaN layer 57 per unit area is larger than the number of first slopes 53s of the first GaN layer 53 per unit area. On the plane (X-Y plane) perpendicular to the Z-axis direction (stacking direction), the number of third slopes 57s of the third GaN layer 57 per unit area is generally equal to the number of second slopes 55s of the second GaN layer 55 per unit area, or larger than the number of second slopes 55s of the second GaN layer 55 per unit area.

In this example, the third GaN layer 57 is shaped like an island discontinuous in the X-Y plane. Part of the fourth layer 58 is in contact with the third GaN layer 57. Another part of the fourth layer 58 is in contact with the second layer 56.

The fourth GaN layer 59 includes an island-like crystal including an unevenness having a surface (fourth slope 59s) inclined with respect to the plane (X-Y plane) perpendicular to the stacking direction (Z-axis direction). The surface (fourth slope 59s) inclined with respect to the plane (X-Y plane) perpendicular to the stacking direction (Z-axis direction) is e.g. a facet surface such as the (10-11) plane and (11-22) plane. The fourth slope 59s does not need to be a specific crystal surface. The fourth GaN layer 59 may be shaped like a dome. The fourth GaN layer 59 may have a plane perpendicular to the X-Y plane rather than the inclined surface.

For instance, the fourth GaN layer 59 is formed on the top surface (third top surface 57t) of the third GaN layer 57. For instance, the fourth GaN layer 59 is formed on the slope (third slope 57s) of the third GaN layer 57. In this description, the state in which "the fourth GaN layer 59 is provided on the third GaN layer 57" includes the state in which the fourth GaN layer 59 is provided on at least one of the top surface (third top surface 57t) of the third GaN layer 57 and the slope (third slope 57s) of the third GaN layer 57.

The height (thickness) t4 of the protrusion (fourth protrusion) 59c of the fourth GaN layer 59 is generally equal to the height t3 of the protrusion 57c of the third GaN layer 57. Alternatively, the height t4 of the protrusion 59c of the fourth GaN layer 59 is lower than the height t3 of the protrusion 57c of the third GaN layer 57. The definition of the height t4 of the protrusion 59c of the fourth GaN layer 59 can be based on the definition of the height t2 of the protrusion 55c of the second GaN layer 55.

As shown in FIGS. 17A and 17B, the length (width) 59v of the bottom 59u of the protrusion 59c of the fourth GaN layer 59 in the first direction is generally equal to the length (width) 55v of the bottom 55u of the protrusion 55c of the second GaN layer 55 in the first direction. Alternatively, the length (width) 59v of the bottom 59u of the protrusion 59c of the fourth GaN layer 59 in the first direction is shorter than the length (width) 55v of the bottom 55u of the protrusion 55c of the second GaN layer 55 in the first direction. The length 59w of the protrusion 59c of the fourth GaN layer 59 in the second direction is generally equal to the length 55w of the protrusion 55c of the second GaN layer 55 in the second direction. Alternatively, the length 59w of the protrusion 59c of the fourth GaN layer 59 in the second direction is shorter than the length 55w of the protrusion 55c of the second GaN layer 55 in the second direction.

In other words, the size of the protrusion 59c of the fourth GaN layer 59 is generally equal to the size of the protrusion 55c of the second GaN layer 55. Alternatively, the size of the protrusion 59c of the fourth GaN layer 59 is smaller than the size of the protrusion 55c of the second GaN layer 55.

On the plane (X-Y plane) perpendicular to the Z-axis direction (stacking direction), the number of fourth slopes 59s of the fourth GaN layer 59 per unit area is larger than the number of first slopes 53s of the first GaN layer 53 per unit area. On the plane (X-Y plane) perpendicular to the Z-axis direction (stacking direction), the number of fourth slopes 59s of the fourth GaN layer 59 per unit area is generally equal to the number of second slopes 55s of the second GaN layer 55 per unit area, or larger than the number of second slopes 55s of the second GaN layer 55 per unit area.

In this example, the fourth GaN layer 59 is shaped like an island discontinuous in the X-Y plane. Part of the fifth layer 64 is in contact with the fourth GaN layer 59. Another part of the fifth layer 64 is in contact with the fourth layer 58.

The upper surface of the fifth GaN layer 65 is e.g. flat. A functional layer 10 is formed on the fifth GaN layer 65. The thickness t5 of the fifth GaN layer 65 is e.g. 100 nm or more and 5000 nm or less. The thickness t5 of the fifth GaN layer 65 is the distance along the Z-axis direction between the upper end of the fifth layer 64 and the upper surface of the fifth GaN layer 65 (in this example, the interface 101 between the stacked body 50a and the functional layer 10).

The substrate 40, the buffer layer 60, and the functional layer 10 can be based on the respective configurations described with reference to the nitride semiconductor element 110. The AlGaN layer 51, the third layer 52, the first GaN layer 53, the first layer 54, the second GaN layer 55, and the second layer 56 can be based on the respective configurations described with reference to the nitride semiconductor element 110. The rest of the configuration of the third GaN layer 57 and the fourth GaN layer 59 can be based on the configuration of the second GaN layer 55 of the nitride semiconductor element 110. The rest of the configuration of the fourth layer 58 and the fifth layer 64 can be based on the configuration of the second layer 56 of the nitride semiconductor element 110.

FIGS. 17A and 17B also illustrate the configuration of the nitride semiconductor wafer 240 according to this embodiment. The nitride semiconductor wafer 240 includes a substrate 40, a buffer layer 60, and a stacked body 50a. The nitride semiconductor wafer 240 may further include a functional layer 10. The substrate 40, the buffer layer 60, the stacked body 50a, and the functional layer 10 can be based on the respective configurations described with reference to the nitride semiconductor element 180.

Next, a method for manufacturing the nitride semiconductor element 180 and the nitride semiconductor wafer 240 according to the embodiment is described with reference to an example.

The method for manufacturing the buffer layer 60, the AlGaN layer 51, the third layer 52, the first GaN layer 53, and the first layer 54 is as described with reference to the method for manufacturing the nitride semiconductor element 120.

Next, the substrate temperature is set to 1090° C. In a mixed atmosphere of hydrogen and nitrogen with a ratio of 2:1, TMGa is supplied at a flow rate of 56 cc/min, and ammonia is supplied at a flow rate of 40 L/min, for 37 seconds. Thus, a second GaN layer 55 is formed. The thickness of the second GaN layer 55 is e.g. approximately 100 nm.

Furthermore, the substrate temperature is returned to 1040° C. In a mixed atmosphere of hydrogen and nitrogen with a ratio of 2:1, silane ($SiH_4$) with a concentration of 10 ppm is supplied at a flow rate of 350 cc/min, and ammonia is supplied at a flow rate of 20 L/min, for 3 minutes. Thus, a second layer 56 is formed.

These are repeated to form a third GaN layer 57, a fourth layer 58, a fourth GaN layer 59, and a fifth layer 64.

With the substrate temperature maintained at 1090° C., in a mixed atmosphere of hydrogen and nitrogen with a ratio of 2:1, TMGa is supplied at a flow rate of 56 cc/min, and ammonia is supplied at a flow rate of 40 L/min, for 60 minutes. Thus, a fifth GaN layer 65 is formed. The thickness of the fifth GaN layer 65 is e.g. approximately 2 μm.

Furthermore, TMGa is supplied at a flow rate of 56 cc/min, ammonia is supplied at a flow rate of 40 L/min, and silane ($SiH_4$) with a concentration of 10 ppm is supplied at a flow rate of 56 cc/min, for 30 minutes. Thus, an n-type GaN layer is formed. The Si concentration in the n-type GaN layer is e.g. $5.0 \times 10^{18}/cm^3$. The thickness of the n-type GaN layer is e.g. approximately 1 μm. The n-type GaN layer constitutes an n-type semiconductor layer 11 (at least part of the functional layer 10). Thus, a nitride semiconductor element 180 or nitride semiconductor wafer 240 according to this embodiment can be formed.

Next, the characteristics of the nitride semiconductor element of the embodiment are described with reference to the drawings.

FIGS. 18A to 18D are schematic sectional views illustrating samples.

FIGS. 19A to 19D are cross-sectional SEM images showing examples of the buffer layer and the stacked body.

Figure 20:
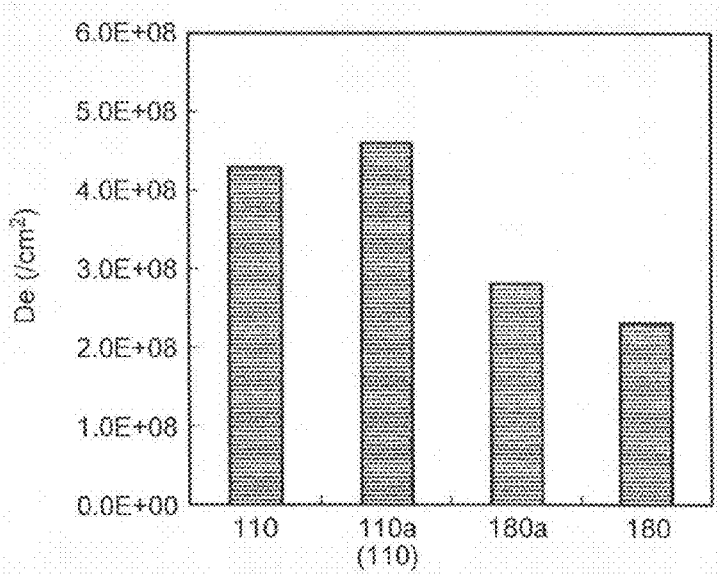
FIG. 20 is a graph illustrating the characteristics of the nitride semiconductor element according to the embodiment.

FIG. 20 is a graph illustrating the characteristics of the nitride semiconductor element according to the embodiment.

FIG. 20 is a graph showing edge dislocation density De in the nitride semiconductor element according to the embodiment. The edge dislocation density De is derived from the rocking curve half width of the (0002) plane, (0004) plane, (10-11) plane, and (20-22) plane in X-ray diffractometry.

The nitride semiconductor elements 110, 110a, 180a, 180 according to the embodiment are fabricated. The AlN buffer (buffer layer 60) and the AlGaN buffer (AlGaN layer 51) on the Si substrate are fabricated as in the aforementioned manufacturing method. The nitride semiconductor elements 110, 110a, 180a, 180 are different from each other in the method for forming the SiN-containing layer and the GaN layer. In the following, a method for fabricating the nitride semiconductor elements 110, 110a, 180a, 180 is presented.

Figure 18A:
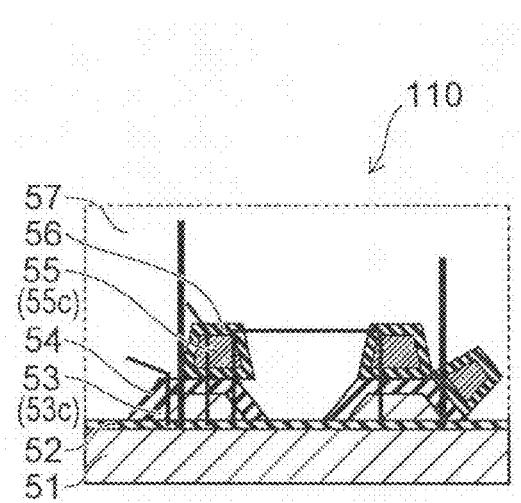
FIGS. 18A to 18D are schematic sectional views illustrating samples.

For the nitride semiconductor element 110 shown in FIG. 18A, layers up to the AlGaN buffer are formed. Then, layers up to the third layer 52 are formed. Subsequently, the growth temperature is raised. Then, the raw material is supplied for 1 minute to form the first GaN layer 53. The temperature is lowered to form the first layer 54. Then, the growth temperature is raised again, and the raw material is supplied for 1 minute 15 seconds to form the second GaN layer 55. The temperature is lowered to form the second layer 56. Then, the temperature is raised to form the third GaN layer 57 to 2 μm. Thus, the nitride semiconductor element 110 is obtained.

Figure 18B:
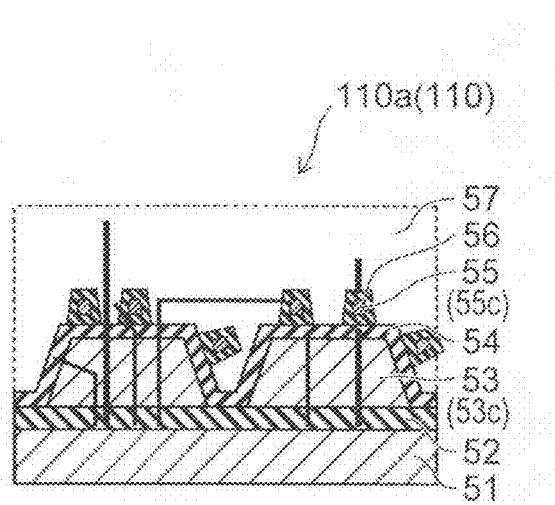

For the nitride semiconductor element 110a shown in FIG. 18B, layers up to the AlGaN buffer are formed. Then, layers up to the third layer 52 are formed. Subsequently, the growth temperature is raised. Then, the raw material is supplied for 2 minutes 30 seconds to form the first GaN layer 53. The temperature is lowered to form the first layer 54. Then, the growth temperature is raised again, and the raw material is supplied for 37 seconds to form the second GaN layer 55. The temperature is lowered to form the second layer 56. Then, the temperature is raised to form the third GaN layer 57 to 2 μm. Thus, the nitride semiconductor element 110a is obtained.

As shown in FIGS. 18A and 18B, the size of the protrusion 53c of the first GaN layer 53 of the nitride semiconductor element 110 is smaller than the size of the protrusion 53c of the first GaN layer 53 of the nitride semiconductor element 110a. The size of the protrusion 55c of the second GaN layer 55 of the nitride semiconductor element 110 is larger than the size of the protrusion 55c of the second GaN layer 55 of the nitride semiconductor element 110a. The nitride semiconductor element 110a is an example of the nitride semiconductor element 110. That is, in the nitride semiconductor element 110a, the size of the protrusion 55c of the second GaN layer 55 is smaller than the size of the protrusion 53c of the first GaN layer 53.

Figure 18C:
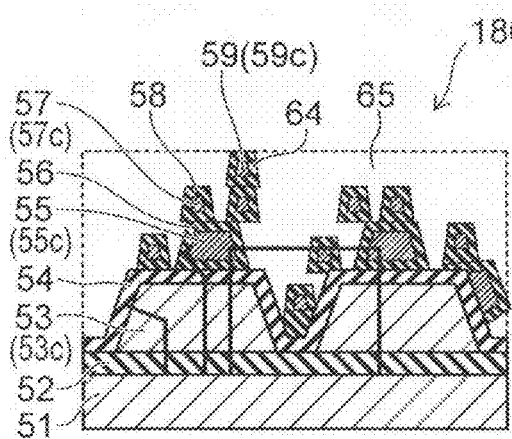

For the nitride semiconductor element 180a shown in FIG. 18C, layers up to the AlGaN buffer are formed. Then, layers up to the third layer 52 are formed. Subsequently, the growth temperature is raised. Then, the raw material is supplied for 2 minutes 30 seconds to form the first GaN layer 53. The temperature is lowered to form the first layer 54. Then, the growth temperature is raised again, and the raw material is supplied for 1 minute 15 seconds to form the second GaN layer 55. This is repeated four times to form the second layer 56, the third GaN layer 57, the fourth layer 58, and the fourth GaN layer 59. The temperature is lowered to form the fifth layer 64. Then, the temperature is raised to form the fifth GaN layer to 2 μm. Thus, the nitride semiconductor element 180a is obtained.

Figure 18D:
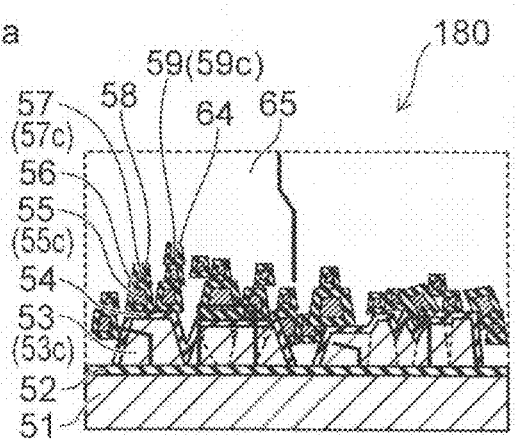

The method for fabricating the nitride semiconductor element 180 shown in FIG. 18D is as described above with reference to FIGS. 17A and 17B.

As shown in FIGS. 18C and 18D, the size of the protrusion 53c of the first GaN layer 53 of the nitride semiconductor element 180 is smaller than the size of the protrusion 53c of the first GaN layer 53 of the nitride semiconductor element 180a. The size of the protrusion 55c of the second GaN layer 55 of the nitride semiconductor element 180 is smaller than the size of the protrusion 55c of the second GaN layer 55 of the nitride semiconductor element 180a. The size of the protrusion 57c of the third GaN layer 57 of the nitride semiconductor element 180 is smaller than the size of the protrusion 57c of the third GaN layer 57 of the nitride semiconductor element 180a. The size of the protrusion 59c of the fourth GaN layer 59 of the nitride semiconductor element 180 is smaller than the size of the protrusion 59c of the fourth GaN layer 59 of the nitride semiconductor element 180a. The nitride semiconductor element 180a is an example of the nitride semiconductor element 180. That is, in the nitride semiconductor element 180a, the size of the protrusion 55c of the second GaN layer 55 is smaller than the size of the protrusion 53c of the first GaN layer 53. In the nitride semiconductor element 180a, the size of the protrusion 57c of the third GaN layer 57 is generally equal to the size of the protrusion 55c of the second GaN layer 55, or smaller than the size of the protrusion 55c of the second GaN layer 55. The size of the protrusion 59c of the fourth GaN layer 59 is generally equal to the size of the protrusion 55c of the second GaN layer 55, or smaller than the size of the protrusion 55c of the second GaN layer 55.

FIGS. 19A to 19D illustrate SEM images in which a cross section cleaved at the (1-100) plane of the nitride semiconductor layer is observed.

Figure 19A:
FIGS. 19A to 19D are cross-sectional SEM images showing examples of the buffer layer and the stacked body.
Figure 19B:
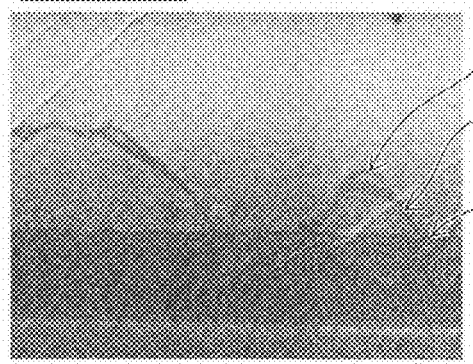
Figure 19C:
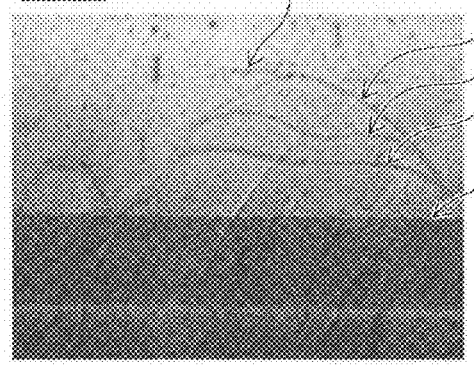
Figure 19D:

FIG. 19A illustrates a cross-sectional SEM image of the nitride semiconductor element 110. FIG. 19B illustrates a cross-sectional SEM image of the nitride semiconductor element 110a. FIG. 19C illustrates a cross-sectional SEM image of the nitride semiconductor element 180a. FIG. 19D illustrates a cross-sectional SEM image of the nitride semiconductor element 180.

As shown in FIG. 19D, the third layer 52, the first layer 54, the second layer 56, the fourth layer 58, and the fifth layer 64 are formed in the nitride semiconductor element 180.

The first GaN layer 53 includes an unevenness having a surface (first slope 53s) inclined with respect to the plane (X-Y plane) perpendicular to the stacking direction (Z-axis direction). The first GaN layer 53 includes island-like crystals discontinuous in the plane (X-Y plane) perpendicular to the stacking direction (Z-axis direction).

The second GaN layer 55 includes an unevenness having a surface (second slope 55s) inclined with respect to the plane (X-Y plane) perpendicular to the stacking direction (Z-axis direction). The second GaN layer 55 includes island-like crystals discontinuous in the plane (X-Y plane) perpendicular to the stacking direction (Z-axis direction).

The third GaN layer 57 includes an unevenness having a surface (third slope 57s) inclined with respect to the plane (X-Y plane) perpendicular to the stacking direction (Z-axis direction). The third GaN layer 57 includes island-like crystals discontinuous in the plane (X-Y plane) perpendicular to the stacking direction (Z-axis direction).

The fourth GaN layer 59 includes an unevenness having a surface (fourth slope 59s) inclined with respect to the plane (X-Y plane) perpendicular to the stacking direction (Z-axis direction). The fourth GaN layer 59 includes island-like crystals discontinuous in the plane (X-Y plane) perpendicular to the stacking direction (Z-axis direction).

As shown in FIG. 20, the edge dislocation density De of the nitride semiconductor element 110 is $4.3 \times 10^8/cm^2$. The edge dislocation density De of the nitride semiconductor element 110 is lower than the edge dislocation density De of the nitride semiconductor elements 131, 132, 133 of the first to third reference examples shown in FIG. 9. The edge dislocation density De of the nitride semiconductor element 110a is $4.6 \times 10^8/cm^2$. The edge dislocation density De of the nitride semiconductor element 110a is lower than the edge dislocation density De of the nitride semiconductor elements 131, 132, 133 of the first to third reference examples.

The edge dislocation density De of the nitride semiconductor element 180a is $2.8 \times 10^8/cm^2$. The edge dislocation density De of the nitride semiconductor element 180a is lower than the edge dislocation density De of the nitride semiconductor elements 131, 132, 133 of the first to third reference examples shown in FIG. 9, and even lower than the edge dislocation density De of the nitride semiconductor element 110 and the edge dislocation density De of the nitride semiconductor element 110a.

The edge dislocation density De of the nitride semiconductor element 180 is $2.3 \times 10^8/cm^2$. The edge dislocation density De of the nitride semiconductor element 180 is lower than the edge dislocation density De of the nitride semiconductor elements 131, 132, 133 of the first to third reference examples shown in FIG. 9, and even lower than the edge dislocation density De of the nitride semiconductor element 110, the edge dislocation density De of the nitride semiconductor element 110a, and the edge dislocation density De of the nitride semiconductor element 180a.

The reason for this is considered as follows. The number of repetitions of the formation of the SiN-containing layer and the GaN layer is larger than that of the nitride semiconductor elements 110, 110a. Thus, the effect of blocking dislocation propagation is greater. Furthermore, in the nitride semiconductor element 180, the formation of the SiN-containing layer and the GaN layer is not simply repeated. In addition, after forming the third layer 52, the first GaN layer 53 is formed in a smaller shape. Thus, the island-like top C-plane region is made smaller. Accordingly, penetrating dislocations are suppressed. Furthermore, GaN islands are densely arranged and repeated. Thus, the GaN layer is arranged so as to maximize the blocking effect. Accordingly, the edge dislocation density De of the nitride semiconductor element 180 can be reduced to approximately half the edge dislocation density De of the nitride semiconductor elements 110, 110a.

In the nitride semiconductor element 180, the size of the protrusion 53c of the first GaN layer 53, the size of the protrusion 55c of the second GaN layer 55, the size of the protrusion 57c of the third GaN layer 57, and the size of the protrusion 59c of the fourth GaN layer 59 may be gradually reduced from the first GaN layer 53 toward the fourth GaN layer (toward the stacking direction). That is, the height (thickness) of the protrusion of the GaN layer may be gradually reduced from the first GaN layer 53 toward the fourth GaN layer 59 (toward the stacking direction). The length (width) of the bottom of the protrusion of the GaN layer may be gradually reduced from the first GaN layer 53 toward the fourth GaN layer 59 (toward the stacking direction). On the plane (X-Y plane) perpendicular to the Z-axis direction (stacking direction), the number of slopes of the GaN layer per unit area may increase gradually from the first GaN layer 53 toward the fourth GaN layer 59 (toward the stacking direction). This increases the effect of blocking dislocations, and facilitates reducing dislocations.

The edge dislocation density De of the nitride semiconductor element 180 is further described.

It is considered that in the nitride semiconductor element 180, the edge dislocation density De is reduced as follows.

The first GaN layer 53 grows three-dimensionally. Thus, dislocations 80 generated in the buffer layer 60 are bent in the direction parallel to the stacking direction (Z-axis direction) in the first GaN layer 53. This can reduce dislocations 80 reaching the upper layer (functional layer 10).

In the region in which the growth of the first GaN layer 53 is suppressed by the third layer 52 (the region between the protrusions 53c), dislocations 80 generated in the buffer layer are blocked by the third layer 52. This suppresses propagation of dislocations 80 to the upper layer. Thus, the dislocations 80 can be reduced.

Furthermore, the number of dislocations 80 propagating toward the upper layer decreases at the slope 53s of the protrusion 53c of the first GaN layer 53. The dislocation 80 is bent at the slope 53s. That is, the dislocation 80 is bent in the first layer 54 provided on the slope 53s. The propagation of the dislocation 80 is blocked at the slope 53s. As a result, dislocations 80 reaching the upper layer can be significantly reduced.

Thus, the dislocation density can be reduced by providing the AlGaN layer 51, the third layer 52, the first GaN layer 53 including a protrusion 53c having a slope 53s, the first layer 54, the second GaN layer 55 in the stacked body 50. Accordingly, a nitride semiconductor element and a nitride semiconductor wafer with few dislocations are obtained.

FIGS. 21A to 21D are graphs illustrating the nitride semiconductor element according to the embodiment.

Figure 22A:
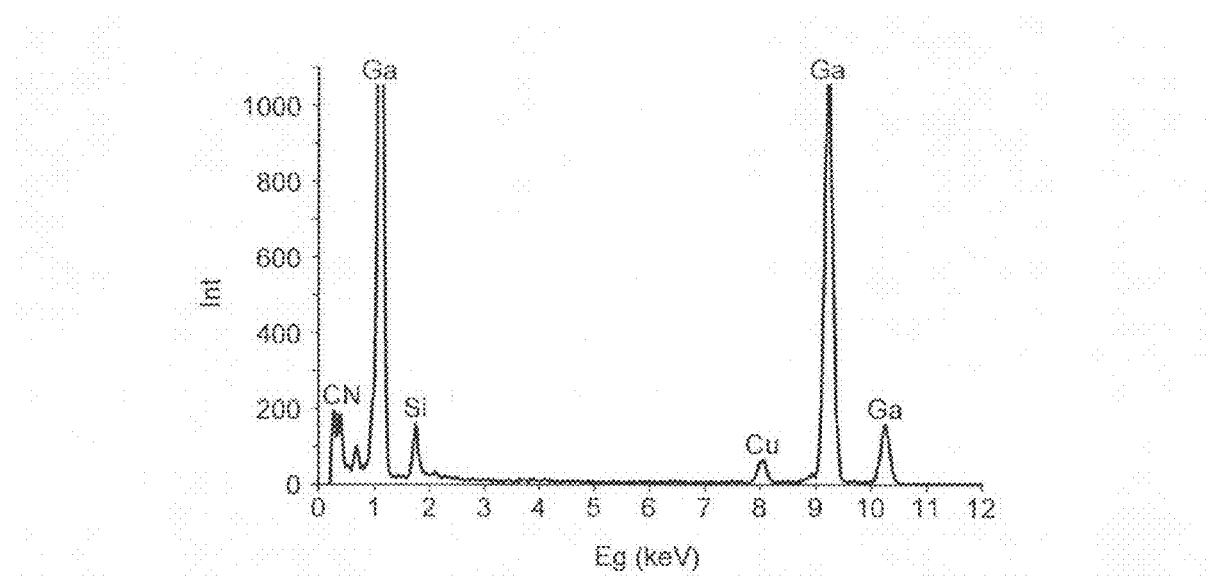
FIGS. 22A and 22B illustrate the nitride semiconductor element according to the embodiment.
Figure 22B:
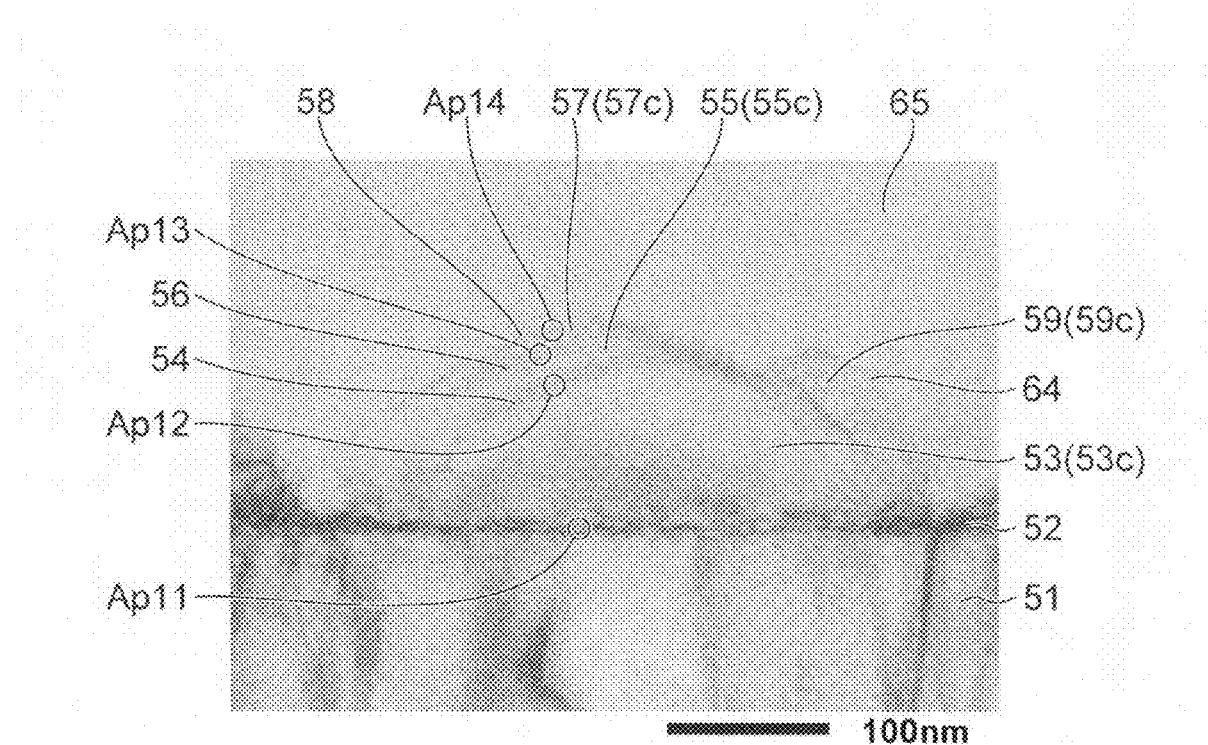

FIGS. 22A and 22B illustrate the nitride semiconductor element according to the embodiment.

Figure 21A:
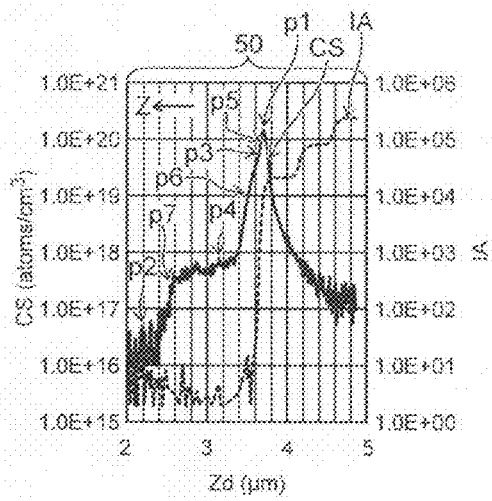
FIGS. 21A to 21D are graphs illustrating the nitride semiconductor element according to the embodiment.
Figure 21B:
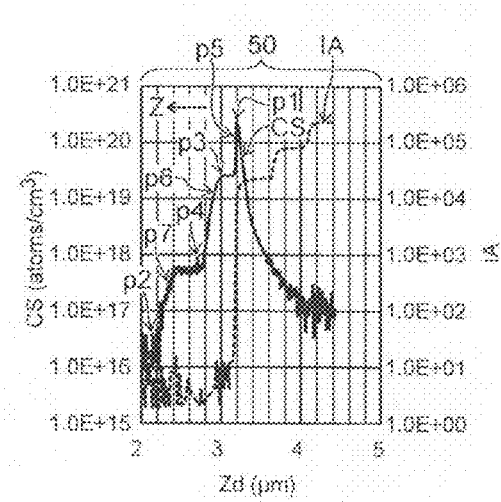
Figure 21C:
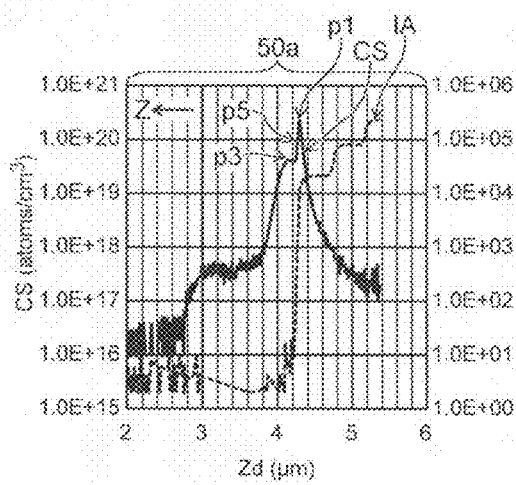
Figure 21D:
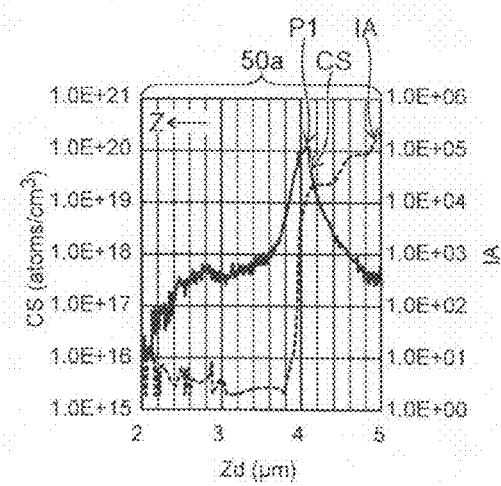

FIG. 21A shows an example of the SIMS analysis result of the nitride semiconductor element 110 (i.e., nitride semiconductor wafer 210) according to the embodiment. FIG. 21B shows an example of the SIMS analysis result of the nitride semiconductor element 110a according to the embodiment. FIG. 21C shows an example of the SIMS analysis result of the nitride semiconductor element 180a according to the embodiment. FIG. 21D shows an example of the SIMS analysis result of the nitride semiconductor element 180 (i.e., nitride semiconductor wafer 240) according to the embodiment.

In this example, measurement is performed with a spacing of 5 nm along the depth direction (stacking direction). The horizontal axis of FIGS. 21A to 21D represents depth Zd (corresponding to the position in the Z-axis direction). The left vertical axis of FIGS. 21A to 21D represents Si concentration CS (atoms/cm$^3$). The right vertical axis of FIGS. 21A to 21D represents Al secondary ion intensity IA.

FIGS. 22A and 22B show the nitride semiconductor element according to the embodiment.

FIG. 22A is a graph showing an example of the result of energy dispersive X-ray spectrometry (EDS analysis) of the nitride semiconductor element 180 (i.e., nitride semiconductor wafer 240) according to the embodiment. FIG. 22B shows locations analyzed in the EDS analysis of the nitride semiconductor element 180 (i.e., nitride semiconductor wafer 240) according to the embodiment. In FIG. 22B, a first analysis position Ap11, a second analysis position Ap12, a third analysis position Ap13, and a fourth analysis position Ap14 are shown as the locations of the EDS analysis on the cross-sectional TEM image. The first analysis position Ap11 corresponds to the position of the third layer 52. The second analysis position Ap12 corresponds to the position of the first layer 54. The third analysis position Ap13 corresponds to the position of the second layer 56. The fourth analysis position Ap14 corresponds to the position of the fourth layer 58.

FIG. 22A shows the analysis result of the first analysis position Ap11. The horizontal axis of FIG. 22A represents energy Eg (keV: kiloelectron volts). The vertical axis of FIG. 22A represents intensity Int (counts). The detection limit of Si in this EDS analysis is 1000 ppm.

As seen from FIGS. 21A and 21B, in the nitride semiconductor elements 110, 110a, three stages of Si peaks are observed in the range of the stacked body 50. For instance, the Si concentration profile in the stacked body 50 includes first to seventh portions p1-p7. The first to seventh portions p1-p7 are stacked along the Z-axis direction. The first to seventh portions p1-p7 are as described above with reference to FIGS. 12A and 12B. For instance, in SIMS analysis, the existence of the third layer 52 can be determined by the existence of the first portion p1. The existence of the first layer 54 can be determined by the existence of the third portion p3. The existence of the second layer 56 can be determined by the existence of the fourth portion p4.

On the other hand, as shown in FIGS. 21C and 21D, in the nitride semiconductor elements 180a, 180, five stages of Si peaks are not observed in the range of the stacked body 50a. As seen from FIG. 21C, in the nitride semiconductor element 180a, a Si peak of the first portion p1 and a Si peak of the third portion p3 can be observed, but other Si peaks cannot be observed. As seen from FIG. 21D, in the nitride semiconductor element 180, a Si peak of the first portion p1 can be observed, but other Si peaks cannot be observed.

Thus, five stages of Si peaks may fail to be observed in the SIMS analysis result of the nitride semiconductor elements 180a, 180 according to the embodiment.

Even in such cases, the third layer 52, the first layer 54, the second layer 56, the fourth layer 58, and the fifth layer 64 are formed as shown in FIG. 22B.

As seen from FIG. 22A, in the embodiment, Si is detected from the third layer 52, the first layer 54, the second layer 56, and the fourth layer 58. The Si concentration in the third layer is estimated at approximately 4.8 atomic %. The Si concentration in the first layer 54 is estimated at approximately 5.0 atomic %. The Si concentration in the second layer 56 is estimated at approximately 5.3 atomic %. The Si concentration in the fourth layer is estimated at approximately 5.6 atomic %. Thus, in this embodiment, the Si concentration in each of the first layer 54, the second layer 56, the third layer 52, and the fourth layer 58 is higher than or equal to the detection limit (1000 ppm). A significant effect of reducing dislocations is achieved by setting the Si concentration in each of the first layer 54, the second layer 56, the third layer 52, and the fourth layer 58 to 1000 ppm or more.

Figure 23:
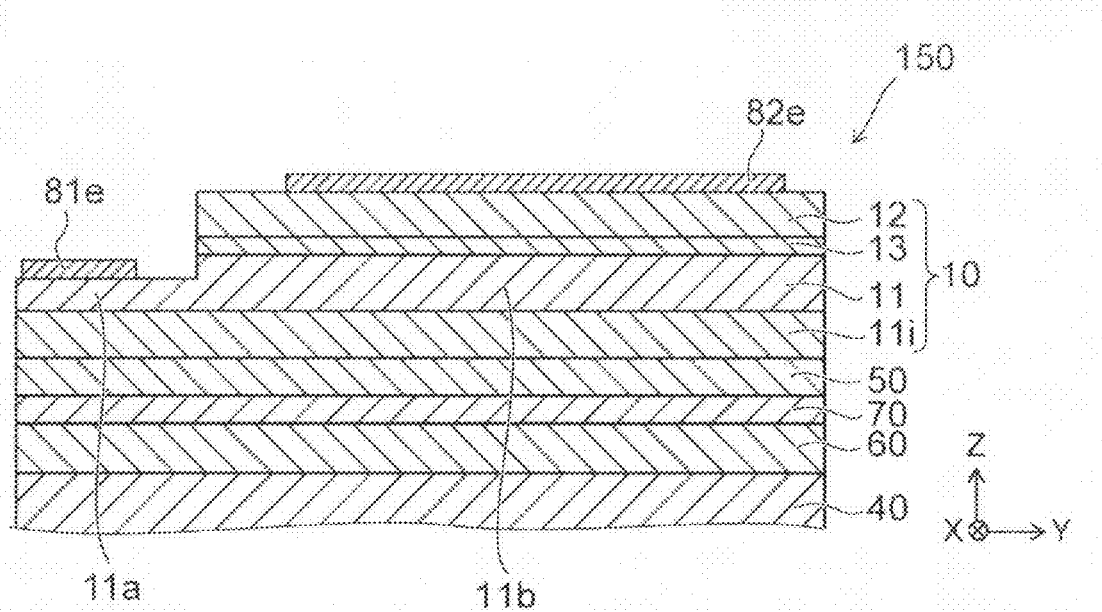
FIG. 23 is a schematic sectional view illustrating an alternative nitride semiconductor element according to the embodiment.

FIG. 23 is a schematic sectional view illustrating an alternative nitride semiconductor element according to the embodiment.

As shown in FIG. 23, the nitride semiconductor element 150 according to the embodiment further includes a first electrode 81e and a second electrode 82e. The functional layer 10 includes an n-type semiconductor layer 11, a p-type semiconductor layer 12, and a light emitting layer 13. In this example, a low impurity concentration layer 11i is also provided. The nitride semiconductor element 150 is a semiconductor light emitting element.

In this example, the n-type semiconductor layer 11 includes a first part 11a and a second part 11b. The second part 11b is juxtaposed with the first part 11a in the X-Y plane. The light emitting layer 13 is provided between the second part 11b and the p-type semiconductor layer 12.

The first electrode 81e is electrically connected to the first part 11a of the n-type semiconductor layer 11. The second electrode 82e is electrically connected to the p-type semiconductor layer 12. The functional layer 10 is supplied with a current through the first electrode 81e and the second electrode 82e. Thus, light is emitted from the light emitting layer 13.

The nitride semiconductor element 150 includes the stacked body 50 according to the embodiment. Thus, the dislocation density is low. As a result, for instance, a high light emission efficiency is achieved.

Figure 24:
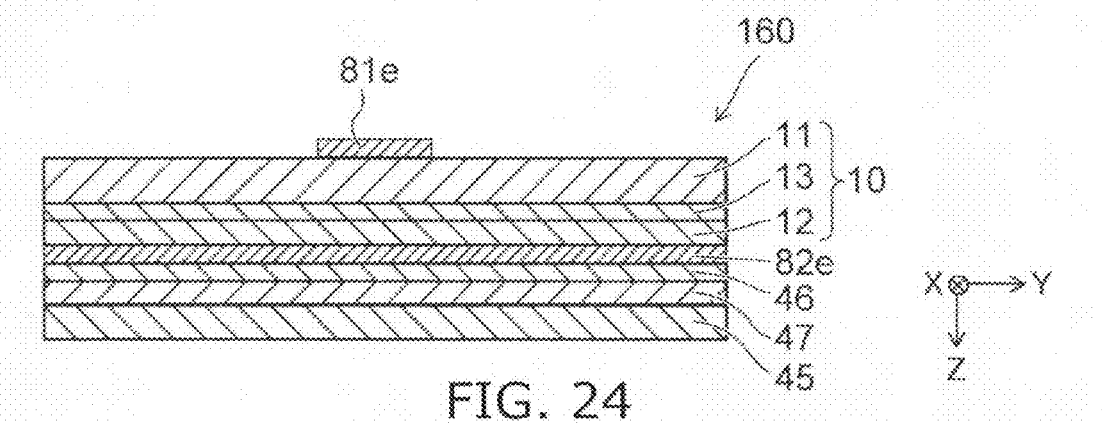
FIG. 24 is a schematic sectional view illustrating an alternative nitride semiconductor element according to the embodiment.

FIG. 24 is a schematic sectional view illustrating an alternative nitride semiconductor element according to the embodiment.

As shown in FIG. 24, the nitride semiconductor element 160 according to the embodiment also includes a first electrode 81e and a second electrode 82e. In this example, the substrate 40, the buffer layer 60, and the stacked body 50 are removed after the functional layer 10 is formed on the stacked body 50. For instance, after forming the n-type semiconductor layer 11, the light emitting layer 13, and the p-type semiconductor layer 12 of the functional layer 10, the second electrode 82e is formed on the p-type semiconductor layer 12. Then, a first bonding metal layer 46 is formed on the second electrode 82e. On the other hand, a support substrate 45 (e.g., a silicon plate or metal substrate) with a second bonding metal layer 47 formed on the major surface is prepared. The first bonding metal layer 46 and the second bonding metal layer 47 are bonded to each other. Subsequently, the substrate 40, the buffer layer 60, the stacked intermediate layer 70, and at least part of the stacked body 50 used for crystal growth are removed. The support substrate 45 may be e.g. a metal layer (formed by plating or the like).

The nitride semiconductor element 160 includes a functional layer 10 formed on the stacked body 50 according to the embodiment. Thus, the dislocation density is low. As a result, for instance, a high light emission efficiency is achieved.

Figure 25:
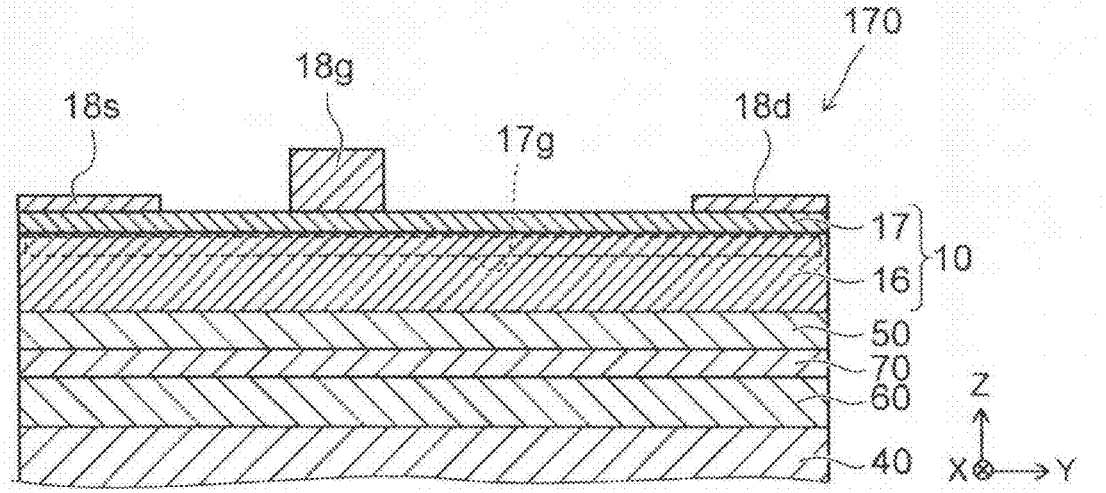
FIG. 25 is a schematic sectional view illustrating an alternative nitride semiconductor element according to the embodiment.

FIG. 25 is a schematic sectional view illustrating an alternative nitride semiconductor element according to the embodiment.

As shown in FIG. 25, the nitride semiconductor element 170 according to the embodiment is a HEMT (high electron mobility transistor) element. In the nitride semiconductor element 170, a first layer 16 and a second layer 17 are provided as the functional layer 10. Furthermore, a gate electrode 18g, a source electrode 18s, and a drain electrode 18d are provided.

The first layer 16 is provided on the stacked body 50. The second layer 17 is provided on the first layer 16. The first layer 16 is made of e.g. undoped $Al_\alpha Ga_{1-\alpha}N$ ($0 \le \alpha \le 1$) containing no impurity. The second layer 17 is made of e.g. undoped or n-type $Al_\beta Ga_{1-\beta}N$ ($0 \le \beta \le 1$, $\alpha < \beta$). For instance, the first layer 16 is an undoped GaN layer. The second layer 17 is an undoped or n-type AlGaN layer.

The gate electrode 18g, the source electrode 18s, and the drain electrode 18d are provided on the second layer 17. The source electrode 18s is spaced from the drain electrode 18d in the X-Y plane. The source electrode 18s and the drain electrode 18d are in ohmic contact with the second layer 17. The gate electrode 18g is placed on the second layer 17 between the source electrode 18s and the drain electrode 18d. The gate electrode 18g is in Schottky contact with the second layer 17.

The lattice constant of the second layer 17 is smaller than the lattice constant of the first layer 16. This produces strain in the second layer 17. Thus, piezoelectric polarization occurs in the second layer 17 by the piezoelectric effect. A two-dimensional electron gas 17g is formed in the first layer 16 near the interface with the second layer 17. In the nitride semiconductor element 170, the two-dimensional electron gas concentration below the gate electrode 18g is increased or decreased by controlling the voltage applied to the gate electrode 18g. Thus, the current flowing between the source electrode 18s and the drain electrode 18d is controlled.

The nitride semiconductor element 180 includes a functional layer 10 formed on the stacked body 50 according to the embodiment. Thus, the dislocation density is low. As a result, good electrical characteristics are achieved.

In this practical example, the stacked body 50 may be provided on the buffer layer 60, the stacked intermediate layer 70 may be provided on the stacked body 50, and the functional layer 10 may be provided on the stacked intermediate layer 70.

In this practical example, the stacked intermediate layer 70 can be appropriately omitted as necessary.

Third Embodiment

Figure 26:
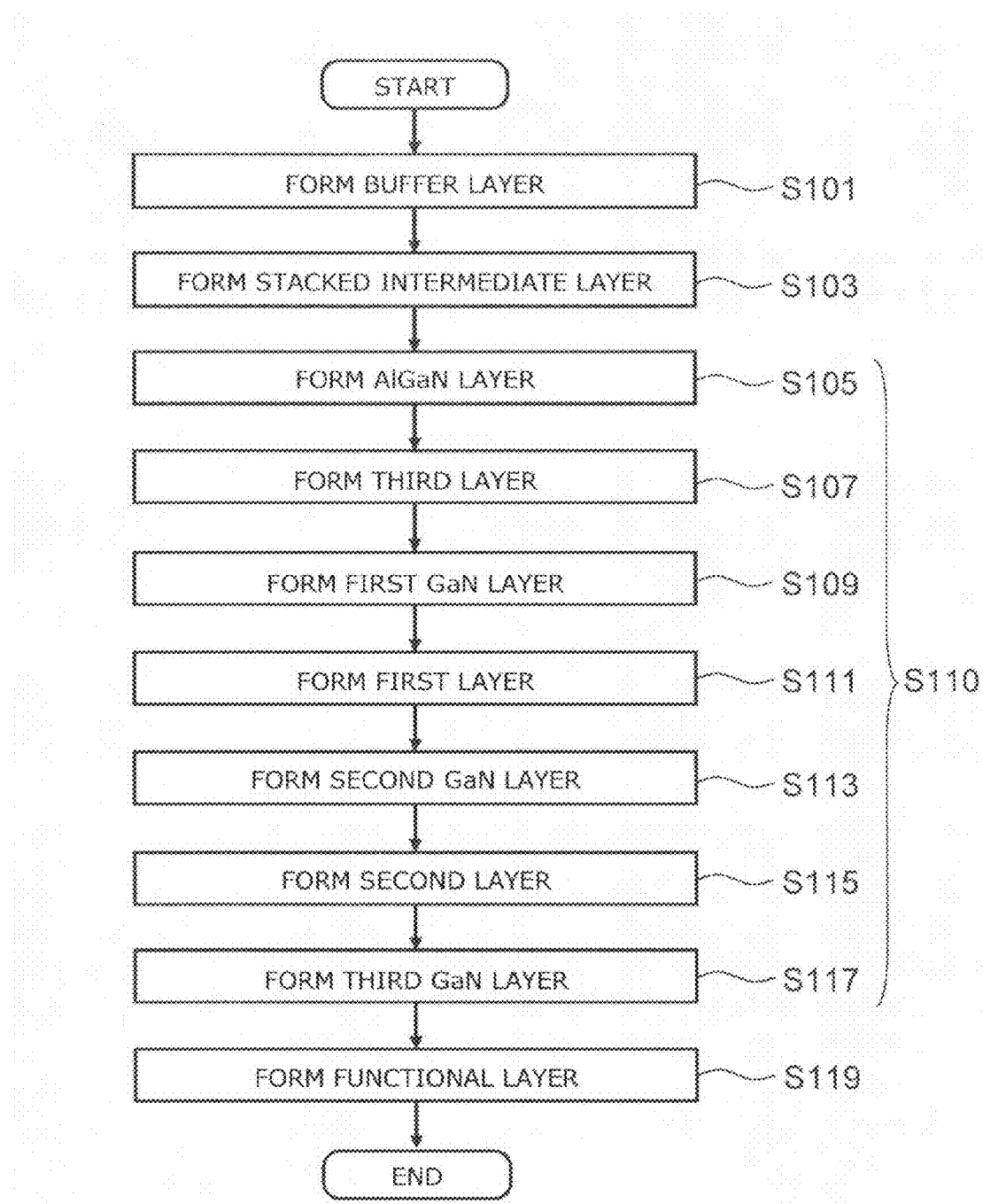
FIG. 26 is a flow chart illustrating a method for forming a nitride semiconductor layer according to a third embodiment.

FIG. 26 is a flow chart illustrating a method for forming a nitride semiconductor layer according to a third embodiment.

As shown in FIG. 26, in the method for forming a nitride semiconductor layer according to this embodiment, for instance, the temperature of the substrate 40 is set to 1020° C. (fourth temperature). A third gas including a gallium raw material (e.g., TMGa), an aluminum raw material (e.g., TMAl), and a nitrogen raw material (e.g., ammonia) is supplied onto the buffer layer 60 provided on the substrate 40 and including a nitride semiconductor. Thus, an AlGaN layer 51 of $Al_xGa_{1-x}N$ ($0<x\leq1$) is formed (step S105). For instance, the fourth temperature is lower than or equal to the second temperature.

Furthermore, for instance, the temperature of the substrate 40 is set to 1040° C. (second temperature) lower than or equal to the first temperature. A second gas including a silicon raw material (e.g., silane) and a nitrogen raw material (e.g., ammonia) is supplied onto the upper surface 51au of the AlGaN layer 51. Thus, a third layer 52 containing Si at a concentration of $7.0\times10^{19}/cm^3$ or more and $4.5\times10^{20}/cm^3$ or less is formed (step S107).

Furthermore, for instance, the temperature of the substrate 40 is set to 1090° C. (first temperature). A first gas including a gallium raw material (e.g., TMG) and a nitrogen raw material (e.g., ammonia) is supplied onto the third layer 52. Thus, a first GaN layer 53 including a protrusion having a first slope 53s inclined with respect to the upper surface 51au is formed (step S109).

Furthermore, for instance, the temperature of the substrate 40 is set to 1040° C. (second temperature) lower than or equal to the first temperature. The second gas including a silicon raw material (e.g., silane) and a nitrogen raw material (e.g., ammonia) is supplied onto the first GaN layer 53. Thus, a first layer 54 containing Si is formed (step S111). For instance, the second temperature is lower than or equal to the first temperature. The blocking or bending of dislocations in the first layer is increased by setting the second temperature lower than or equal to the first temperature. This facilitates reducing dislocations.

Furthermore, for instance, the temperature of the substrate 40 is set to 1120° C. (third temperature) higher than or equal to the first temperature. The first gas including a gallium raw material (e.g., TMG) and a nitrogen raw material (e.g., ammonia) is supplied onto the first layer 54. Thus, a second GaN layer 55 including a protrusion having a second slope 55s inclined with respect to the upper surface 51au is formed (step S113). The size of the second GaN layer 55 is smaller than the size of the first GaN layer 53.

Furthermore, for instance, the temperature of the substrate 40 is set to 1040° C. (second temperature) lower than or equal to the first temperature. The second gas including a silicon raw material (e.g., silane) and a nitrogen raw material (e.g., ammonia) is supplied onto the second GaN layer 55. Thus, a second layer 56 containing Si is formed (step S115).

Furthermore, a third GaN layer 57 is formed on the second layer 56 (step S117).

Thus, a stacked body 50 including the AlGaN layer 51, the third layer 52, the first GaN layer 53, the first layer 54, the second GaN layer 55, the second layer 56, and the third GaN layer 57 is formed (step S110).

This formation method can provide a method for forming a nitride semiconductor layer with few dislocations.

In the steps of forming a third layer 52, a first layer 54, and a second layer 56 (steps S107, S111, S115), the second gas may be a gas including a magnesium raw material (e.g., $Cp_2Mg$: bis(cyclopentadienyl)magnesium) and a nitrogen raw material (e.g., ammonia). Then, a third layer 52, a first layer 54, and a second layer 56 including Mg can be formed.

Alternatively, the second gas may be a gas including a silicon raw material, a magnesium raw material, and a nitrogen raw material (e.g., ammonia). Then, a third layer 52, a first layer 54, and a second layer 56 including both Si and Mg can be formed.

In the method for forming a nitride semiconductor layer according to this embodiment, the steps from the step of forming a first GaN layer 53 (step S109) to the step of forming a second layer 56 (step S115) may be grouped into a set of steps, and this set of steps may be repeated. Thus, the first GaN layer 53, the first layer 54, the second GaN layer 55, and the second layer 56 are repetitively formed on the second layer 56.

As shown in FIG. 26, this formation method may further include the processing of forming a functional layer 10 on the third GaN layer 57 (step S119). This formation method may further include the processing of forming a buffer layer 60 on the substrate 40 (step S101). This formation method may further include the processing of forming a stacked intermediate layer 70 on the buffer layer 60 (step S103). In this case, in the formation of the AlGaN layer 51 (step S105), the AlGaN layer 51 is formed on the stacked intermediate layer 70.

In the embodiment, growth of nitride semiconductor layers can be based on e.g. the metal-organic chemical vapor deposition (MOCVD) method, metal-organic vapor phase epitaxy (MOVPE) method, molecular beam epitaxy (MBE) method, and halide vapor phase epitaxy (HVPE) method.

For instance, in the case of using the MOCVD method or MOVPE method, the following raw materials can be used in forming each semiconductor layer. The raw material of Ga can be e.g. TMGa (trimethylgallium) and TEGa (triethylgallium). The raw material of In can be e.g. TMIn (trimethylindium), TEIn (triethylindium) and the like. The raw material of Al can be e.g. TMAl (trimethylaluminum) and the like. The raw material of N can be e.g. $NH_3$ (ammonia), MMHy (monomethylhydrazine), DMHy (dimethylhydrazine) and the like. The raw material of Si can be $SiH_4$ (monosilane), $Si_2H_6$ (disilane) and the like. The raw material of Mg can be $Cp_2Mg$ (bis(cyclopentadienyl)magnesium), $EtCp_2Mg$ (bis(ethylcyclopentadienyl)magnesium) and the like.

Figure 27:
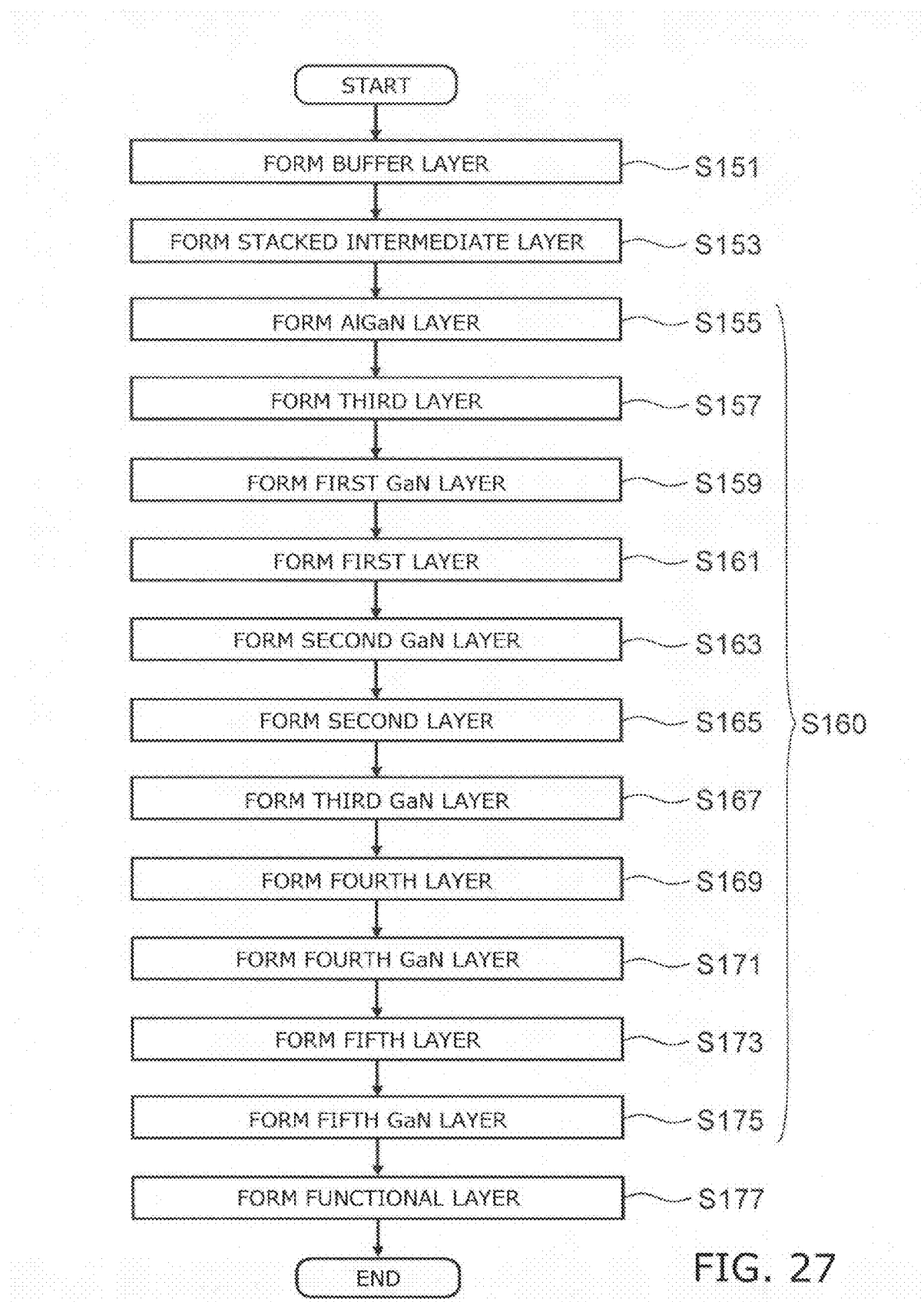
FIG. 27 is a flow chart illustrating an alternative method for forming a nitride semiconductor layer according to the third embodiment.

FIG. 27 is a flow chart illustrating an alternative method for forming a nitride semiconductor layer according to the third embodiment.

The steps from the step of forming an AlGaN layer 51 to the step of forming a first layer 54 are similar to the steps from the step S105 to the step S111 described above with reference to FIG. 26 (steps S155-S161).

Next, for instance, the temperature of the substrate 40 is set to 1090° C. In a mixed atmosphere of hydrogen and nitrogen with a ratio of 2:1, TMGa is supplied at a flow rate of 56 cc/min, and ammonia is supplied at a flow rate of 40 L/min, for 37 seconds. Thus, a second GaN layer 55 is formed (step S163). The thickness of the second GaN layer 55 is e.g. approximately 100 nm.

Furthermore, the substrate temperature is returned to 1040° C. In a mixed atmosphere of hydrogen and nitrogen with a ratio of 2:1, silane ($SiH_4$) with a concentration of 10 ppm is supplied at a flow rate of 350 cc/min, and ammonia is supplied at a flow rate of 20 L/min, for 3 minutes. Thus, a second layer 56 is formed (step S165).

Furthermore, the step of forming a second GaN layer 55 (step S163) and the step of forming a second layer 56 (step S165) are grouped into a set of steps, and this set of steps is repeated. Thus, the second GaN layer 55 and the second layer 56 are repetitively formed on the first layer 54. That is, a third GaN layer 57, a fourth layer 58, a fourth GaN layer 59, and a fifth layer 64 are formed (steps S167-S173).

Furthermore, a fifth GaN layer 65 is formed on the fifth layer 64 (step S175).

Thus, in the alternative method for forming a nitride semiconductor layer according to this embodiment, the step of forming a second GaN layer 55 (step S163) and the step of forming a second layer 56 (step S165) are grouped into a set of steps, and this set of steps is repeated. Thus, the second GaN layer 55 and the second layer 56 are repetitively formed on the first layer 54.

Thus, a stacked body 50a including the AlGaN layer 51, the third layer 52, the first GaN layer 53, the first layer 54, the second GaN layer 55, the second layer 56, the third GaN layer 57, the fourth layer 58, the fourth GaN layer 59, the fifth layer 64, and the fifth GaN layer 65 is formed (step S160).

This formation method can provide a method for forming a nitride semiconductor layer with few dislocations.

In the steps of forming a third layer 52, a first layer 54, a second layer 56, a fourth layer 58, and a fifth layer 64 (steps S157, S161, S165, S169, and S173), the second gas may be a gas including a magnesium raw material (e.g., Cp$_2$Mg: bis(cyclopentadienyl)magnesium) and a nitrogen raw material (e.g., ammonia). Then, a third layer 52, a first layer 54, a second layer 56, a fourth layer 58, and a fifth layer 64 including Mg can be formed.

Alternatively, the second gas may be a gas including a silicon raw material, a magnesium raw material, and a nitrogen raw material (e.g., ammonia). Then, a third layer 52, a first layer 54, a second layer 56, a fourth layer 58, and a fifth layer 64 including both Si and Mg can be formed.

As shown in FIG. 27, this formation method may further include the processing of forming a functional layer 10 on the fifth GaN layer 65 (step S177). This formation method may further include the processing of forming a buffer layer 60 on the substrate 40 (step S151). This formation method may further include the processing of forming a stacked intermediate layer 70 on the buffer layer 60 (step S153). In this case, in the formation of the AlGaN layer 51 (step S155), the AlGaN layer 51 is formed on the stacked intermediate layer 70.

The embodiments can provide a nitride semiconductor element, a nitride semiconductor wafer, and a method for forming a nitride semiconductor layer with few dislocations.

In this description, the "nitride semiconductor" includes semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) of any compositions with the composition ratios x, y, and z varied in the respective ranges. Furthermore, the "nitride semiconductor" also includes those of the above chemical formula further containing group V elements other than N (nitrogen), those further containing various elements added to control various material properties such as conductivity type, and those further containing various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the invention is not limited to these examples. For instance, any specific configurations of various components such as the substrate, buffer layer, stacked intermediate layer, stacked body, AlGaN layer, GaN layer, first layer 54, second layer 56, third layer 52, and functional layer included in the nitride semiconductor element and the nitride semiconductor wafer are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the embodiments to the extent that the spirit of the embodiments is included.

Moreover, all nitride semiconductor elements, nitride semiconductor wafers, and methods for forming nitride semiconductor layer practicable by an appropriate design modification by one skilled in the art based on the nitride semiconductor elements, the nitride semiconductor wafers, and the methods for forming nitride semiconductor layer described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A nitride semiconductor element comprising:
   a stacked body including
      a first GaN layer including a first protrusion,
      a first layer provided on the first GaN layer and containing at least one of SiN and MgN, the first layer including a first region and a second region,
      a second GaN layer provided on the first region and including a second protrusion, and
      a second layer provided on the second GaN layer and the second region, the second layer containing at least one of SiN and MgN, a part of the second layer being in direct physical contact with the second region; and
   a functional layer provided on the stacked body and including a nitride semiconductor,
   a maximum thickness of the first protrusion of the first GaN layer being greater than a maximum thickness of the second protrusion of the second GaN layer.

2. The element according to claim 1, wherein the stacked body further includes an AlGaN layer of $Al_xGa_{1-x}N$ ($0<x \leq 1$) on which the first GaN layer is provided.

3. The element according to claim 2, wherein the stacked body further includes a third layer provided between the AlGaN layer and the first GaN layer and containing at least one of Si and Mg.

4. The element according to claim 3, wherein
a surface of the third layer includes a first region and a second region,
the first GaN layer is provided on the first region, and
a part of the first layer is in contact with the third layer in the second region.

5. The element according to claim 1, wherein
the first protrusion has a first bottom,
the second protrusion has a second bottom,
a second length of the second bottom in a first direction perpendicular to a stacking direction from the first GaN layer toward the second GaN layer is shorter than a first length of the first bottom, and
a ratio of the second length to the first length is not less than 0.005 and less than 1.

6. The element according to claim 1, wherein the maximum thickness of the first protrusion is not less than 100 nm and not more than 1200 nm.

7. The element according to claim 1, wherein the stacked body further includes:
a third layer provided between the AlGaN layer and the first GaN layer and containing at least one of Si and Mg;
a third GaN layer provided on the second layer and including a third protrusion;
a fourth layer provided on the third GaN layer and containing at least one of Si and Mg, a part of the forth layer being in contact with the second layer;
a fourth GaN layer provided on the fourth layer and including a fourth protrusion; and
a fifth layer provided on the fourth GaN layer and containing at least one of Si and Mg, a part of the fifth layer being in contact with the fourth layer.

8. The element according to claim 1, wherein a concentration of Si in at least part of the first GaN layer is not less than $1\times10^{17}/cm^3$ and not more than $1\times10^{20}/cm^3$.

9. The element according to claim 1, wherein a concentration of Si in at least part of the second GaN layer is not less than $1\times10^{17}/cm^3$ and not more than $1\times10^{20}/cm^3$.

10. The element according to claim 1, further comprising:
a stacked intermediate layer including:
a GaN intermediate layer;
an AlN intermediate layer provided on the GaN intermediate layer; and
an AlGaN intermediate layer of $Al_xGa_{1-x}N$ ($0<x<1$) provided on the AlN intermediate layer,
wherein the stacked body is placed between the stacked intermediate layer and the functional layer.

11. The element according to claim 1, further comprising:
a substrate; and
a buffer layer,
wherein the buffer layer is placed between the substrate and the stacked body.

12. The element according to claim 11, wherein the substrate is a silicon substrate.

13. The element according to claim 1, wherein:
the first protrusion has a first bottom,
the second protrusion has a second bottom, and
a second length of the second bottom in a first direction perpendicular to a stacking direction from the first GaN layer toward the second GaN layer is shorter than a first length of the first bottom.

14. The element according to claim 1, wherein
the second GaN layer includes the second protrusion in plurality, and
the second protrusions are provided on the first protrusion.

15. A nitride semiconductor wafer comprising:
a substrate; and
a stacked body provided on the substrate, the stacked body including
a first GaN layer including a first protrusion,
a first layer provided on the first GaN layer and containing at least one of SiN and MgN, the first layer including a first region and a second region,
a second GaN layer provided on the first region and including a second protrusion, and
a second layer provided on the second GaN layer and the second region, the second layer containing at least one of SiN and MgN, a part of the second layer being in direct physical contact with the second region,
a maximum thickness of the first protrusion of the first GaN layer being greater than a maximum thickness of the second protrusion of the second GaN layer.

16. The wafer according to claim 15, wherein the stacked body further includes an AlGaN layer of $Al_xGa_{1-x}N$ ($0<x\leq1$) on which the first GaN layer is provided.

17. The wafer according to claim 16, wherein the stacked body further includes a third layer provided between the AlGaN layer and the first GaN layer and containing at least one of Si and Mg.

18. The wafer according to claim 17, wherein
a surface of the third layer includes a first region and a second region,
the first GaN layer is provided on the first region, and
a part of the first layer is in contact with the third layer in the second region.

19. The wafer according to claim 15, wherein
the first protrusion has a first bottom,
the second protrusion has a second bottom,
a second length of the second bottom in a first direction perpendicular to a stacking direction from the first GaN layer toward the second GaN layer is shorter than a first length of the first bottom, and
a ratio of the second length to the first length is not less than 0.005 and less than 1.

20. The wafer according to claim 15, further comprising:
a functional layer provided on the stacked body and including a nitride semiconductor.

21. The wafer according to claim 20, further comprising:
a stacked intermediate layer including:
a GaN intermediate layer;
an MN intermediate layer provided on the GaN intermediate layer; and
an AlGaN intermediate layer of $Al_xGa_{1-x}N$ ($0<x<1$) provided on the AlN intermediate layer,
wherein the stacked body is placed between the stacked intermediate layer and the functional layer.

22. The wafer according to claim 15, wherein the maximum thickness of the first protrusion is not less than 100 nm and not more than 1200 nm.

23. The wafer according to claim 15, wherein the stacked body further includes:
a third layer provided between the AlGaN layer and the first GaN layer and containing at least one of Si and Mg;
a third GaN layer provided on the second layer and including a third protrusion;
a fourth layer provided on the third GaN layer and containing at least one of Si and Mg, a part of the forth layer being in contact with the second layer;
a fourth GaN layer provided on the fourth layer and including a fourth protrusion; and a fifth layer provided on the fourth GaN layer and containing at least one of Si and Mg, a part of the fifth layer being in contact with the fourth layer.

24. The wafer according to claim 15, wherein a concentration of Si in at least part of the first GaN layer is not less than $1\times10^{17}/cm^3$ and not more than $1\times10^{20}/cm^3$.

25. The wafer according to claim 15, wherein a concentration of Si in at least part of the second GaN layer is not less than $1\times10^{17}/cm^3$ and not more than $1\times10^{20}/cm^3$.

26. The wafer according to claim 15, further comprising:
a buffer layer provided between the substrate and the stacked body.

27. The wafer according to claim 26, wherein the substrate is a silicon substrate.

28. The wafer to claim 15, wherein:
the first protrusion has a first bottom,
the second protrusion has a second bottom, and
a second length of the second bottom in a first direction perpendicular to a stacking direction from the first GaN layer toward the second GaN layer is shorter than a first length of the first bottom.

29. The wafer according to claim 15, wherein
the second GaN layer includes the second protrusion in plurality, and
the second protrusions are provided on the first protrusion.

* * * * *